(12) United States Patent
Narui et al.

(10) Patent No.: US 7,132,702 B2
(45) Date of Patent: Nov. 7, 2006

(54) IMAGE SENSOR

(75) Inventors: Tadashi Narui, Kawasaki (JP); Keiichi Akagawa, Kamakura (JP); Takeshi Yagi, Koganei (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/618,374

(22) Filed: Jul. 11, 2003

(65) Prior Publication Data
US 2004/0007722 A1    Jan. 15, 2004

Related U.S. Application Data

(63) Continuation of application No. 09/908,181, filed on Jul. 18, 2001, now abandoned, which is a continuation-in-part of application No. 09/810,227, filed on Mar. 16, 2001, now abandoned.

(30) Foreign Application Priority Data

| Mar. 17, 2000 | (JP) | ............................... 2000-076424 |
| Jul. 19, 2000 | (JP) | ............................... 2000-218483 |
| Aug. 29, 2000 | (JP) | ............................... 2000-259349 |
| Nov. 29, 2000 | (JP) | ............................... 2000-363352 |
| Feb. 23, 2001 | (JP) | ............................... 2001-048804 |
| Feb. 23, 2001 | (JP) | ............................... 2001-048805 |

(51) Int. Cl.
    *H01L 27/148* (2006.01)

(52) U.S. Cl. ........................ 257/228; 257/215; 257/237; 257/238; 257/239; 257/E27.082; 257/246

(58) Field of Classification Search ................ 257/228, 257/215, 237–239, 246, 48, E27.082; 438/48, 438/75
See application file for complete search history.

(56) References Cited

U.S. PATENT DOCUMENTS

| 4,176,369 | A | * | 11/1979 | Nelson et al. | ............... 257/228 |
| 4,198,646 | A | * | 4/1980 | Alexander et al. | ........... 257/228 |
| 4,271,419 | A | * | 6/1981 | Hornbeck | ................... 257/216 |
| 4,313,127 | A | * | 1/1982 | Su et al. | ..................... 257/227 |
| 4,774,557 | A | * | 9/1988 | Kosonocky | ................. 257/222 |
| 5,442,208 | A | * | 8/1995 | Bosiers et al. | .............. 257/223 |
| 5,847,381 | A | * | 12/1998 | Isogai | ..................... 250/208.1 |
| 6,025,585 | A | * | 2/2000 | Holland | ................... 250/208.1 |
| 6,504,196 | B1 | * | 1/2003 | Rhodes | ....................... 257/292 |

* cited by examiner

*Primary Examiner*—Eugene Lee
(74) *Attorney, Agent, or Firm*—Peter S. Gilster; Greensfelder, Hemker & Gale, P.C.

(57) ABSTRACT

In the present invention, a charge transfer unit is arranged on a first-plane side of a thinly-formed semiconductor base. Charge accumulating units are arranged on a second-plane side, the opposite side. A depletion prevention layer is arranged closer to the second-plane side than the charge accumulating units. The depletion prevention layer prevents a depletion region around the charge accumulating units from reaching the second plane of the semiconductor base. The depletion prevention layer can suppress surface dark current going into the charge accumulating units. Meanwhile, an energy ray incident from the second-plane side pass through the depletion prevention layer to generate signal charges in the charge accumulating units (depletion regions). The charge accumulating units collect, on a pixel-by-pixel basis, the signal charges which are to be transported to the charge transfer unit under voltage control or the like, and then are read to exterior as image signals.

13 Claims, 49 Drawing Sheets

18
DEPLETION PREVENTION LAYER d e

111
SECOND ALIGNMENT MARK

IMAGE SENSOR

CROSS REFERENCE TO RELATED APPLICATION

This application is a continuation of U.S. application Ser. No. 09/908,181 filed Jul. 18, 2001 now abandoned, of the same title, and which is abandoned upon filing of the present application, which application Ser. No. 09/908,181 was a continuation-in-part of U.S. patent application Ser. No. 09/810,227, filed Mar. 16, 2001 now abandoned.

BACKGROUND OF THE INVENTION

1. Field of the Invention

The present invention relates to a back-illuminated image sensor wherein energy rays (visible light, ultraviolet rays, soft X-rays, electron beams, and so on) are received at one plane side of a semiconductor (second-plane side) and optoelectronically converted signal charges are transported to a charge transfer unit on the other plane side (first-plane side) for readout.

2. Description of the Related Art

FIG. 36 is a diagram showing a conventional back-illuminated image sensor 601.

In FIG. 36, a semiconductor base 602 consisting of a P-type epitaxial layer is formed in a thickness of the order of 10 µm. An N-type CCD diffusion layer 603 is formed in the first-plane side of the semiconductor base 602 for the sake of charge transfer. The CCD diffusion layer 603 has a plurality of transfer electrodes 605 arranged thereon across a gate oxide film 604. The semiconductor base 602 is provided with an antireflection film 609, a support substrate 611, and so on.

The image sensor 601 configured thus is illuminated at its second-plane side with energy rays. The energy rays produce electron-hole pairs on the second-plane side of the semiconductor base 602. Some of the electrons travel through the semiconductor base 602 until they reach a potential well of the CCD diffusion layer 603 and are accumulated as a signal charge.

The signal charge in the CCD diffusion layer 603 is transferred by applying voltages to the transfer electrodes 605, and is successively read out to exterior.

In such a back-illuminated image sensor 601, the electrons produced at the second-plane side travel through the semiconductor base 602. Accordingly, there has been a problem that the electrons tend to recombine with holes and disappear, with a low efficiency of energy ray detection.

There has been another problem that the electrons traveling through the semiconductor base 602 get mixed between pixels, and thereby cause smear. The smear increases with a decreasing pixel pitch of the image sensor. On that account, the smear production makes it extremely difficult to improve the image sensor in resolution.

In particular, energy rays of shorter wavelengths, such as ultraviolet rays, produce electron-hole pairs at very shallow depth in the second-plane side. Therefore, in the cases of short-wavelength energy rays, the above-mentioned two problems tend to be more significant since electrons have particularly longer traveling distances.

Meanwhile, there has been another problem that the characteristics of the image sensor 601 largely depend on the impurity concentration and thickness of the semiconductor base 602. For example, when the semiconductor base 602 varies in impurity concentration and thickness at the time of manufacturing, the frequency of the electron-hole recombination varies from one product to another, resulting in varying efficiency of the energy ray detection. Additionally, the degree of mixing of electrons between adjoining pixels also varies from one product to another, so that smear occurs in different degrees. Such product variations have been a major cause for the image sensor 601 to drop in production yield.

Furthermore, in the conventional image sensor 601, electrons continually flow in from the second-plane side even while the signal charge is being transferred. This has required that the second-plane side be completely shielded from light during charge transfer. Thus, there has been a problem that the conventional image sensor 601 requires a mechanical shutter, which complicates the peripheral mechanisms of the image sensor.

In addition, the conventional image sensor 601 has had a problem that many dark currents arise at the interface between the antireflection film 609 and the semiconductor base 602, and at the interface between the gate oxide film 604 and the CCD diffusion layer 603. Such dark currents have caused unwanted effects including a deterioration in imaging quality and the impossibility of weak light detection.

Moreover, in the conventional image sensor 601, the surface state and trapped charges create potential wells near the surface of the second plane (hereinafter, referred to as "backside wells"). The backside wells capture electrons and lower the efficiency of the energy ray detection.

By the way, for the sake of fabricating the conventional image sensor 601, it is required that the transfer electrodes 605 and others be formed from the first-plane side, and that holes intended for bonding pads be made from the second-plane side. Conventionally, the alignment of such double-sided structure is achieved by using special devices such as a double side aligner or an infrared aligner.

More specifically, in the cases of a double side aligner, a structure was formed on the second-plane side while the alignment was made to an alignment mark on the first-plane side.

In the cases of an infrared aligner, the alignment mark on the first-plane side was sensed through from the second-plane side by using an infrared ray. By using the perspective image of the alignment marks as an alignment reference, the structure on the second-plane side was formed.

Double side aligners, however, produce alignment errors of ±2 µm. Infrared aligners also produce alignment errors of ±3 µm.

The alignment errors are ascribable to the indirect use of the alignment mark on the opposite plane. Thus, it has been extremely difficult in principle to improve the precision of the alignment. Accordingly, there has been a problem that whichever aligner is used, double-sided structure cannot be aligned with precision.

SUMMARY OF THE INVENTION

In view of the foregoing, an object of the present invention is to provide a back-illuminated image sensor with high efficiency of detecting energy ray, low smear production, and no need of having mechanical shutters.

Another object of the present invention is to provide a back-illuminated image sensor capable of suppressing dark current from the second-plane side.

Another object of the present invention is to provide a back-illuminated image sensor capable of suppressing dark current from the first-plane side.

Another object of the present invention is to provide a back-illuminated image sensor in which it is possible to reliably transfer a charge in a charge accumulating unit to a charge transfer unit.

Another object of the present invention is to provide a back-illuminated image sensor capable of improving driving speed in charge transportation.

Another object of the present invention is to provide a method of fabricating an image sensor according to the present invention.

Another object of the present invention is to provide an exposure apparatus incorporating an image sensor according to the present invention.

Another object of the present invention is to provide an alignment device incorporating an image sensor according to the present invention.

Another object of the present invention is to provide a measuring device incorporating an image sensor according to the present invention.

Another object of the present invention is to provide an aberration measuring device incorporating an image sensor according to the present invention.

Another object of the present invention is to provide a device fabrication method which is suitable for achieving strict alignment of double-sided structure as in an image sensor according to the present invention.

Another object of the present invention is to lessen the influences of impurity concentration rate or thickness of a semiconductor base.

Another object of the present invention is to provide an image sensor suited for higher resolution.

To achieve the foregoing objects, the present invention provides the following configurations.

An image sensor according to the present invention comprises: a semiconductor base of a first conductive type; a plurality of charge accumulating units of a second conductive type (a conductive type different from the first conductive type) formed on a second-plane side (the backside of a first plane) of the semiconductor base, for accumulating, on a pixel-by-pixel basis, signal charges generated by an energy ray incident from the second-plane side; a charge transfer unit formed on the first-plane side of the semiconductor base facing the charge accumulating units, for transferring the signal charges to be read; a charge transport unit for transporting the signal charges accumulated in the charge accumulating units to the charge transfer unit; and a depletion prevention layer formed closer to the second-plane side than the charge accumulating units, for preventing a depletion region around the charge accumulating units from reaching the second plane.

In the configuration described above, the charge accumulating units, or regions of the second conductive type are formed between the second plane and the charge transfer unit on a pixel-by-pixel basis. Charges in the charge accumulating units are discharged to the charge transfer unit or the like to form a potential well. The potential well (charge accumulating units) has the function of collecting, on a pixel-by-pixel basis, signal charges occurring on the second-plane side.

The traveling distance of charges on the second-plane side is reduced in accordance with the width of the potential well. Therefore, the charge recombination is suppressed by the amount of reduction, improving the efficiency of energy ray detection. In addition, a synergistic effect of the "reduction in traveling distance" and "the function of collecting signal charges into the charge accumulating units on a pixel-by-pixel basis" surely reduces the mix-up of signal charges between adjoining pixels. Thereby, the production of smear is suppressed.

Furthermore, in the above-described configuration, the charge accumulating units are arranged closer to the second-plane side than the charge transfer unit. Therefore, the flow of signal charges into the charge transfer unit can be intercepted. This eliminates the need for the second plane to be shielded from light during transfer of the signal charge by the charge transfer unit, allowing an omission of a mechanical shutter.

Moreover, in the above-described configuration, the charge accumulating units and the charge transfer unit are arranged in three dimensions in the direction of thickness of the semiconductor base. Therefore, as compared with an image sensor having the charge accumulating units and the charge transfer unit in a two-dimensional arrangement, it is easier to reduce the chip size or enlarge the photoreceptor area. The enlargement of photoreceptor area allows reliable improvement in the efficiency of energy ray detection.

In particular, the present invention provides a depletion prevention layer on the second-plane side of the charge accumulating units. The depletion prevention layer prevents a depletion region occurring at the charge accumulating units from reaching the interface of the second plane. For that reason, most of dark current randomly arising at the interface of the second plane is diffused and recombined to disappear in the depletion prevention layer before reaching the charge accumulating units. This makes it possible to obtain favorable images with less dark current.

Note that in the present invention, it is preferable that the depletion prevention layer has impurity distribution (impurity profiles, and more specifically concentration rate and thickness) that allows the energy ray to pass through, and an impurity concentration rate enough to prevent a depletion region from reaching the second plane. Due to the setting of the thickness of the depletion prevention layer, most energy rays pass through the depletion prevention layer and reach the depletion regions in the charge accumulating units. As a result, it enables efficient capture of signal charges in the charge accumulating units, thereby improving the efficiency of energy ray detection.

In the present invention, the depletion prevention layer is preferably of the first conductive type. The depletion prevention layer of the first conductive type can fill the backside wells described above. This is particularly effective for improving the efficiency of energy ray detection.

It is preferable in the present invention that the charge accumulating units are fully depleted at the completion of charge transportation. The full depletion can substantially reduce image lags. Incidentally, the depletion prevention layer has the function of facilitating the full depletion.

Meanwhile, another image sensor according to the present invention comprises: a semiconductor base of a first conductive type; a plurality of charge accumulating units of a second conductive type (a conductive type different from the first conductive type) formed on a second-plane side (the backside of a first plane) of the semiconductor base, for accumulating, on a pixel-by-pixel basis, signal charges generated by an energy ray incident from the second-plane side; a charge transfer unit formed on the first-plane side of the semiconductor base facing the charge accumulating units, for transferring the signal charges to be read; a charge transport unit for transporting the signal charges accumulated in the charge accumulating units to the charge transfer unit; and an invalid charge discharging unit for driving the charge transfer unit to discharge an invalid charge while the charge accumulating units accumulate the signal charges.

In the configuration described above, the invalid charge discharging unit sweeps invalid charges out of the charge transfer unit while the charge accumulating units accumulate signal charges. This eliminates a possibility of residence of dark current arising on the first-plane side of the charge transfer unit, thereby realizing an image sensor with less occurrence of dark current.

In this connection, the invalid charge discharging unit may drive the charge transport unit and the charge transfer unit to transport and discharge the invalid charges in the charge accumulating units at appropriate timing. In this case, the accumulating time of the signal charges in the charge accumulating units (i.e., exposure time) becomes adjustable, which realizes an electronic shutter function.

Another image sensor according to the present invention comprises: a semiconductor base of a first conductive type; a plurality of charge accumulating units of a second conductive type (a conductive type different from the first conductive type) formed on a second-plane side (the backside of a first plane) of the semiconductor base, for accumulating, on a pixel-by-pixel basis, signal charges generated by an energy ray incident from the second-plane side; a charge transfer unit formed on the first-plane side of the semiconductor base facing the charge accumulating units, for transferring the signal charges to be read; a charge transport unit for transporting the signal charges accumulated in the charge accumulating units to the charge transfer unit; and a dark current suppressing unit for approximating the potential of the first-plane side of the charge transfer unit to a substrate potential to suppress a dark current flowing in from the first-plane side, at least for a predetermined period while the charge accumulating units accumulate the signal charges.

In the configuration described above, the dark current suppressing unit manipulate the potential of the first-plane side of the charge transfer unit so as to be brought closer to the substrate potential. Such a potential manipulation avoids the surface depletion of the first-plane side, and thereby reduces a possibility of dark current on the first-plane side going into the charge transfer unit.

Another image sensor according to the present invention comprises: a semiconductor base of a first conductive type; a plurality of charge accumulating units of a second conductive type (a conductive type different from the first conductive type) formed on a second-plane side (the backside of a first plane) of the semiconductor base, for accumulating, on a pixel-by-pixel basis, signal charges generated by an energy ray incident from the second-plane side; a charge transfer unit formed on the first-plane side of the semiconductor base facing the charge accumulating units, for transferring the signal charges to be read; a charge transport unit for transporting the signal charges accumulated in the charge accumulating units to the charge transfer unit; and an excessive charge discharging unit for overflowing an excessive charge into the charge transfer unit and driving the charge transfer unit to discharge the excessive charge, the excessive charge occurring due to exceeding a saturation charge amount of the charge accumulating units.

In the configuration described above, the excessive charge discharging unit discharges excessive charges overflowing from the charge accumulating units, through the charge transfer unit. This reduces a possibility of excessive charges overflowing into the charge accumulating units of adjacent pixels; therefore, it becomes possible to suppress blooming phenomena with reliability.

Another image sensor according to the present invention comprises: a semiconductor base of a first conductive type; a plurality of charge accumulating units of a second conductive type (a conductive type different from the first conductive type) formed on a second-plane side (the backside of a first plane) of the semiconductor base, for accumulating, on a pixel-by-pixel basis, signal charges generated by an energy ray incident from the second-plane side; a charge transfer unit formed on the first-plane side of the semiconductor base facing the charge accumulating units, for transferring the signal charges to be read; and a charge transport unit for transporting the signal charges accumulated in the charge accumulating units to the charge transfer unit. Here, the charge transport unit applies a voltage to the semiconductor base to control the charge accumulating units in potential, thereby transporting the charges in the charge accumulating units to the charge transfer unit.

In the configuration described above, the substrate potential of the semiconductor base is directly manipulated to transport the signal charges from the charge accumulating units to the charge transfer unit. Therefore, it is possible to facilitate the control of full depletion of the charge accumulating units, thereby further ensuring transporting operation of signal charges. The results in less possibilities of causing image lag phenomena due to signal charges left in the charge accumulating units. In addition, it is possible to sufficiently adapt to charge accumulating units with a greater saturation charge amount.

In the present invention, the semiconductor base preferably has a well structure surrounded by a semiconductor region of the second conductive type. In such a configuration, the well structure electrically isolates the semiconductor base from its surroundings. This means not much increase in the size of the semiconductor base, allowing an appropriate reduction in the electrical capacitance of the semiconductor base. Thus, upon a voltage application to the semiconductor base, the substrate potential can be controlled at high speed, permitting a further speedup of the transporting operation from the charge accumulating units to the charge transfer unit.

Meanwhile, a fabrication method according to the present invention comprises the steps of: thinning a semiconductor base of a first conductive type; forming, on one plane side of the semiconductor base thinned, a plurality of charge accumulating units of a second conductive type different from the first conductive type; and forming, on the one plane side of the semiconductor base thinned, a depletion prevention layer of the first conductive type for preventing a surface deletion resulting from the charge accumulating units.

In the fabrication method described above, since both the charge accumulating units and the depletion prevention layer are formed from the second-plane side, the charge accumulating units can be precisely controlled in surface depth. Accordingly, the surface depth of the charge accumulating units can be formed as shallow as possible in order to further facilitate an improvement in the efficiency of detection of short-wavelength energy rays. In addition, forming the depletion prevention layer from the second-plane side stabilizes the depletion prevention layer in thickness and impurity concentration, which permits the fabrication of a back-illuminated image sensor having even less dark current.

Another image sensor according to the present invention comprises: a semiconductor base of a first conductive type; a plurality of charge accumulating units of a second conductive type (a conductive type different from the first conductive type) formed on a second-plane side (the backside of a first plane) of the semiconductor base, for accumulating, on a pixel-by-pixel basis, signal charges generated by an energy ray incident from the second-plane side; a charge transfer unit formed on the first-plane side of the semiconductor base facing the charge accumulating units, for transferring the signal charges to be read; a charge transport unit for transporting the signal charges accumulated in the charge accumulating units to the charge transfer unit; and a barrier region arranged on at least a part of transport paths of the signal charges formed between the charge accumulating units and the charge transfer unit, the barrier region creating a peak of a potential barrier to block progress of the signal charges when no charge is to be transported, the peak of the potential barrier being eliminated by the charge transport unit to ensure full transportation of the signal charges when charges are transported.

In the configuration described above, the barrier region is formed between the charge accumulating units and the charge transfer unit. The peak of the potential barrier occurring in the barrier region makes it possible to control the threshold conditions for the charge transportation. Therefore, even when the semiconductor base has production variations, the threshold conditions for the charge transportation will not substantially vary.

In addition, in the above-described configuration, the signal charges are once collected to the charge accumulating units on a pixel-by-pixel basis. This reduces the frequency of signal charges between adjoining pixels mixed with each other in the semiconductor base. Therefore, even when the semiconductor base has production variations, the degree of smear production will not substantially vary.

The above functions and effects make it possible to reduce influences on the characteristics of the back-illuminated image sensor due to production variations of the semiconductor base. As a result, the image sensor can be improved in production yield.

Furthermore, in the above-described configuration, the charge accumulating units and the charge transfer unit can be distinctively separated by the peak of the potential barrier arising in the barrier region. In this case, the possibility of charges going into the charge transfer unit during charge transfer becomes even smaller. This leads to scarcely causing unwanted effects resulted from charge intrusion without having a mechanical shutter.

In the present invention, the barrier region is preferably formed by introducing impurities of the first conductive type into the semiconductor base. Moreover, in the present invention, the impurities introduced into the barrier region are preferably set to be higher in concentration rate than that of the semiconductor base. In such a configuration, the impurity concentration rate of the semiconductor base can be previously set at a lower value so that additional impurities are introduced to the semiconductor base to form the barrier region. In this case, the lower impurity concentration rate of the semiconductor base significantly reduces such production defects as "uneven transportation of signal charges" and "the production of defective pixels" because of unevenness and variations in the fabrication conditions of the semiconductor base. This allows a further improvement in the production yield of the back-illuminated image sensor.

In the present invention, the barrier region is preferably arranged in contact with the charge transfer unit. In such a configuration, it is possible to exercise reliable and precise potential control of the peak of the potential barrier from the charge-transfer-unit side (for example, the transfer electrodes arranged on the charge transfer unit).

In the present invention, the barrier region is preferably set so that the potential barrier, when no charge is to be transported, is lower than potential barriers between adjoining charge accumulating units according to the viewpoint of the polarity of the signal charges. In such a configuration, the charge transfer unit can be operated as an overflow drain. More specifically, signal charges overflowing the charge accumulating units because of an excessive exposure (hereinafter, referred to as "excessive charges") overcome the barrier region to flow to the charge transfer unit before overcoming the higher potential barriers between the adjoining charge accumulating units. This makes it possible to improve the blooming between adjacent pixels (blurs due to excessive charges in the sensed image). Here, it is also preferable that the charge transfer unit performs the charge transfer of the excessive charges. The operation prevents excessive charges from residing in the charge transfer unit, thereby allowing immediate transfer (i.e., discharge) of the same.

Meanwhile, another fabrication method according to the present invention comprises the steps of: forming an epitaxial layer of a first conductive type on a first-plane side of a substrate; introducing impurities of the first conductive type into the epitaxial layer from the first-plane side to form a barrier region; introducing impurities of a second conductive type different from the first conductive type into the epitaxial layer so as to form a charge transfer unit in the first-plane side at a region located shallower than the barrier region as seen from the first-plane side; removing at least a part of the substrate to thin a second-plane side opposite to the first-plane side; and introducing impurities of the second conductive type from the second-plane side so as to form charge accumulating units in a pixel-by-pixel arrangement. The fabrication method makes it possible to surely fabricate a back-illuminated image sensor having charge accumulating units and a barrier unit.

Another fabrication method according to the present invention comprises the steps of: forming a first epitaxial layer of a first conductive type on a first-plane side of a substrate; introducing impurities of a second conductive type different from the first conductive type into the first epitaxial layer from the first-plane side so as to form charge accumulating units in a pixel-by-pixel arrangement; introducing impurities of the first conductive type into the first-plane side of the first epitaxial layer at a region located shallower than the charge accumulating units as seen from the first-plane side, thereby forming a barrier region; forming a second epitaxial layer of the first conductive type on the first-plane side of the first epitaxial layer; introducing impurities of the second conductive type into the first-plane side of the second epitaxial layer to form a charge transfer unit; and removing at least a part of the substrate to thin a second-plane side opposite to the first-plane side. The fabrication method also makes it possible to surely fabricate a back-illuminated image sensor having charge accumulating units and a barrier region.

Another fabrication method according to the present invention comprises the steps of: forming a first epitaxial layer of a first conductive type on a first-plane side of a substrate; introducing impurities of a second conductive type different from the first conductive type into the first epitaxial layer from the first-plane side so that charge accumulating units are formed in a pixel-by-pixel arrangement; forming a second epitaxial layer of the first conductive type on the first-plane side of the first epitaxial layer; introducing impurities of the first conductive type into the first-plane side of the second epitaxial layer to form a barrier region; introducing impurities of the second conductive type into the first-plane side of the second epitaxial layer at a region shallower than the charge accumulating units as seen from the first-plane side, thereby forming a charge transfer unit; and removing at least a part of the substrate to thin a second-plane side opposite to the first-plane side. The fabrication method also makes it possible to surely fabricate a back-illuminated image sensor having charge accumulating units and a barrier region.

Another image sensor according to the present invention comprises: a semiconductor base of a first conductive type; charge accumulating units of a second conductive type arranged on a second-plane side of the semiconductor base, for accumulating, on a pixel-to-pixel basis, signal charges generated by an energy ray incident from the second-plane side; a charge transfer channel formed on the first-plane side of the semiconductor base facing the charge accumulating units, the signal charges being transferred and read out through the charge transfer channel; and transfer electrodes for applying a transfer voltage to the charge transfer channel. The transfer electrodes are periodically provided in the charge transfer direction of the charge transfer channel, in proportion of substantially two or less transfer electrodes per one charge accumulating unit. In the present invention, it is preferable that the transfer electrodes are periodically provided in the charge transfer direction of the charge transfer channel, in proportions of substantially two to a single piece of the charge accumulating units.

In such a configuration, one charge accumulating unit is substantially provided facing two transfer electrodes or less. Here, the charge accumulating units can be arranged closer to each other as compared with the case where one charge accumulating unit is arranged in every phase interval (equivalent to three to four transfer electrodes, generally). This facilitates back-illuminated image sensors of higher resolution. Moreover, in this case, the signal charges are once collected to the charge accumulating units on a pixel-by-pixel basis. Therefore, the frequency of signal charges of adjoining pixels getting mixed with each other in the semiconductor base, can be reduced, thereby lessening influences of the production variations of the semiconductor base on the smear production.

In the present invention, it is preferable to provide a split transport unit for transporting signal charges from the charge accumulating units to the charge transfer channel, the transporting being performed at phase intervals of the transfer electrodes (the intervals of the transfer electrodes to which identical voltage waveforms are applied during multi-phase drive), and for transporting one screenful of signal charges at a plurality of times while shifting the phases of positions where signal charges are to be transported; and a split transfer unit for driving the transfer electrodes in multi-phase, each time the split transport unit transports signal charges to the charge transfer channel, so that one screenful of signal charges are read out at a plurality of times. In such a configuration, the signal charges are transferred to the charge transfer unit from the charge accumulating units, which is performed at phase intervals. The smear production can be further reduced by not transferring the signal charges at once but transferring them with intervals.

In the present invention, the charge transfer channel may have variations in impurity concentration "in every interval of the transfer electrodes," so that the transfer electrodes are driven in two phases to transfer signal charges progressively. In such a configuration, the variations in impurity concentration create periodic potential gradients in the charge transfer channel, which allows one-way transfer of the signal charges with reliability.

Meanwhile, an alignment device according to the present invention comprises: an image sensor of the present invention described above; a position detecting unit for detecting positional information of the subject according to the image sensed of an object or a mark formed on the object by using the image sensor; and a position controlling unit for positioning the object according to the positional information. In such a configuration, the use of the image sensor of the present invention described above offers various improvements and effects including a higher efficiency in energy ray detection and a decrease in the smear production. Therefore, the sensed images increase in image quality, improving the detection of positional information in accuracy. As a result, the alignment device according to the present invention can realize a further improvement in object positioning accuracy.

An exposure apparatus according to the present invention comprises: an image sensor of the present invention described above; and an exposure unit for exposing a predetermined pattern onto a substrate positioned by the alignment device. In such a configuration, the use of the alignment device of the present invention described above allows an improvement in substrate positioning accuracy. Therefore, the exposure apparatus according to the present invention can make a further improvement in the positional accuracy of exposure on a substrate.

An aberration measuring device according to the present invention comprises: an image sensor of the present invention described above; an aberration measuring optical system for emitting a pencil of light for aberration measurement into an optical system to be measured; a condenser lens for condensing the pencil of light to pass through the optical system to be measured onto an imaging plane of the image sensor; a position detecting unit for detecting positional information of the pencil of light condensed on the imaging plane; and an operation unit for determining an aberration of the optical system to be measured, according to the detection result from the position detecting unit. In such a configuration, the use of the image sensor of the present invention described above offers various improvements and effects including a higher efficiency in energy ray detection and a decrease in the smear production. Therefore, the sensed images increase in image quality, allowing a further improvement in aberration measurement accuracy.

Another exposure apparatus according to the present invention comprises: the aberration measuring device of the present invention described above; and a projection optical system to be subjected to the aberration measurement by the aberration measuring device. In such a configuration, the use of the aberration measurement device of the present invention makes it possible to precisely measure the projection optical system for aberration. Therefore, the exposure apparatus according to the present invention can correct the aberration of the projection optical system with yet higher precision, allowing finer exposure patterns to be precisely projected.

A measuring device according to the present invention comprises: an image sensor of the present invention described above; and a measuring unit for performing at least one of aberration measurement and position measurement of a subject, according to an image of the subject sensed by the image sensor. In such a configuration, the use of the image sensor of the present invention described above offers various improvements and effects including a higher efficiency in energy ray detection and a decrease in the smear production. This makes it possible to obtain favorable sensed images with smaller variations, so that the aberration measurement or the position measurement of the subject can be performed with a higher degree of accuracy.

Another exposure apparatus according to the present invention comprises: an exposure unit for projecting an exposure pattern onto an object to be exposed; the above-described measuring device of the present invention; and a control unit for performing at least one of aberration correction on the exposure unit and positional control of an exposure position, according to a measurement output from the measuring unit. In such a configuration, the use of the measuring device of the present invention makes it possible to obtain aberration measurements or position measurements with a higher degree of accuracy. As a result, the exposure apparatus can perform the aberration correction of the exposure unit or the positioning of the exposure pattern with high precision.

Next, description will be given of the device fabrication methods according to the present invention. Incidentally, as employed in the present invention, the expression "with something as a (positional) reference" implies "with a history of something or a re-formed mark as a (positional) reference."

A device fabrication method according to the present invention comprises the steps of: forming a first alignment mark on a first-plane side of a substrate; forming a base portion of a device on the first-plane side of the substrate; forming a predetermined structure on the first-plane side of the base portion, with "a projection or a depression on the first-plane side of the base portion", as a positional reference, occurring due to the projection or depression of the first alignment mark in the process of forming the base portion; removing the substrate from a second-plane side of the base portion, or the opposite side of the first-plane side; and forming a predetermined structure on the second-plane side of the base portion, with a second alignment mark (the inverted mark of the first alignment mark), as a positional reference, appearing on the second-plane side of the base portion due to the removing process.

In the device fabrication method, the first alignment mark is formed on the first-plane side of the substrate, and then the base portion of the device is formed thereon. Here, the projection/depression of the first alignment mark appears on the first-plane side of the base portion as a trace of the projection/depression (hereinafter, referred to as "history"). The history is in alignment with the first alignment mark. The use of the history as a positional reference allows a device structure in alignment with the first alignment mark to be formed on the first-plane side of the base portion.

Subsequently, the substrate is removed from the second-plane side of the base portion. Here, on the second-plane side of the base portion, the second alignment mark appears as a trace of the first alignment mark removed. The second alignment mark is in alignment with the first alignment mark. The use of the second alignment mark as a positional reference allows a device structure in alignment with the first alignment mark to be formed on the second-plane side of the base portion.

As described above, device structures in alignment with the first alignment mark are formed on both the first- and second-plane sides. Therefore, it becomes possible to fabricate a device with double-sided structure in precise alignment.

Moreover, in the device fabrication method described above, the device structure on either side is formed in accordance with the positional reference (the history, the second alignment mark) on that side. Accordingly, there is no need to use the alignment marks on the respective opposite sides as the positional references, so that the conventional double side aligners and infrared aligners are not particularly required. On that account, it is possible to fabricate a device where alignment of its double-sided structure is required, by employing common fabrication apparatus.

Another device fabrication method according to the present invention comprises the steps of: forming a base portion of a device on a first-plane side of a substrate; forming a to-be-removed region in the base portion, the to-be-removed region reaching the substrate and being selectively removable; forming a first alignment mark on the first-plane side in the to-be-removed region; forming a predetermined structure on the first-plane side of the base portion by using the first alignment mark as a positional reference; forming a layer to cover at least the first alignment mark; removing the substrate and the to-be-removed region from a second-plane side of the base portion, or the opposite side of the first-plane side; and forming a predetermined structure on the second-plane side of the base portion by using, as the positional reference, a second alignment mark (the inverted mark of the first alignment mark) appearing on the second-plane side in the process of removing the substrate.

In the device fabrication method, the base portion of a device is formed on the first-plane side of the substrate. During or after the forming process, a to-be-removed region that reaches the substrate is formed in the base portion. In addition, a first alignment mark is formed on the first-plane side of the to-be-removed region.

By using the first alignment mark as a positional reference, a device structure is formed on the first-plane side of the base portion. Therefore, the device structure formed on the first-plane side of the base portion is in alignment with the first alignment mark.

When a layer is formed to cover the first alignment mark during the process of forming the base portion or the device structure, that is considered the layer forming step. On the other hand, when such a layer is not formed otherwise, the layer forming step is performed separately.

By covering the first alignment mark thus, the substrate is removed from the second-plane side of the base portion. Here, the to-be-removed region is preferably removed together. If, however, the to-be-removed region is not removed together, it will be separately removed.

In the trace of the removed to-be-removed region appears the second alignment mark which is the first alignment mark inverted of projections/depressions. The second alignment mark is in alignment with the first alignment mark. Using the second alignment mark as a positional reference allows a device structure in alignment with the first alignment mark to be formed on the second-plane side of the base portion.

In this way, device structures in alignment with the first alignment mark are formed on both the first- and second-plane sides. Therefore, it is possible to fabricate a device with double-sided structure in precise alignment.

Moreover, in the device fabrication method described above, the device structure on either side is formed in accordance with the positional reference (the history, the second alignment mark) on that side. Accordingly, there is no need to use the alignment marks on the respective opposite sides as the positional references, so that the conventional double side aligners and infrared aligners are not particularly required. On that account, it is possible to fabricate a device where alignment of its double-sided structure is required, by employing common fabrication apparatus.

Another device fabrication method according to the present invention comprises the steps of: forming a first alignment mark on a first-plane side of a substrate; forming a base portion of a device on the first-plane side of the substrate; forming a second alignment mark (a re-formed mark of the first alignment mark) on the first-plane side of the base portion by using, as a positional reference, one of a projection and a depression on the first-plane side of the base portion, the projection or depression occurring due to a projection or a depression of the first alignment mark in the base forming step; and forming a predetermined structure on the first-plane side of the base portion by using the second alignment mark as a positional reference.

In the device fabrication method, the first alignment mark is formed on the first-plane side of the substrate, and then the base portion of the device is formed thereon. Here, the projection/depression of the first alignment mark appears as a history on the first-plane side of the base portion. The history is in alignment with the first alignment mark. Then, with the history as a positional reference, a re-formed mark is formed. The use of the re-formed mark as a positional reference allows a device structure in alignment with the first alignment mark to be formed on the first-plane side of the base portion.

Another device fabrication method according to the present invention comprises the steps of: forming a first alignment mark on a first-plane side of a substrate, the first alignment mark comprising one of a projection and a depression; forming a base portion of a device on the first-plane side of the substrate; removing the substrate from a second-plane side of the base portion, or the opposite side of the first-plane side, so that a second alignment mark (the inverted mark of the first alignment mark) appears on the second-plane side of the base portion; and forming a predetermined structure on the second-plane side of the base portion by using the second alignment mark as a positional reference.

In the device fabrication method, the first alignment mark is formed on the first-plane side of the substrate, and then the base portion of the device is formed thereon. Thereafter, the substrate is removed. Upon the removal of the substrate, the second alignment mark, or the inverted mark of the first alignment mark, appears on the second-plane side of the base portion. By using the second alignment mark as a positional reference, a device structure is formed on the base portion.

The fabrication method makes it possible to form a device structure in alignment with the first alignment mark on the second-plane side of the base portion.

Another device fabrication method according to the present invention comprises the steps of: forming a base portion of a device on a first-plane side of a substrate; forming a to-be-removed region in the base portion, the to-be-removed region reaching the substrate and being selectively removable; forming a layer to cover at least the first alignment mark; removing the substrate and the to-be-removed region from a second-plane side of the base portion, or the opposite side of the first-plane side, so that a second alignment mark (a trace of the removed first alignment mark) appears on the second-plane side of the base portion; and forming a predetermined structure on the second-plane side of the base portion by using the second alignment mark as a positional reference.

In the device fabrication method, the base portion of a device is formed on the first-plane side of the substrate. During or after the forming process, the pattern of a to-be-removed region piercing through the substrate is formed on the base portion. The pattern is formed in accordance with the positional reference on the first-plane side. On that account, the pattern of the to-be-removed region naturally comes into alignment with the device structure on the first-plane side, which also uses the positional reference.

When a layer is formed to cover the to-be-removed region during the forming process of the base portion, this is considered the layer forming step. On the other hand, when such a layer is not formed otherwise, the layer forming step is separately performed to form a layer over the to-be-removed region.

Thereafter, the substrate is removed from the second-plane side of the base portion. Here, the to-be-removed region is preferably removed together. If, however, the to-be-removed region is not removed together, it will be removed separately.

The second alignment mark appears on the second-plane side of the base portion by removing the to-be-removed region. The second alignment mark is a trace of removing the to-be-removed portion which is formed from the first-plane side. It is in alignment with the device structure on the first-plane side. Therefore, using the second alignment mark as a positional reference makes it possible to form a device structure that is in alignment with the device structure on the first-plane side, on the second-plane side of the base portion. As a result, it becomes possible to fabricate a device with double-sided structure in precise alignment.

Moreover, in the above-described device fabrication method, the device structure on either side is formed in accordance with the respective positional references (the positional reference on the first-plane side, the alignment mark on the second-plane side). Accordingly, there is no need to use the alignment marks on the opposite sides as the positional references, so that the conventional double side aligners and infrared aligners are not particularly required. On that account, it is possible to fabricate a device where alignment of its double-sided structure is required, by employing common fabrication apparatus.

Another device fabrication method according to the present invention comprises the steps of: forming a base portion of a device on a first-plane side of a substrate; forming a to-be-opened region in a to-be-opened area of the base portion during or after the process of forming the base portion, the to-be-opened region reaching the substrate and being selectively removable; and removing the substrate and the to-be-opened region from a second-plane side of the base portion, or the opposite side of the first-plane side, so that an opening hole (a trace of the removed to-be-opened region) appears on the second-plane side of the base portion.

In the device fabrication method, the base portion of a device is formed on the first-plane side of the substrate. During or after the formation of the base portion, a to-be-opened region piercing through the substrate is formed in a to-be-opened area of the base portion.

Thereafter, the substrate is removed from the second-plane side of the base portion. Here, the to-be-opened region is preferably removed together. If, however, the to-be-opened region is not removed together, then it will be removed separately. An opening hole which is a trace of the to-be-opened region removed, appears on the second-plane side of the base portion.

Since the opening hole is embedded in advance from the first-plane side as a to-be-opened region, the alignment between the device structure on the first-plane side and the opening hole can be achieved with easiness.

In the method of fabricating a device according to the invention, the mark forming step preferably comprise the steps of: forming a depression or a projection on the substrate; and forming a silicon oxide film or a silicon nitride film on the surface of the depression or projection. With this measure, when the substrate (for example, silicon substrate) is removed by etching, differentiating the etching rate between the silicon oxide film or the silicon nitride film and the substrate makes it easier to control the timing of stopping etching, whereby prevents the base portion from being etched. As a result, it is easy to keep the original shape of the second alignment mark (depression or projection) formed on the base portion. It is possible to heighten the accuracy of positioning performed by using the second alignment mark.

It is more preferable that the method of fabricating a device according to the invention further comprise a step of: forming a through-hole in the base portion using the second alignment mark after forming the second structure in the second-plane side processing step; and a step of forming a wiring portion which electrically connects the first structure formed on the front surface (first plane) side to the second structure formed on the back surface (second plane) side via the through-hole. This measure reduces an error in positioning the first structure on the front surface (first plane), the second structure on the back surface (second plane), and the through-hole which are formed according to the alignment mark. The alignment marks are a depression on the front surface (first plane) side and a projection on the back surface (second plane) side, or are a projection on the front surface (first plane) side and a depression on the back surface (second plane) side. This facilitates electrical connection of the first structure to the second structure via the through-hole.

In the method of fabricating a device according to the invention, it is preferable that the removing step comprise the steps of: polishing the substrate by chemical mechanical polishing so that the substrate has a thickness thinner than or equal to a fixed thickness; and wet-etching the polished substrate. This makes it possible to shorten the time taken for the step of exposing the second plane of the base portion.

In the method of fabricating a device according to the invention, it is preferable that the base forming step comprise the steps of; laminating a polysilicon layer on the substrate; and forming a base portion by single-crystallizing the laminated polysilicon layer. This measure makes it possible to easily form, irrespective of the material of an underlying substrate, a base portion with an alignment mark as a depression and a projection formed.

Another semiconductor device having an epitaxial layer formed on the support substrate according to the invention comprises: a first structure formed on a first-plane side of the epitaxial layer, the first-plane side being on a side of the support substrate; and a second structure formed on a second-plane side of the epitaxial layer, the second-plane side being on the opposite side of the support substrate. This configuration makes it possible to form a large number of minute devices on both sides of an epitaxial layer and realize down-sizing and high-density integration of a semiconductor device. The epitaxial layer is preferably a single crystal silicon thin-film layer. In the very thin single crystal silicon thin-film layer, an alignment mark formed on one surface can be observed from both sides.

In the semiconductor device according to the invention, it is preferable that the first structure and the second structure be connected to each other via a through-hole formed in the epitaxial layer. In this case, since in general the epitaxial layer is thinner than the semiconductor substrate on which devices are formed, the aspect ratio of the through hole can be small.

It is even preferable that the semiconductor device according to the invention further has alignment marks formed at predetermined positions on the epitaxial layer. The alignment marks are a depression on the first-plane side and a projection on the second-plane side, or a projection on the first-plane side and a depression on the second-plane side. This makes it possible to form a first structure and a second structure individually on both surfaces of an epitaxial layer using a "stepper" instead of a conventional "double-sided aligner" by using, as a reference, alignment marks as a depression on the first-plane side and a projection on the second-plane side, or a projection on the first-plane side and a depression on the second-plane side. As a result, the positioning accuracy in each plane can be substantially increased.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

First Embodiment

The first embodiment corresponds to the invention set forth in claims 1–7.

[Configuration of the Image Sensor 11]

Figure 1:
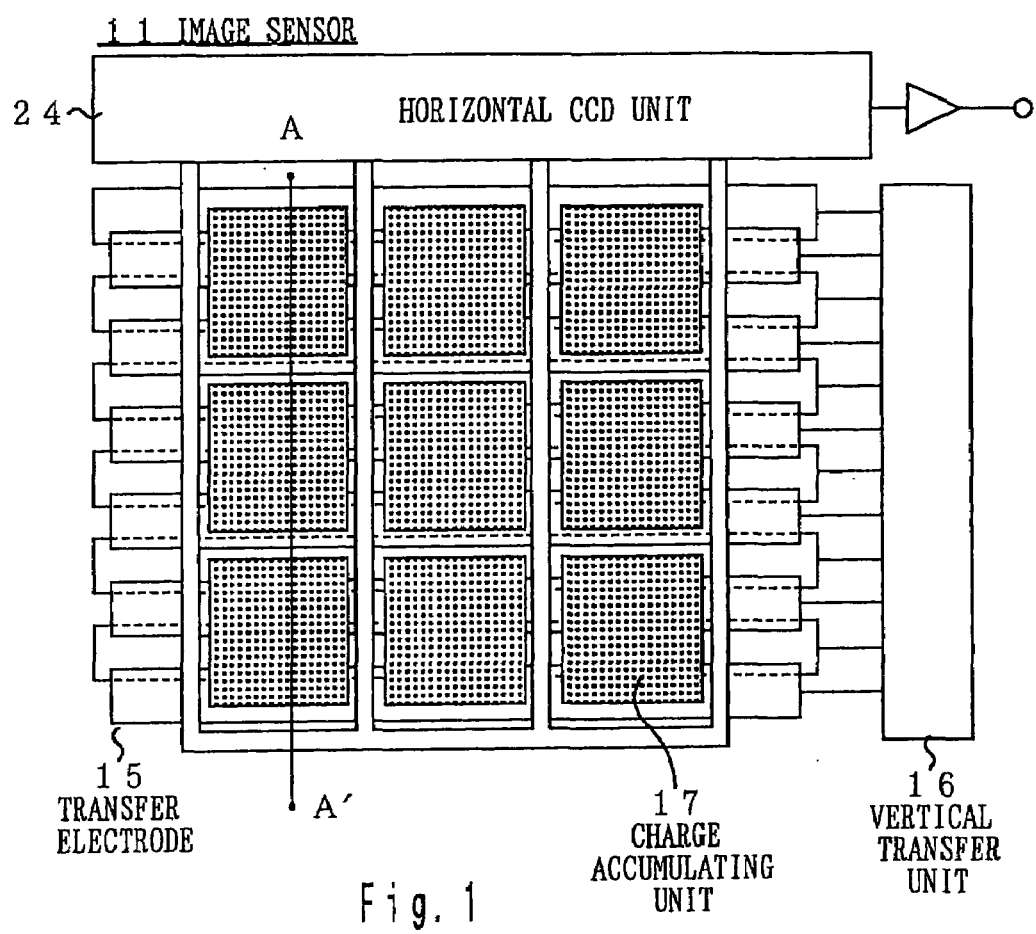
FIG. 1 is a view of an image sensor 11 according to a first embodiment, as seen from its second-plane side.
Figure 2:
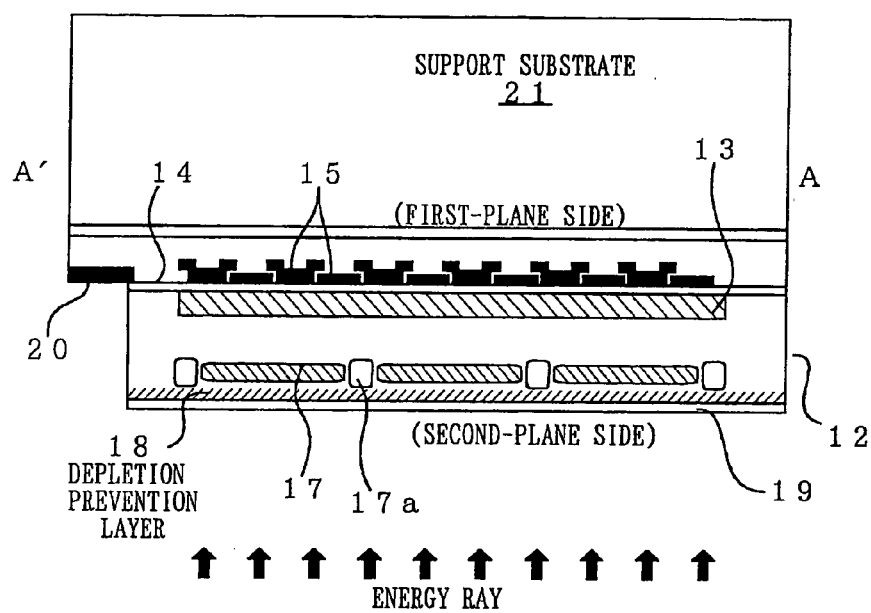
FIG. 2 is a sectional view of the image sensor 11.

FIG. 1 is a schematic view of an image sensor 11 as seen from its second-plane side. FIG. 2 is an A–A' cross section of the image sensor 11. Hereinafter, the configuration of the image sensor 11 will be described with reference to FIGS. 1 and 2.

Initially, the image sensor 11 is provided with a P-type semiconductor base 12. In each pixel row, an N-type CCD diffusion layer 13 is buried in the first-plane side of the semiconductor base 12. The CCD diffusion layer 13 has a plurality of transfer electrodes 15 arranged thereon across a gate oxide film 14. The voltages of the transfer electrodes 15 are controlled by a vertical transfer unit 16. In addition, a horizontal CCD unit 24 is arranged over the outputting ends of the CCD diffusion layers 13.

Meanwhile, N-type charge accumulating units 17 are buried in the second-plane side of the semiconductor base 12 on a pixel-by-pixel basis, facing the CCD diffusion layers 13. The charge accumulating units 17 are electrically isolated from each other via $P^+$-type buried channel stops 17a.

A P-type depletion prevention layer 18 is arranged on the second-plane side of the charge accumulating units 17. The depletion prevention layer 18 is set at such a thickness that energy rays to be detected can sufficiently pass through, and at such an impurity concentration rate as prevents the surface depletion of the charge accumulating units 17.

Additionally, the image sensor 11 is provided with an antireflection film 19, bonding pads 20, a support substrate 21, and so on.

[Correspondences between the Present Invention and the First Embodiment]

Hereinafter, description will be given of the correspondences between the present invention and the first embodiment. Note that these correspondences are intended to provide an interpretation for reference purposes, not to limit the present invention in vain.

The following are the correspondences between the inventions set forth in claims 1–4 and the first embodiment. The semiconductor base corresponds to the semiconductor base 12. The charge transfer unit corresponds to the CCD diffusion layers 13, the gate oxide film 14, and the transfer electrodes 15. The charge accumulating units correspond to the charge accumulating units 17. The depletion prevention layer corresponds to the depletion prevention layer 18. The charge transport unit corresponds to "the configuration of transporting the signal charges in the charge accumulating units 17 to the CCD diffusion layers 13 under the voltage control of the transfer electrodes 15" in the vertical transfer unit 16.

As for the correspondences between the invention set forth in claim 5 and the first embodiment in addition to the correspondences mentioned above, the invalid charge discharging unit corresponds to "the configuration of discharging invalid charges through the CCD diffusion layers 13" in the vertical transfer unit 16.

As for the correspondences between the invention set forth in claim 6 and the first embodiment, aside from the correspondences mentioned above, the dark current suppressing unit corresponds to "the configuration of approximating the first-plane-side potentials of the CCD diffusion layers 13 to the substrate potential so as to suppress dark current inflows" in the vertical transfer unit 16.

As for the correspondences between the invention set forth in claim 7 and the first embodiment, aside from the correspondences mentioned above, the excessive charge discharging unit corresponds to "the configuration of discharging excessive charges overflowing out of the charge accumulating units 17 through the CCD diffusion layers 13" in the vertical transfer unit 16.

[First Fabrication Method]

Figure 3:
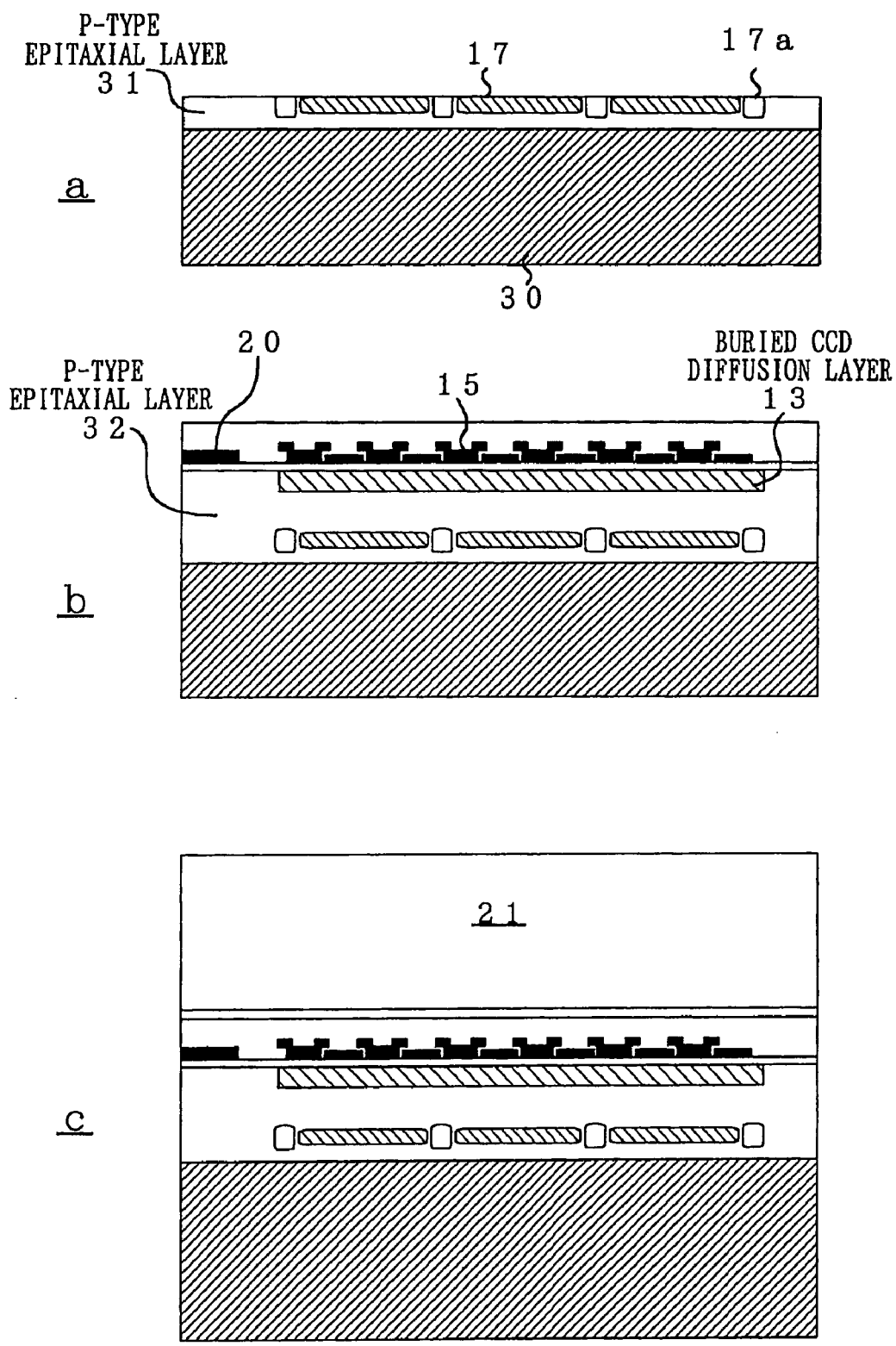
FIG. 3 is a diagram explaining a first method of fabricating the image sensor 11.
Figure 4:
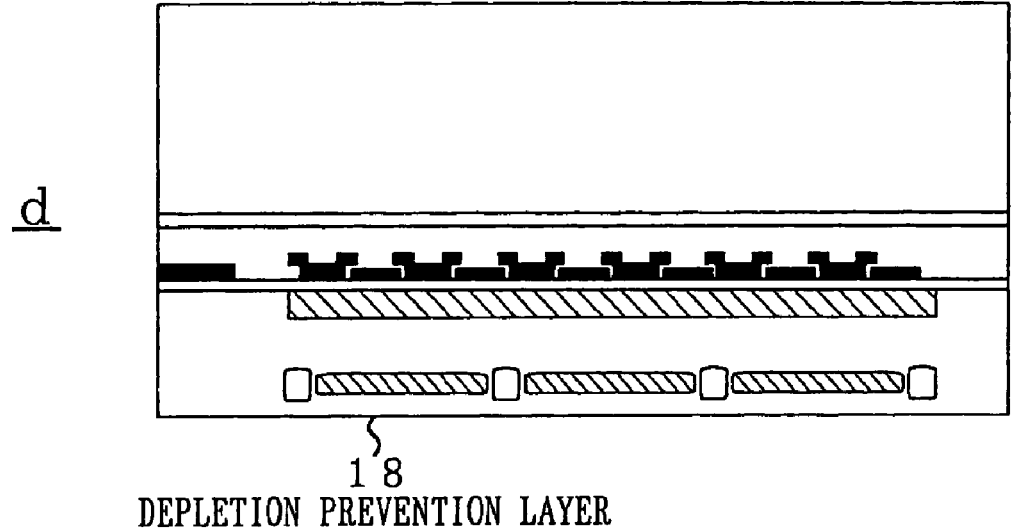
FIG. 4 is a diagram explaining a first method of fabricating the image sensor 11.
Figure 4:
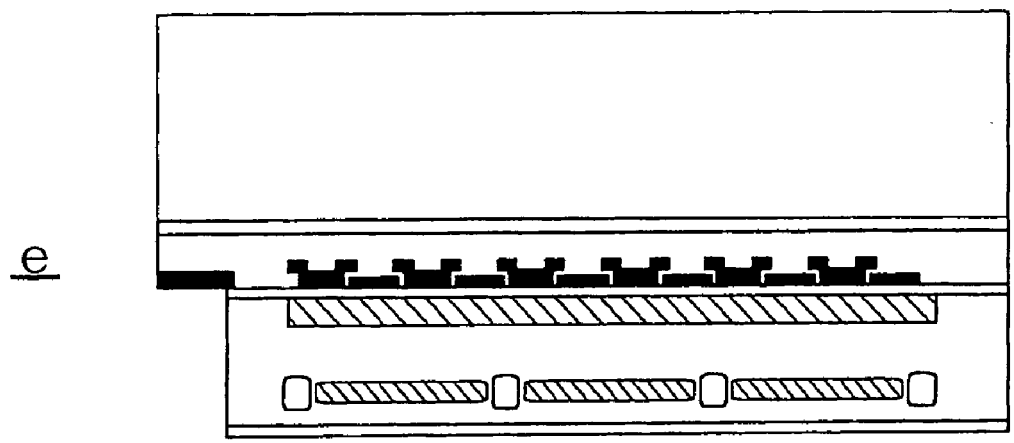

FIGS. 3 and 4 are diagrams explaining a first method of fabricating the image sensor 11. Hereinafter, the first method of fabricating the image sensor 11 will be described with reference to FIGS. 3 and 4. Incidentally, a photolithographic process and other publicly-known processes will be omitted from the description.

For a start, a P-type epitaxial layer 31 of approximately $1E15/cm^3$ in concentration and 4 μm in thickness is vapor-grown on a $P^+$-type substrate 30 of approximately $1E18/cm^3$ in concentration. Here, steps (resulting from dry etching or a difference in oxidation rate) are formed in part of the surface of the P-type epitaxial layer 31 so that they are used as an alignment mark (not shown). The P-type epitaxial layer 31 is coated with a protective oxide film, followed by As ion implantation under the conditions of 180 keV in acceleration voltage and $7E11/cm^2$ in dose to form regions to be the charge accumulating units 17. Moreover, B ions are implanted under the conditions of 60 keV in acceleration voltage and $1E13/cm^2$ in dose to form regions to be the channel stops 17a. Thereafter, annealing is performed so that the protective oxide film is removed to provide the state shown in FIG. 3a.

Next, a P-type epitaxial layer 32 of approximately $1E15/cm^3$ in concentration and 4 μm in thickness is vapor-grown on the surface of the P-type epitaxial layer 31. Here, the concentration and thickness of the P-type epitaxial layer 32 are determined so as to satisfy the condition that the CCD diffusion layers 13 and the charge accumulating units 17 be electrically isolated from each other upon the transfer operations of the CCD diffusion layers 13. Thus, given that the P-type epitaxial layer 32 has a thickness of e.g. 6 μm or so, the concentration is suitably conditioned around $5E14/cm^3$.

Next, the alignment mark on the P-type epitaxial layer 31 is put anew before CCD diffusion layers 13, a gate oxide film 14, transfer electrodes 15, and others are formed according to the same procedures as those for a frame transfer type CCD. Then, through planarization and the formation of AL wiring, a passivation film, and the like, the wafer shown in FIG. 3b is obtained.

Next, the wafer is subjected to SOG (Spin On Glass) processing or the like, whereby the portions above the epitaxial layers are planarized to a thickness of 10 μm or so. If necessary, planarization processing such as CMP (Chemical Mechanical Polishing) and mechanical polishing is performed here. Subsequently, a lightly doped silicon substrate to be the support substrate 21 is pasted on to provide the state shown in FIG. 3c.

Next, in a solution of hydrofluoric acid 1: nitric acid 3: acetic acid 8, etching is performed to remove the $P^+$-type substrate 30. Here, the fact that $P^+$ silicon is faster than $P^-$ silicon in etching rate is utilized for etching control. Here, the layer region of approximately $1E17/cm^3$ with slower etching rate remains at the interface with the P-type epitaxial layer 31, which forms the depletion prevention layer 18. FIG. 4d shows the state described above.

Next, an antireflection film 19 is formed based on a sputtering method, thereby resulting in the state shown in FIG. 4e.

Subsequently, the silicon below the pad portions is opened by dry etching or the like, followed by such steps as dicing and packaging to complete the image sensor 11.

In this connection, through further experiments, the present inventors have found another set of suitable conditions. Hereinafter, description will be given of the alternative set of conditions.

Initially, a P-type epitaxial layer 31 of approximately $3E15/cm^3$ in concentration and 4 μm in thickness is vapor-grown on a $P^+$-type substrate 30 of approximately $1E18/cm^3$ in concentration. Incidentally, steps (resulting from dry etching or a difference in oxidation rate) are formed in part of the surface of the P-type epitaxial layer 31 so as to be used as an alignment mark (not shown). The P-type epitaxial layer 31 is coated with a protective oxide film, followed by As ion implantation under the conditions of 180 keV in acceleration voltage and $6E12/cm^2$ in dose to form the regions to be the charge accumulating units 17. Moreover, B ions are implanted under the conditions of 60 keV in acceleration voltage and $1E13/cm^2$ in dose to form the regions to be the channel stops 17a. Thereafter, annealing is performed so that the protective oxide film is removed to provide the state shown in FIG. 3a.

Next, a P-type epitaxial layer 32 of approximately $3E15/cm^3$ in concentration and 3 μm in thickness is vapor-grown on the surface of the P-type epitaxial layer 31. Here, the concentration and thickness of the P-type epitaxial layer 32 are determined so as to satisfy the condition that the CCD diffusion layers 13 and the charge accumulating units 17 be electrically isolated from each other upon the transfer operations of the CCD diffusion layers 13. Thus, given that the P-type epitaxial layer 32 has a thickness of e.g. 6 μm or so, the concentration is suitably conditioned around $5E14/cm^3$.

The subsequent processes (such as the formation of the CCD diffusion layers 13) are performed in the same manner as described above.

[Second Fabrication Method]

Figure 5:
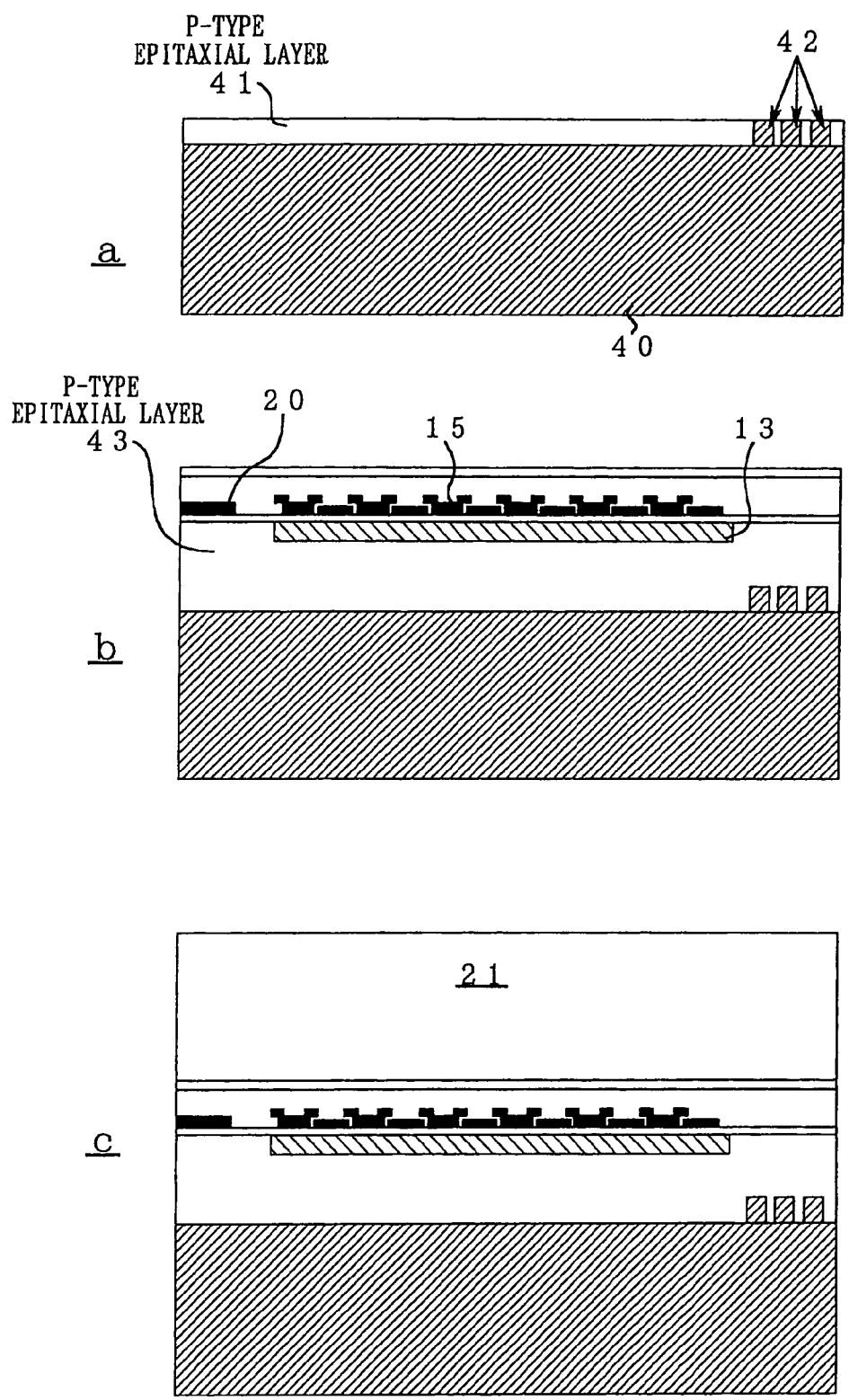
FIG. 5 is a diagram explaining a second method of fabricating the image sensor 11.
Figure 6:
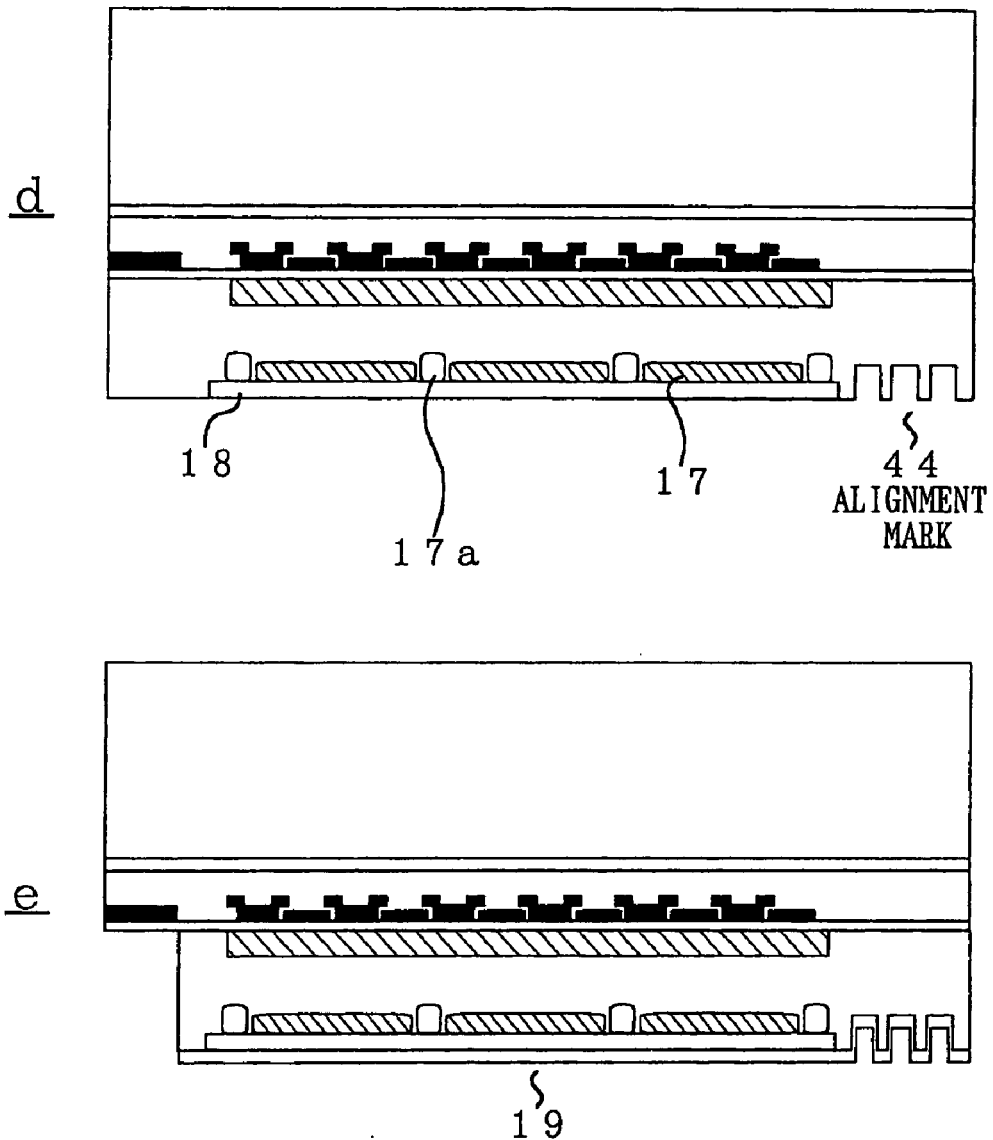
FIG. 6 is a diagram explaining a second method of fabricating the image sensor 11.

FIGS. 5 and 6 are diagrams explaining a second method of fabricating the image sensor 11. Hereinafter, the second fabrication method will be described with reference to FIGS. 5 and 6.

For a start, a P-type epitaxial layer 41 of approximately $5E14/cm^3$ in concentration and 4 μm in thickness is vapor-grown on a $P^+$-type substrate 40 of approximately $1E18/cm^3$ in concentration.

Here, $P^+$-type impurity regions 42 are formed in part of the p-type epitaxial layer 41 based on ion implantation or thermal diffusion. FIG. 5a shows the state described above.

Note that the impurity regions 42 may be any heavily doped impurity regions including $N^+$-type impurity regions. For example, Sb (antimony) is preferably used as the N-type impurities in the impurity regions 42. Moreover, Sb preferably has a concentration rate greater than or equal to $1E18/cm^3$. The reason why Sb is preferred here is that it can suppress auto doping (a phenomenon in which impurities in a substrate are emitted into the atmosphere due to high temperature, and are re-doped into growing layers) in the subsequent step (the vapor phase growth of a P-type epitaxial layer 43). The auto doping has an enormous effect on the shapes of the impurity regions 42. As a result, an alignment mark 44 to be described later might be distorted so greatly that it fails to function as a mark. The above-mentioned Sb, however, has a property against the auto doping. Thus, selecting Sb as impurities in the impurity regions 42 allows the alignment mark 44 to be formed in a favorable shape.

Next, a P-type epitaxial layer 43 of approximately 5E14/ cm$^3$ in concentration and 4 μm in thickness is vapor-grown on the P-type epitaxial layer 41.

CCD diffusion layers 13, a gate oxide film 14, transfer electrodes 15, and others are formed on the P-type epitaxial layer 43, in the same procedures as those for a frame transfer type CCD. Then, planarization and the formation of AL wiring, a passivation film, and the like are performed to obtain the wafer shown in FIG. 5b.

Next, the wafer is subjected to such planarization processing as SOG (Spin On Glass), so that the portions above the epitaxial layers are adjusted to a thickness of 10 μm or so. If necessary, planarization processing such as CMP (Chemical Mechanical Polishing) and mechanical polishing is performed here. Subsequently, a lightly doped silicon substrate to be the support substrate 21 is pasted on to provide the state shown in FIG. 5c.

Next, in a solution of hydrofluoric acid 1: nitric acid 3: acetic acid 8, etching is performed to remove the P$^+$-type substrate 40.

Here, the heavily doped P$^+$-type impurity regions 42 are also removed to form an alignment mark 44. The alignment mark 44 is used at the step of working the second-plane side to be described later; that is, it is used to achieve alignment in forming the charge accumulating units 17, the channel stops 17a, the depletion prevention layer 18, and the like.

More specifically, the P-type epitaxial layer 41 is coated with a protective oxide film at its second-plane side, followed by As ion implantation under the conditions of 180 keV in acceleration voltage and 3E12/cm$^2$ in dose to form the regions to be the charge accumulating units 17.

Moreover, B ions are implanted under the conditions of 150 keV in acceleration voltage and 1E13/cm$^2$ in dose to form the regions to be the channel stops 17a.

Boron fluoride is ion-implanted under the conditions of 120 keV in acceleration voltage and 3E13/cm$^2$ in dose. This forms the region to be the depletion prevention layer 18.

The impurity regions formed thus are locally annealed with laser or the like so as not to expose the AL wiring and the like to high temperatures. FIG. 6d shows the state described above.

Next, an antireflection film 19 is formed based on a sputtering method, and a pad opening is made from the second-plane side to provide the state of FIG. 6e.

This is followed by such steps as dicing and packaging to complete the image sensor 11.

[Description of the Operation of the Image Sensor 11]

FIGS. 7 through 10 are potential charts for explaining the operation of the image sensor 11. Hereinafter, the operation of the image sensor 11 will be described with reference to the potential charts.

Figure 7:
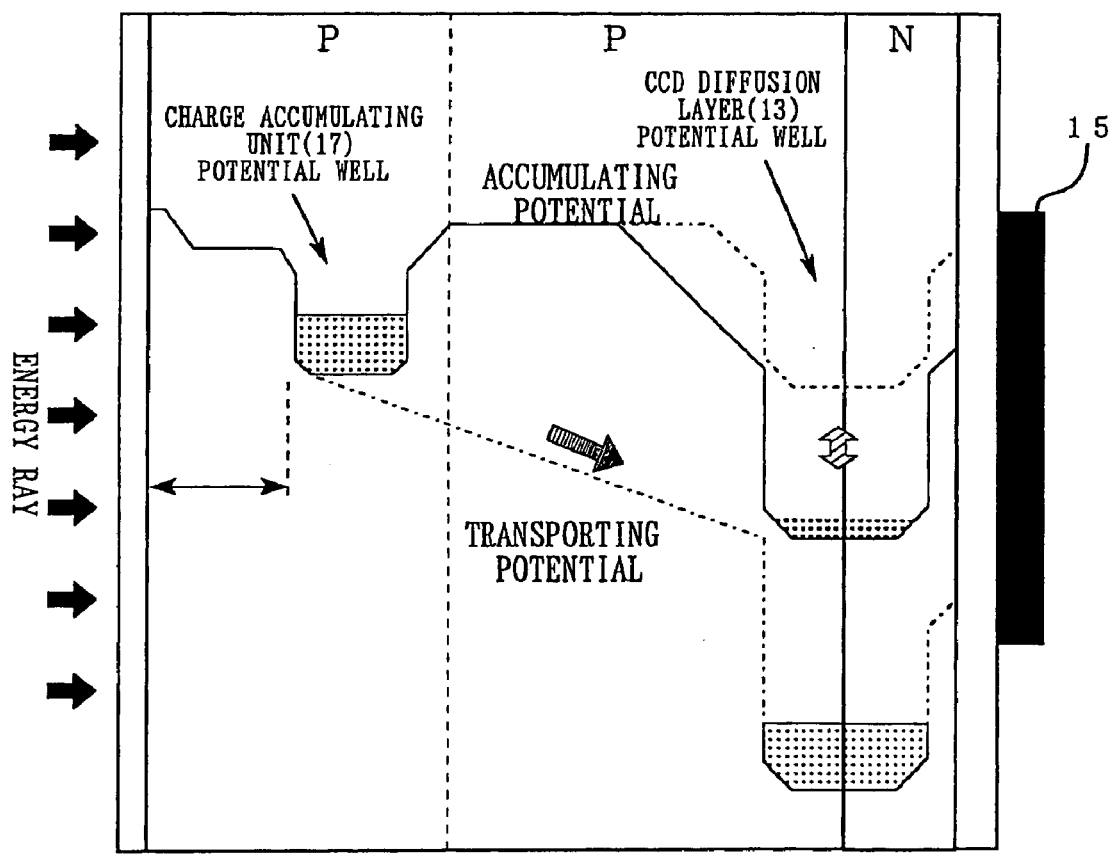
FIG. 7 is a potential chart explaining a charge accumulating operation and a charge transporting operation.

Initially, as shown in FIG. 7, most of the energy rays pass through the depletion prevention layer 18 to reach the depletion regions in the charge accumulating units 17, generating electron-hole pairs. The electrons generated here are attracted and accumulated into the potential wells in the charge accumulating units 17, thereby making signal charges.

On the other hand, the interface between the antireflection film 19 and the silicon, if depleted, would generate large number of dark currents. In the present invention, however, the depletion prevention layer lies on the interface. This makes it possible to inhibit (prevent) dark current from going into the charge accumulating units.

The conceivable reasons for such an inhibiting effect include:

the surface potential fixed to the substrate potential, dark current are hard to occur, and dark current recombine and disappear while diffusing and moving through the depletion prevention layer 18.

When a charge accumulating time is extended in order to detect weak light, the dark current accumulated into the CCD diffusion layers 13 become not negligible. For this reason, the vertical transfer unit 16, during the charge accumulating period, successively applies a transfer voltage to the transfer electrodes 15 to discharge invalid charges out of the CCD diffusion layers 13, so that the dark current are suppressed as much as possible.

Figure 8:
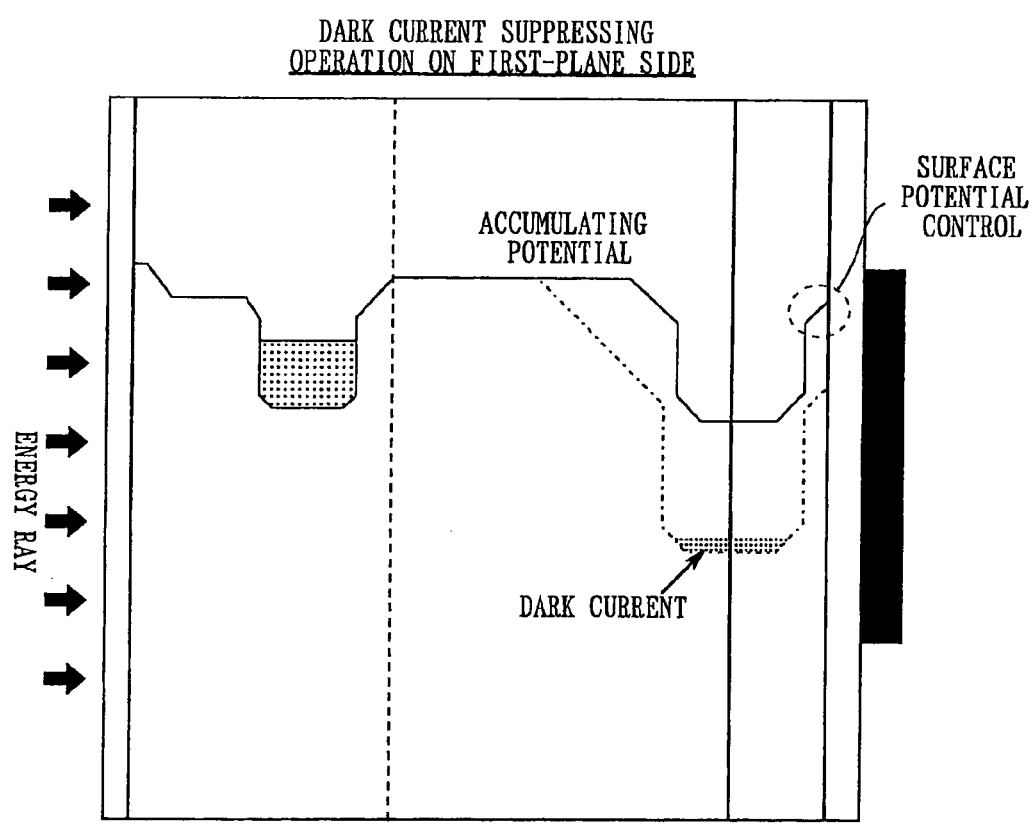
FIG. 8 is a potential chart explaining a dark current suppressing operation on the first-plane side.

Moreover, at pixels from which the invalid charges are discharged, the vertical transfer unit 16 fixes the transfer electrodes 15 to a negative voltage in succession and approximates the surface potentials of the CCD diffusion layers 13 to the substrate potential. Due to the operations, holes gather near the surfaces of the CCD diffusion layers 13 to prevent the CCD diffusion layers 13 from surface depletion. Consequently, as shown in FIG. 8, dark current that go into the CCD diffusion layers 13 can be greatly suppressed during the period of negative voltage application.

Due to both of or either of the effects, dark current can be suppressed to a negligible level even in the cases of accumulating weak light for a long time.

On the other hand, when illuminated with strong light, the potential wells in the charge accumulating units 17 are saturated to let excessive charges flow out. The conventional back-illuminated image sensor was provided with lateral overflow drains in order to prevent excessive charges from overflowing the potential wells of the CCD diffusion layers to cause a phenomenon of blurring the sensed image (so-called blooming). For that reason, the image sensor conventionally had to degrade its opening ratio corresponding to the sizes of the lateral overflow drains.

Figure 9:
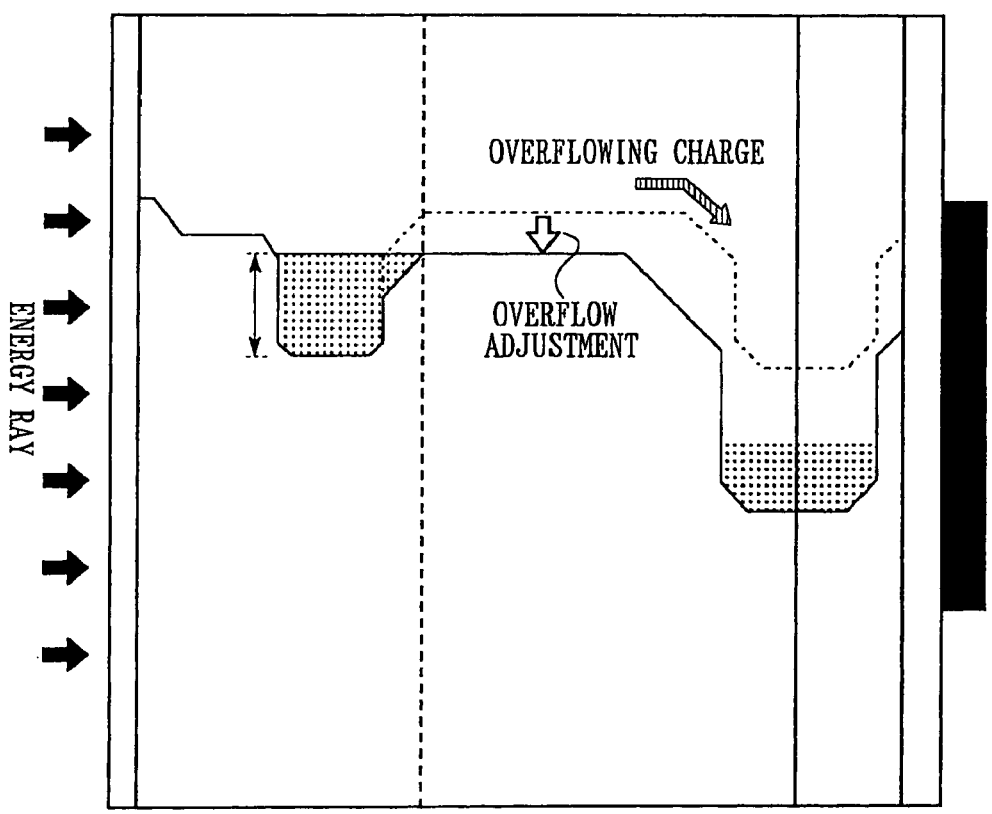
FIG. 9 is a potential chart explaining an excessive charge discharging operation.

Nevertheless, the image sensor 11 of the present invention, as shown in FIG. 9, adjusts the voltages applied to the transfer electrodes 15, so that excessive charges out of the charge accumulating units 17 overflow into the CCD diffusion layers 13. The excessive charges are discharged to exterior along with the dark current described above. Therefore, the blooming phenomenon can be improved without degrading the opening ratio of the image sensor.

When the charge accumulating time is thus ended, the vertical transfer unit 16 applies a voltage of the order of 15 V to the transfer electrodes 15. Due to the voltage application, the signal charges in the charge accumulating units 17 are attracted and transported to the respective potential wells in the CCD diffusion layers 13 on a pixel-to-pixel basis.

Here, the charge accumulating units 17 come to full depletion.

Figure 10:
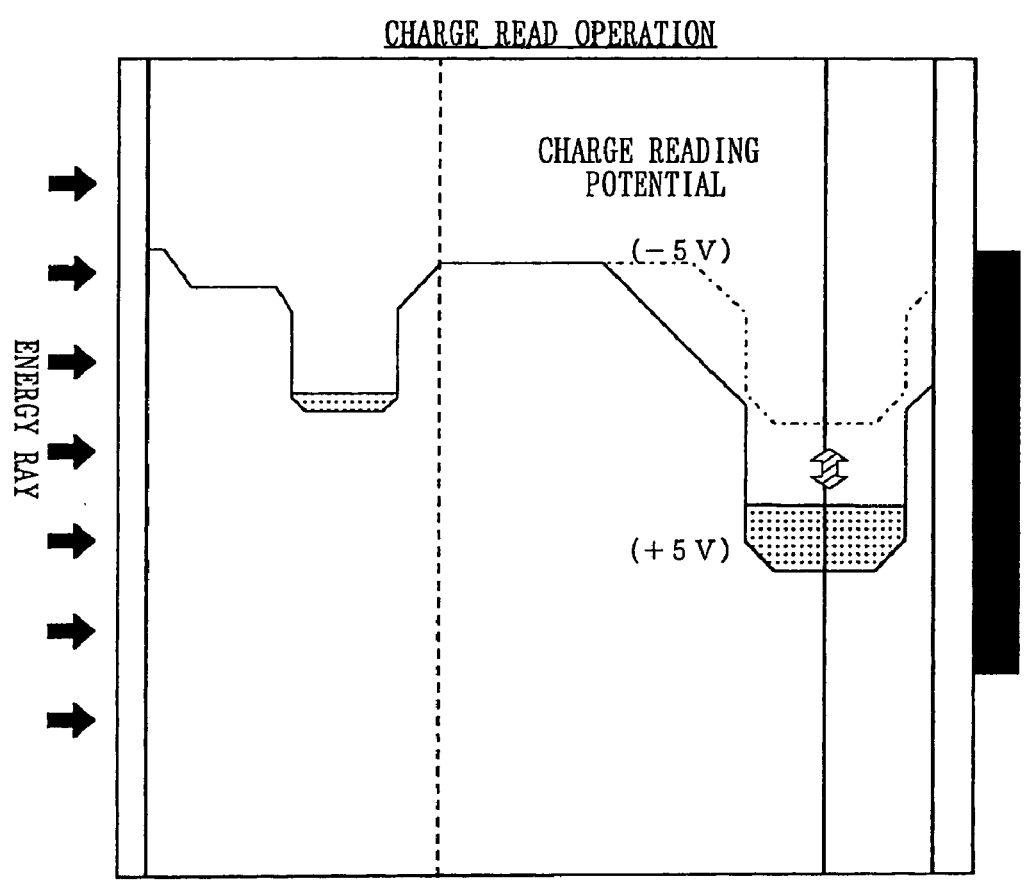
FIG. 10 is a potential chart explaining a charge read operation.

Subsequently, the vertical transfer unit 16, as shown in FIG. 10, successively applies transfer voltages of approximately ±5 V to the transfer electrodes 15 so that the signal charges in the CCD diffusion layers 13 are read out in succession.

[Effects of the First Embodiment]

In the first embodiment described above, the charge accumulating units 17 are arranged on the second-plane side, opposite to the CCD diffusion layers 13. This allows a substantial reduction in the traveling distances of the signal charges on the second-plane side. As a result, it becomes possible to improve the efficiency of energy ray detection and the production of smear. In particular, the above-mentioned improvements become more significant when the traveling distances are longer (when signal charges are generated at very shallow depth in the second plane as under ultraviolet rays).

Besides, in the first embodiment, the dark current are suppressed greatly owing to a synergistic effect of the depletion prevention layer 18, the discharging of the dark current, the prevented surface depletion of the CCD diffusion layers 13, and so on. Accordingly, it becomes possible to obtain relatively favorable imaging quality even under severe conditions such as weak light detection.

Furthermore, in the first embodiment, the provision of the depletion prevention layer 18 makes it possible to eliminate the backside wells on the second-plane side. This reduces the possibility that signal charges be captured in the backside wells, and thus allows a further improvement in the efficiency of energy ray detection.

Moreover, in the first embodiment, the excessive charges overflowing the charge accumulating units 17 are discharged through the CCD diffusion layers 13. Therefore, the blooming phenomenon resulting from excessive charges can be suppressed with reliability.

Besides, in the first embodiment, the charge accumulating units 17 arranged on the second-plane side intercept the free flow of signal charges, so that few charges might go into the CCD diffusion layers 13 during charge transfer. This eliminates the need to shield the second-plane side during the charge transfer, thereby permitting the omission of mechanical shutters. In particular, high shielding effects can be obtained in the cases where the signal charges are generated at very shallow depth in the second plane as under ultraviolet rays.

Moreover, in the second fabrication method described above, the charge accumulating units 17 and the depletion prevention layer 18 are formed from the second-plane side. This allows precise control over the surface depth of the depletion prevention layer 18 and the like.

Furthermore, in the above-described second fabrication method, the P$^+$-type impurity regions 42 are embedded at the time of processing the first-plane side of the image sensor 11. Thereafter, the P$^+$-type impurity regions 42 are removed from the second-plane side to form the alignment mark 44 on the second-plane side of the image sensor 11. By using the alignment mark 44 as a positional reference, a device structure in alignment with the processing to the first-plane side can be formed on the second-plane side of the image sensor 11.

Now, description will be given of another embodiment.

Second Embodiment

The second embodiment corresponds to the inventions set forth in claims 1–9.

Figure 11:
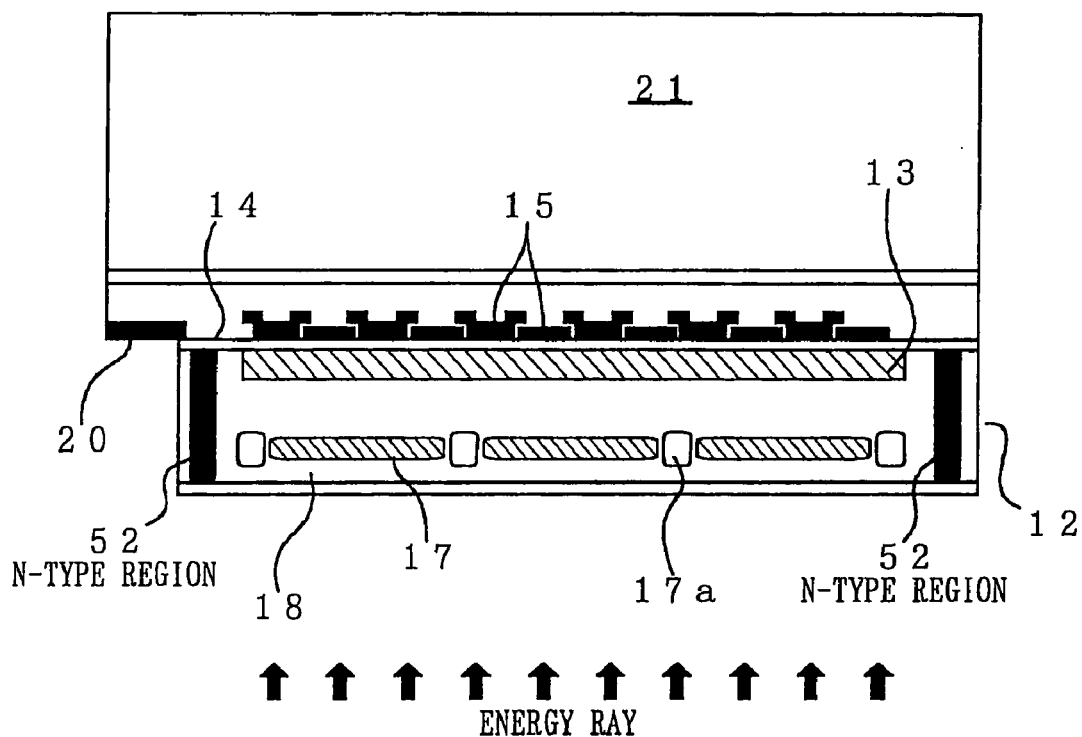
FIG. 11 is a sectional view of an image sensor 51 according to a second embodiment.

FIG. 11 is a sectional view of an image sensor 51 according to the second embodiment. Note that configurations common to those of the first embodiment (FIG. 2) are shown in FIG. 11 with identical numerals attached thereto. Description thereof will be omitted here.

A constitutional feature of the image sensor 51 lies in that the semiconductor base 12 is surrounded by an N-type region 52 (corresponding to the semiconductor region described in claim 9) so that the semiconductor base 12 has a well structure. Incidentally, the well structure may be fabricated by forming an N$^+$-type impurity region in the semiconductor base 12 as an isolation. Otherwise, it may be fabricated by forming a well-shaped P-type semiconductor 12 in part of an N-type semiconductor.

Figure 12:
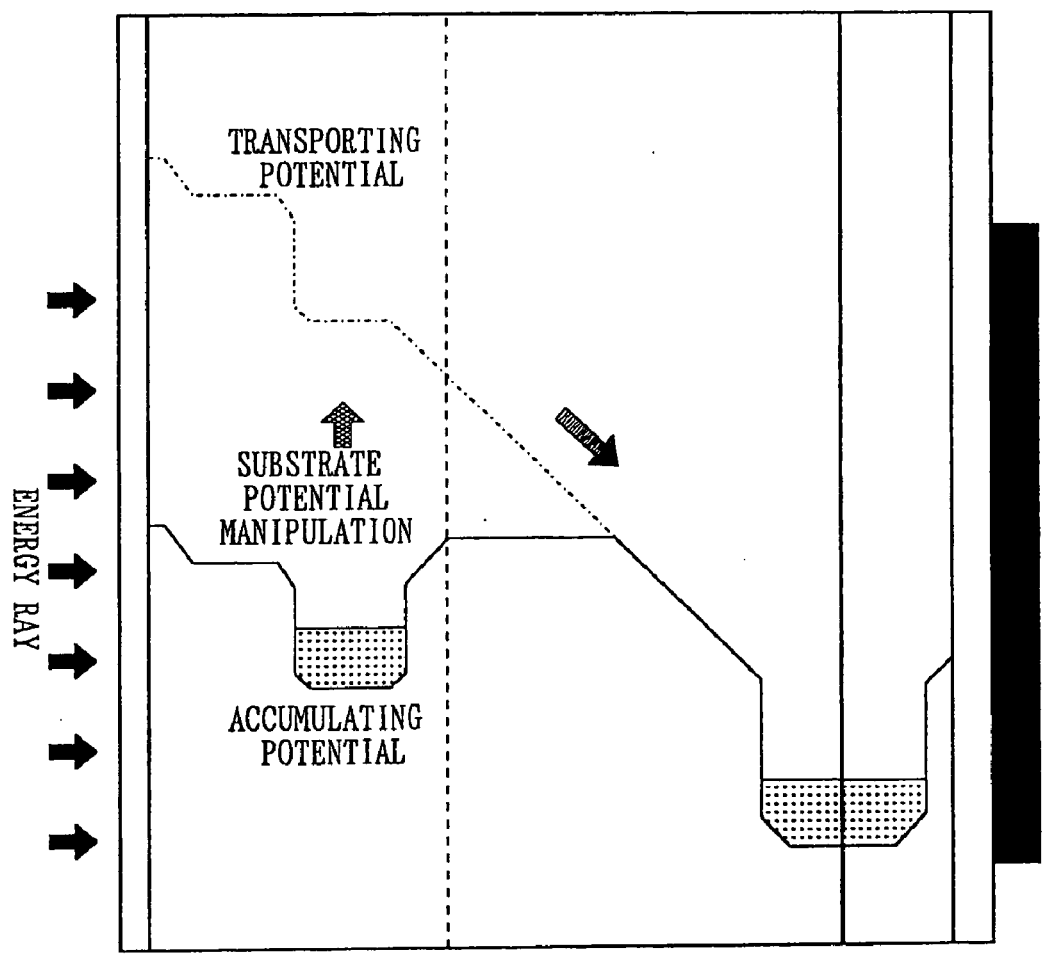
FIG. 12 is a diagram explaining a charge transporting operation in the image sensor 51.

FIG. 12 is a potential chart for explaining the operation of the second embodiment.

In the second embodiment, as shown in FIG. 12, a negative voltage of the order of −15 V is applied to the substrate-potentialed terminal of the semiconductor base 12 to provide charge transportation from the charge accumulating units 17 to the CCD diffusion layers 13 (corresponding to the charge transport unit described in claim 8).

In such charge transportation, the direct control of the potentials of the charge accumulating units 17 ensures the charge transportation. Therefore, the charge accumulating units 17 can be made greater in the amount of saturation charge.

Besides, the semiconductor base 12 having a well structure is small in size, and thus is low in capacitance. Therefore, it becomes possible to drive the substrate potential of the semiconductor base 12 with smaller current at higher speed, so that the charge transporting operation can be performed at even higher speed.

Now, description will be given of another embodiment.

Third Embodiment

The third embodiment is of the image sensors corresponding to the inventions set forth in claims 1–4 and 12–15.

[Configuration of the Image Sensor]

Figure 13:
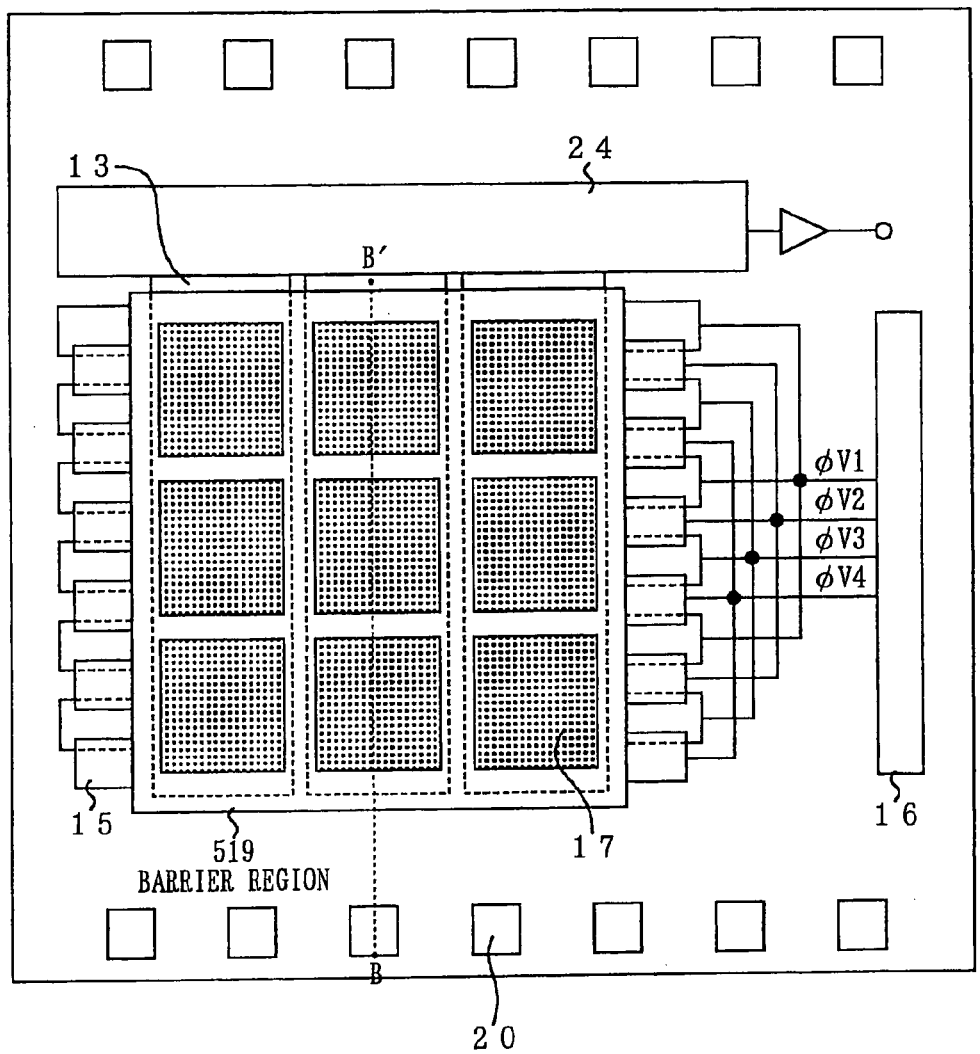
FIG. 13 is a view of an image sensor 511 according to a third embodiment, as seen from its second-plane side.
Figure 14:
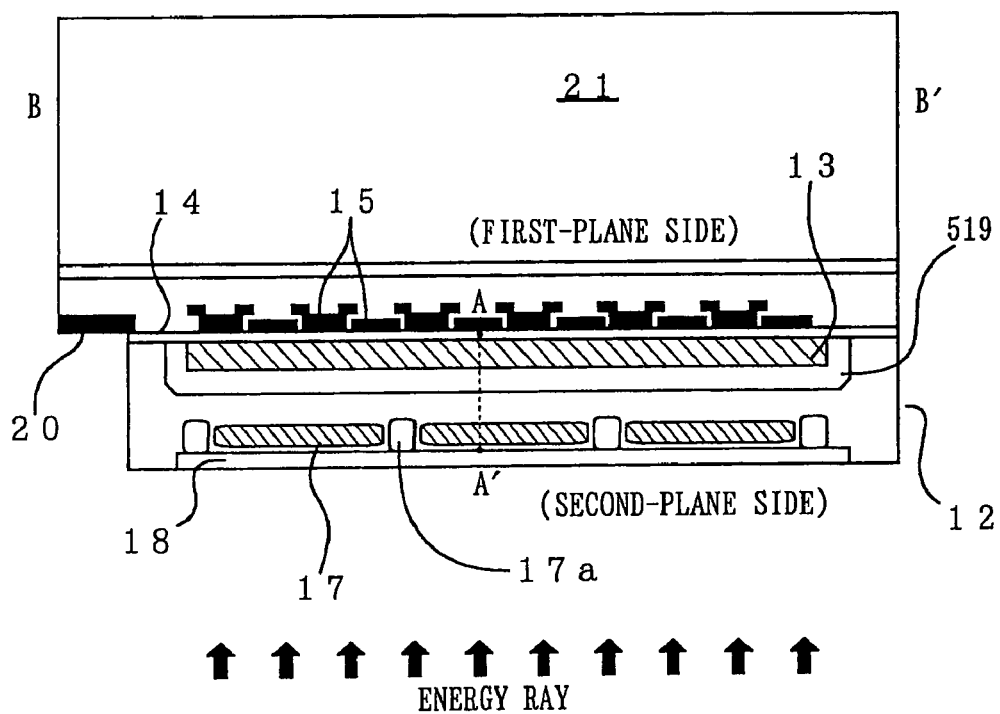
FIG. 14 is a sectional view of the image sensor 511.
Figure 15:
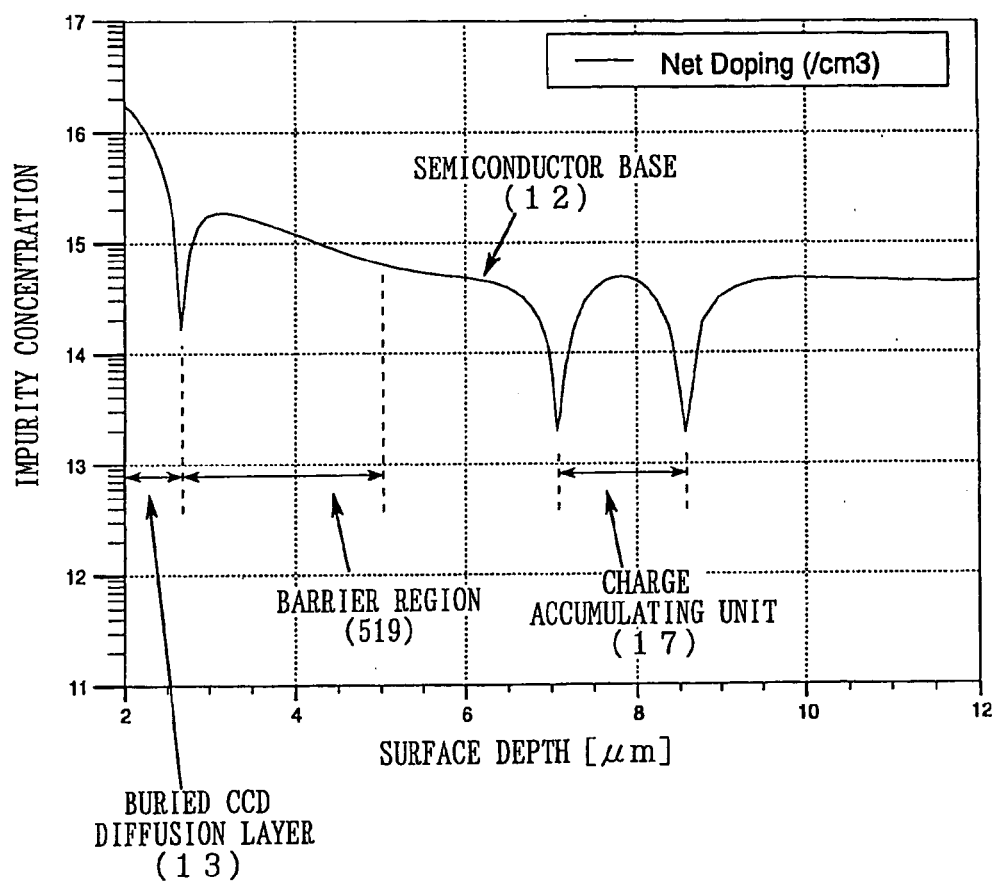
FIG. 15 is a chart showing the net impurity concentration in the A–A' part shown in FIG. 14.

FIG. 13 is a diagram showing an image sensor 511 according to the third embodiment. FIG. 14 is a diagram showing the sectional structure along the B–B' part shown in FIG. 13. FIG. 15 is a chart showing the net impurity concentration in the A–A' part shown in FIG. 14.

A constitutional feature of the third embodiment lies in that as shown in FIGS. 13 and 14, a barrier region 519 is arranged between the charge accumulating units 17 and the CCD diffusion layers 13 so as to intercept the charge transporting paths. The barrier region 519 has an impurity concentration distribution of P-type as shown in FIG. 15. The semiconductor base 12 is previously set to be lower than the barrier region 519 in P-type impurity concentration rate.

Note that components common to those of the first embodiment (FIGS. 1 and 2) are shown in FIGS. 13–15 with identical numerals attached thereto. Here, repetitive Description thereof will be omitted.

[Correspondences between the Present Invention and the Third Embodiment]

Hereinafter, description will be given of the correspondences between the present invention and the third embodiment. Incidentally, the correspondences are intended to provide an interpretation for reference purposes, not to limit the present invention in vain.

The following are the correspondences between the inventions set forth in claims 1–4 and the third embodiment. The semiconductor base corresponds to the semiconductor base 12. The charge transfer unit corresponds to the CCD diffusion layers 13, the gate oxide film 14, and the transfer electrodes 15. The charge accumulating units correspond to the charge accumulating units 17. The depletion prevention layer corresponds to the depletion prevention layer 18. The charge transport unit corresponds to "the configuration of transporting the signal charges in the charge accumulating units 17 to the CCD diffusion layers 13 under the voltage control of the transfer electrodes 15" in the vertical transfer unit 16.

The following are the correspondences between the inventions set forth in claims 12–15 and the third embodiment. The semiconductor base corresponds to the semiconductor base 12. The charge transfer unit corresponds to the CCD diffusion layers 13, the gate oxide film 14, the transfer electrodes 15, and the vertical transfer unit 16. The charge accumulating units correspond to the charge accumulating units 17. The charge transport unit corresponds to "the configuration of transporting the signal charges in the charge accumulating units 17 to the CCD diffusion layers 13 under the voltage control of the transfer electrodes 15" in the vertical transfer unit 16. The barrier region corresponds to the barrier region 519.

[First Fabrication Method]

Figure 16:
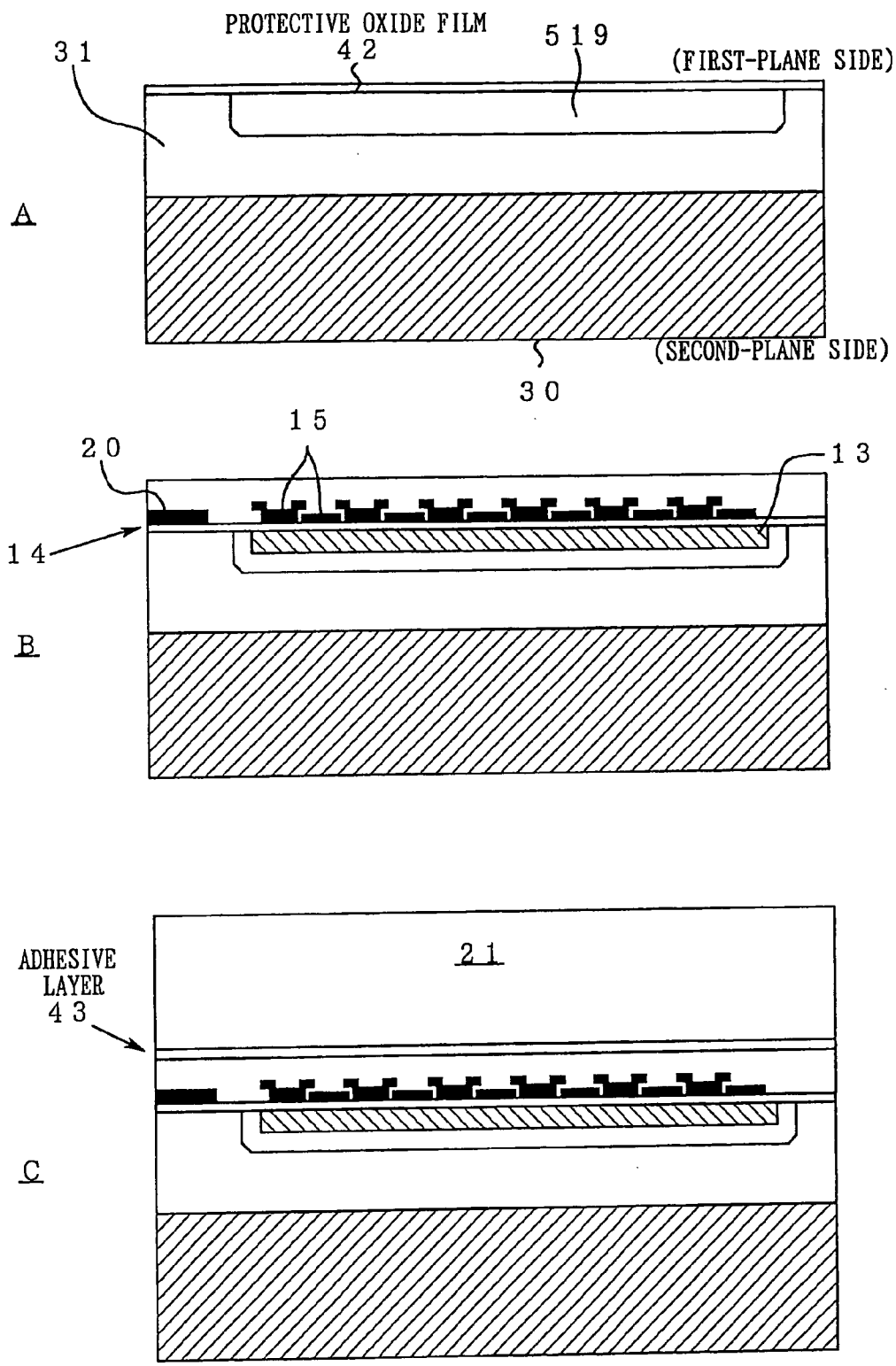
FIG. 16 is a diagram showing a first method of fabricating the image sensor 511.
Figure 17:
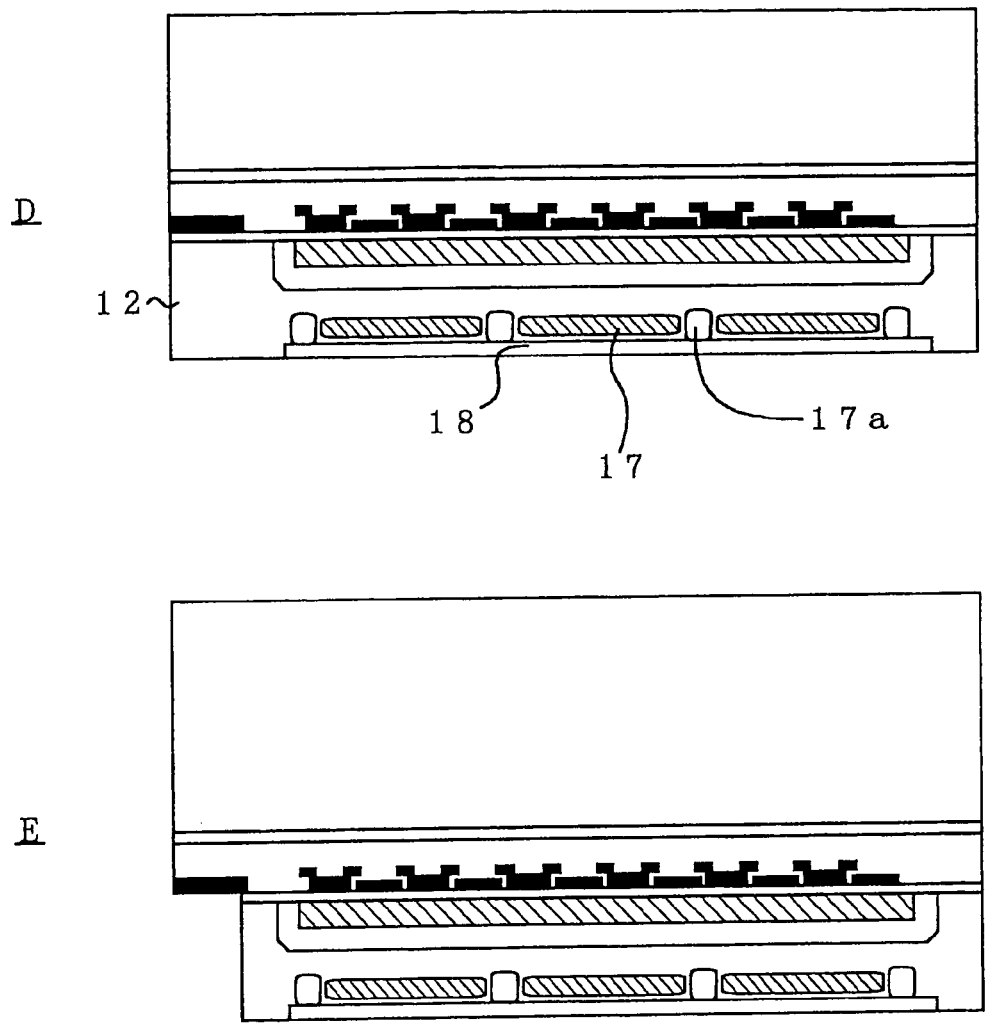
FIG. 17 is a diagram showing a first method of fabricating the image sensor 511.

FIGS. 16 and 17 are diagrams explaining a first method of fabricating the image sensor 511. Hereinafter, the first method of fabricating the image sensor 511 will be described with reference to FIGS. 16 and 17. Incidentally, a photolithographic process and other publicly known processes will be omitted from the description.

For a start, a P-type epitaxial layer 31 of approximately $5E14/cm^3$ in concentration and 12 μm in thickness is vapor-grown on a $P^+$-type substrate 30 of approximately $1E18/cm^3$ in concentration. The $P^-$-type epitaxial layer 31 is a region to be the semiconductor base 12.

A protective oxide film of the order of 500 Å is formed on the $P^-$-type epitaxial layer 31, followed by $B^+$ ion implantation under the conditions of 340 keV in acceleration voltage and $4E11/cm^2$ in dose. The wafer in this state is subjected to driving-in in a nitrogen atmosphere under the conditions of 1150° C. and 360 minutes, to obtain a barrier region 519. This provides the waver shown in FIG. 16A.

Next, buried CCD diffusion layers 13, a gate oxide film 14, transfer electrodes 15, and $N^+$ and $P^+$ diffusion layers are formed in the same procedures as those for an ordinary frame transfer type CCD. Then, after a planarization step, AL wiring, bonding pads, a passivation film, and the like are formed. The steps described above provide the wafer shown in FIG. 16B.

Moreover, the first-plane side of the wafer is planarized based on SOG (Spin On Glass) processing, and a support substrate 21 is pasted thereon via an adhesive layer 43. Thereby is obtained the waver shown in FIG. 16C.

Next, in a solution of hydrofluoric acid 1: nitric acid 3: acetic acid 8, etching is performed to remove the $P^+$-type substrate 30. Here, the fact that $P^+$ silicon is faster than $P^-$ silicon in etching rate is utilized for etching control. Before the etching, part of the $P^+$ substrate may be removed by mechanical polishing or the like. Thereby is obtained the semiconductor base 12 having a thickness of 10 μm or so.

A protective oxide film is formed on the second-plane side of the semiconductor base 12, followed by As ion implantation under the conditions of 340 keV in acceleration voltage and $1E12/cm^2$ in dose to form $P^{++}$-type charge accumulating units 17.

Then, B ions are implanted under the conditions of 50 keV in acceleration voltage and $3E12/cm^2$ in dose to form channel stops 17a.

Furthermore, boron fluoride is ion-implanted under the conditions of 10 keV in acceleration voltage and $1E15/cm^2$ in dose to form a depletion prevention layer 18.

The impurity regions formed thus are locally annealed with laser or the like so as not to expose the AL wiring and the like to high temperatures. FIG. 17D shows the state described above.

Next, an antireflection film and the like are formed based on a sputtering method. Then, etch-removing is applied to the positions of the bonding pads 20 and the like from the second-plane side, thereby obtaining the state shown in FIG. 17E. Finally, the image sensor 511 is completed through such steps as dicing and packaging.

[Second Fabrication Method]

Figure 18:
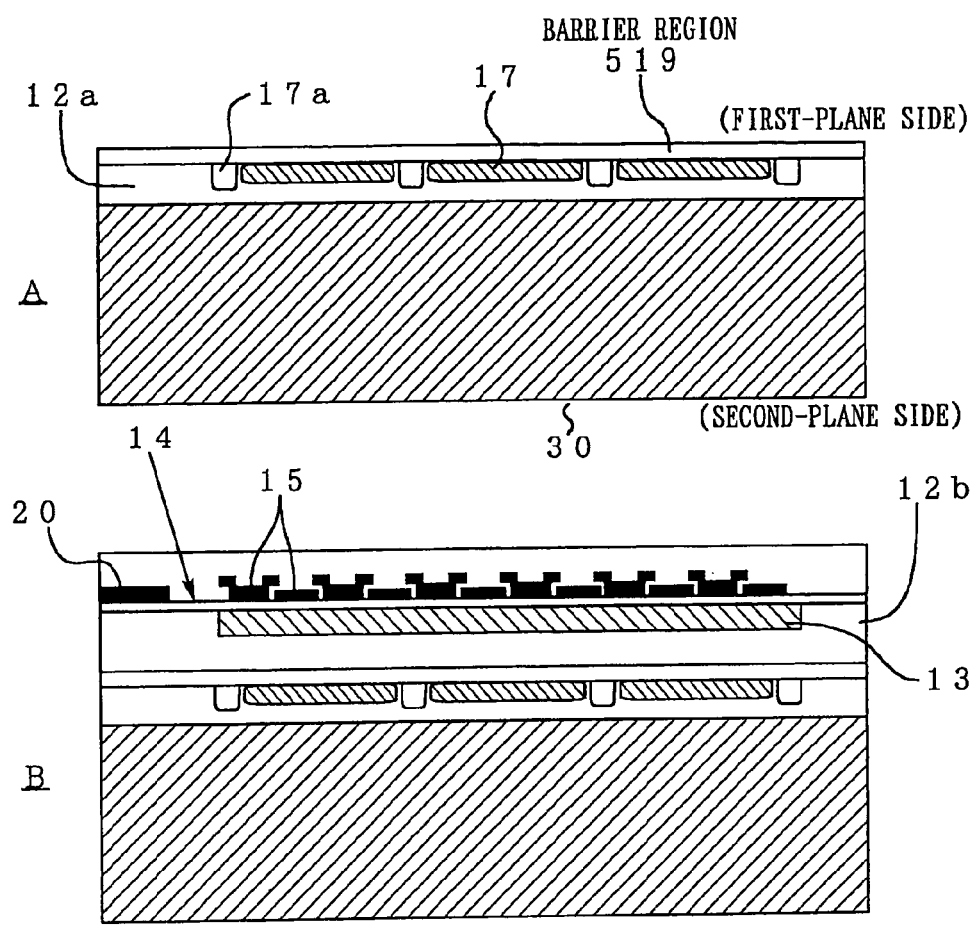
FIG. 18 is a diagram explaining a second method of fabricating the image sensor 511.
Figure 18:
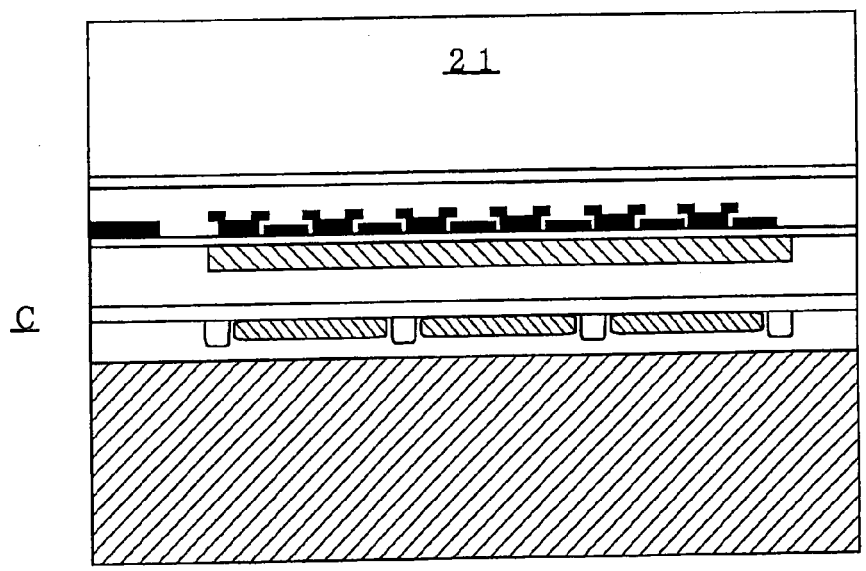
Figure 19:
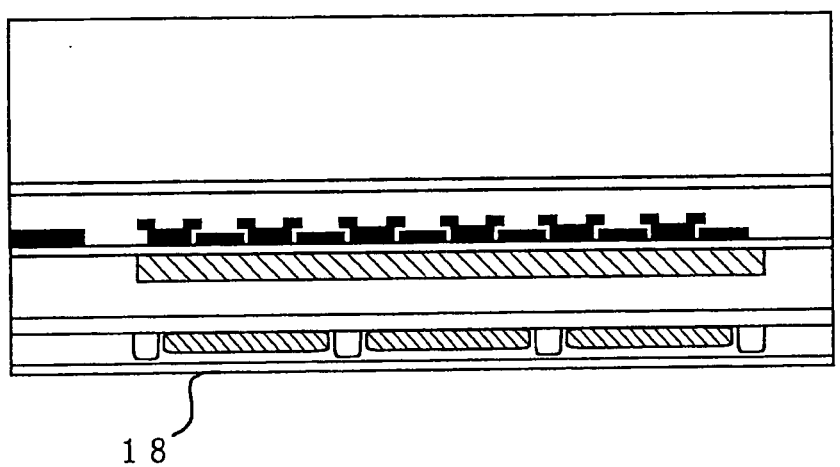
FIG. 19 is a diagram explaining a second method of fabricating the image sensor 511.
Figure 19:
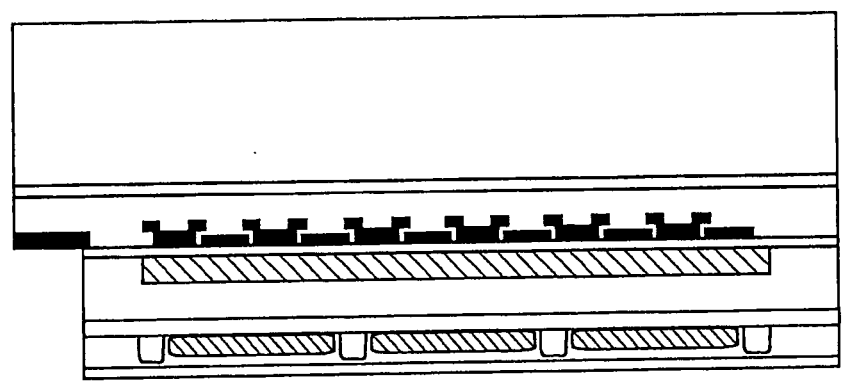

FIGS. 18 and 19 are diagrams explaining a second fabrication method according to the present invention. Hereinafter, the second fabrication method will be described with reference to FIGS. 18 and 19. Incidentally, a photolithographic process and other publicly known processes will be omitted from the description.

Initially, a $P^-$-type first epitaxial layer 12a of approximately $5E14/cm^3$ in concentration and 6 μm in thickness is vapor-grown on a $P^+$-type substrate 30 of approximately $1E18/cm^3$ in concentration.

A protective oxide film is formed on the first epitaxial layer 12a, followed by As ion implantation under the conditions of 340 keV in acceleration voltage and $4E12/cm^2$ in dose to form charge accumulating units 17.

Moreover, B ions are implanted under the conditions of 60 keV in acceleration voltage and $1E12/cm^2$ in dose to form the regions to be the channel stops 17a.

Next, B ions are implanted under the conditions of 30 keV in acceleration voltage and $6E11/cm^2$ in dose. This forms the region to be the barrier region 519.

Thereafter, annealing (1000° C., 30 min.) is performed in a nitrogen atmosphere so that the protective oxide film is removed to provide the state shown in FIG. 18A.

Next, a $P^-$-type second epitaxial layer 12b of approximately $5E14/cm^3$ in concentration and 6 μm in thickness is vapor-grown on the surface of the first epitaxial layer 12a.

Next, CCD diffusion layers 13, a gate oxide film 14, transfer electrodes 15, and others are formed in the same procedures as those for a frame transfer type CCD.

Thereafter, the wafer shown in FIG. 18B is obtained through planarization and the formation of AL wiring, a passivation film, and so on.

Then, the wafer is subjected to SOG (Spin On Glass) processing and the like. If necessary, planarization processing such as CMP (Chemical Mechanical Polishing) and mechanical polishing is performed here. Subsequently, a lightly doped silicon substrate to be the support substrate 21 is pasted on to provide the state shown in FIG. 18C.

Next, in a solution of hydrofluoric acid 1: nitric acid 3: acetic acid 8, etching is performed to remove the $P^+$-type substrate 30.

Here, the fact that $P^+$ silicon is faster than $P^-$ silicon in etching rate is utilized for etching control. Here, the layer region of approximately $1E17/cm^3$ with slower etching rate remains at the interface with the first epitaxial layer 12a, which is to be the depletion prevention layer 18. FIG. 19D shows the state described above. Incidentally, the depletion prevention layer 18 may be formed by ion implantation and laser annealing.

Subsequently, the silicon below the pad portions is opened by dry etching or the like, followed by such processes as dicing and packaging to complete the image sensor shown in FIG. 19E.

[Third Fabrication Method]

Figure 35:
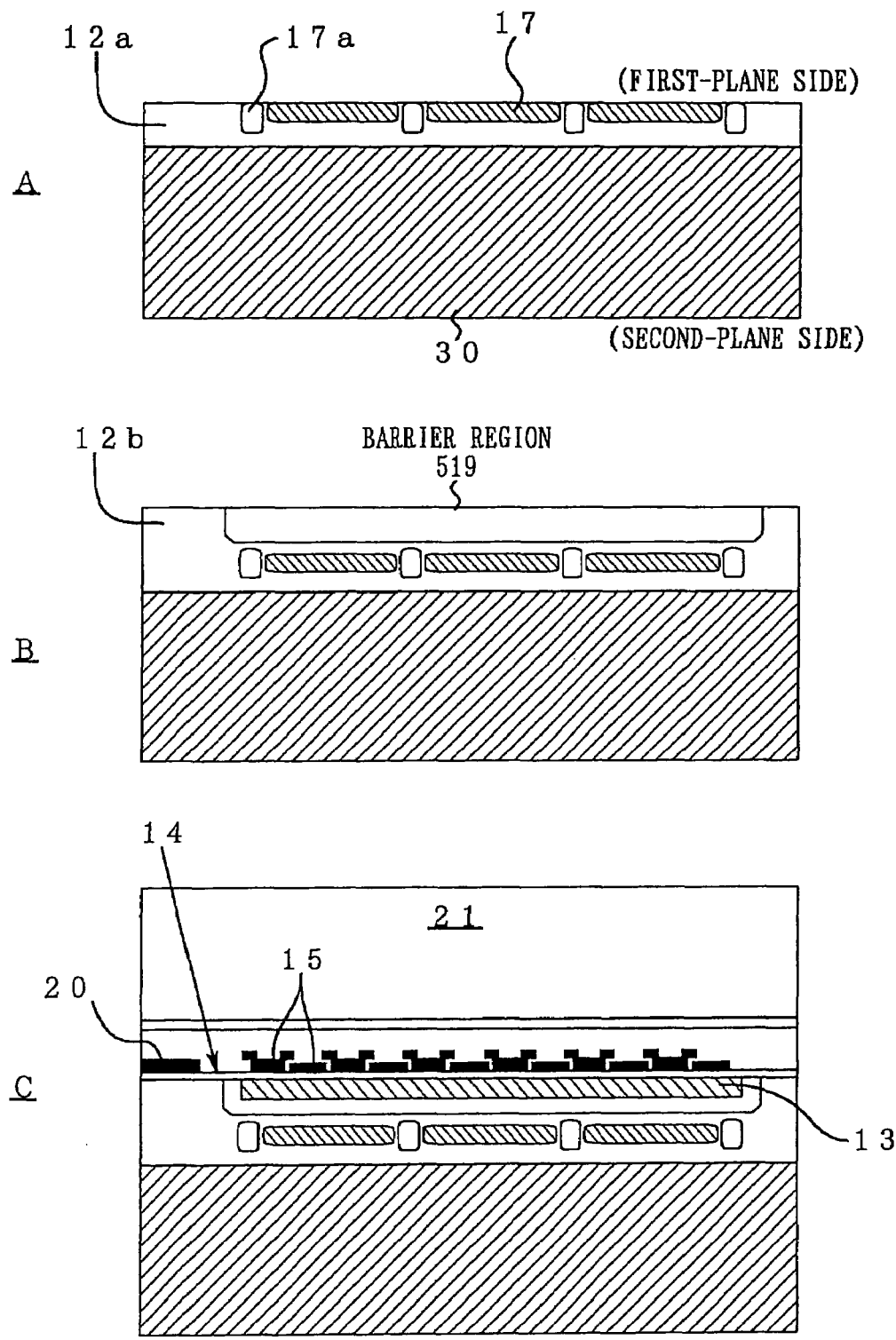
FIG. 35 is a diagram explaining a third method of fabricating the image sensor 511.

FIG. 35 is a diagram explaining a third fabrication method in the present invention. Hereinafter, the third fabrication method will be described with reference to FIG. 35. Incidentally, a photolithographic process and other publicly known processes will be omitted from the description.

Initially, a $P^-$-type first epitaxial layer 12a of approximately $5E14/cm^3$ in concentration and 5 μm in thickness is vapor-grown on a $P^+$-type substrate 30 of approximately $1E18/cm^3$ in concentration.

A protective oxide film having a thickness of the order of 500 □ is formed on the first epitaxial layer 12a. The first epitaxial layer 12a is subjected to As ion implantation under the conditions of 340 keV in acceleration voltage and 4E12/cm$^2$ in dose, to form charge accumulating units 17.

Moreover, B ions are implanted under the conditions of 60 keV in acceleration voltage and 1E13/cm$^2$ in dose to form the regions to be the channel stops 17a.

Subsequently, annealing is performed in a nitrogen atmosphere to recover crystal defects. The steps described above provide the state shown in FIG. 35A.

Next, a P$^-$-type second epitaxial layer 12b of approximately 5E14/cm$^3$ in concentration and 5 μm in thickness is vapor-grown on the surface of the first epitaxial layer 12a.

A protective oxide film having a thickness of the order of 500 □ is formed on the first-plane side of the second epitaxial layer 12b. Then, B ions are implanted under the conditions of 340 keV in acceleration voltage and 6E11/cm$^2$ in dose to form the region to be the barrier region 519.

Subsequently, annealing (1150° C., 360 min.) is performed in a nitrogen atmosphere. The steps described above provide the state shown in FIG. 35B.

Next, CCD diffusion layers 13, a gate oxide film 14, transfer electrodes 15, and others are formed in the same procedures as those for a frame transfer type CCD.

This is followed by planarization and the formation of AL wiring, a passivation film, and so on.

Then, the wafer is subjected to SOG (Spin On Glass) processing and the like. If necessary, planarization processing such as CMP (Chemical Mechanical Polishing) and mechanical polishing is performed here. Subsequently, a lightly doped silicon substrate to be the support substrate 21 is pasted on to provide the state shown in FIG. 35C.

Next, in a solution of hydrofluoric acid 1: nitric acid 3: acetic acid 8, etching is performed to remove the P$^+$-type substrate 30. Here, the fact that P$^+$ silicon is faster than P$^-$ silicon in etching rate is utilized for etching control.

Then, a protective oxide film is formed on the second-plane side of the first epitaxial layer 12a before BF ions are implanted under the conditions of 100 keV in acceleration voltage and 1E15/cm$^2$ in dose. Moreover, the BF-ion-implanted layer is annealed with laser or the like so as not to expose the AL wiring and the like to high temperatures. This completes the depletion prevention layer 18.

Subsequently, the silicon below the pad portions is opened by dry etching or the like, followed by such processes as dicing and packaging to complete the image sensor 511 shown in FIG. 14.

[Description of the Operation of the Image Sensor 511]

Figure 20:
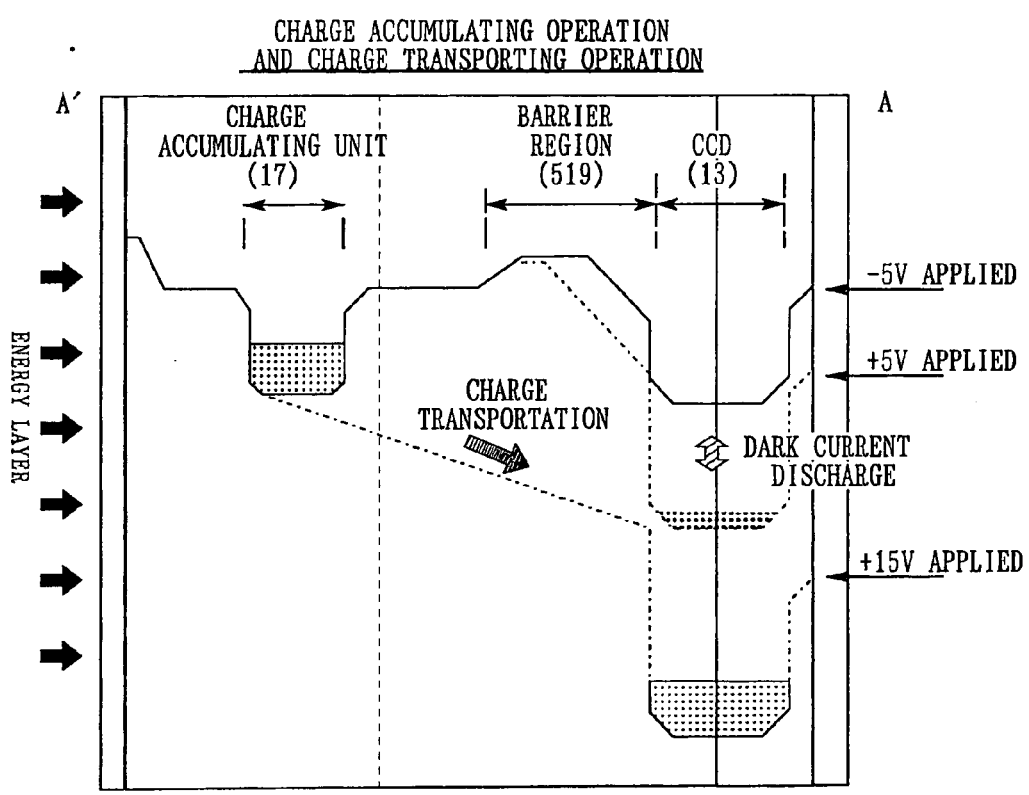
FIG. 20 is a potential chart explaining a charge accumulating operation and a charge transporting operation.
Figure 21:
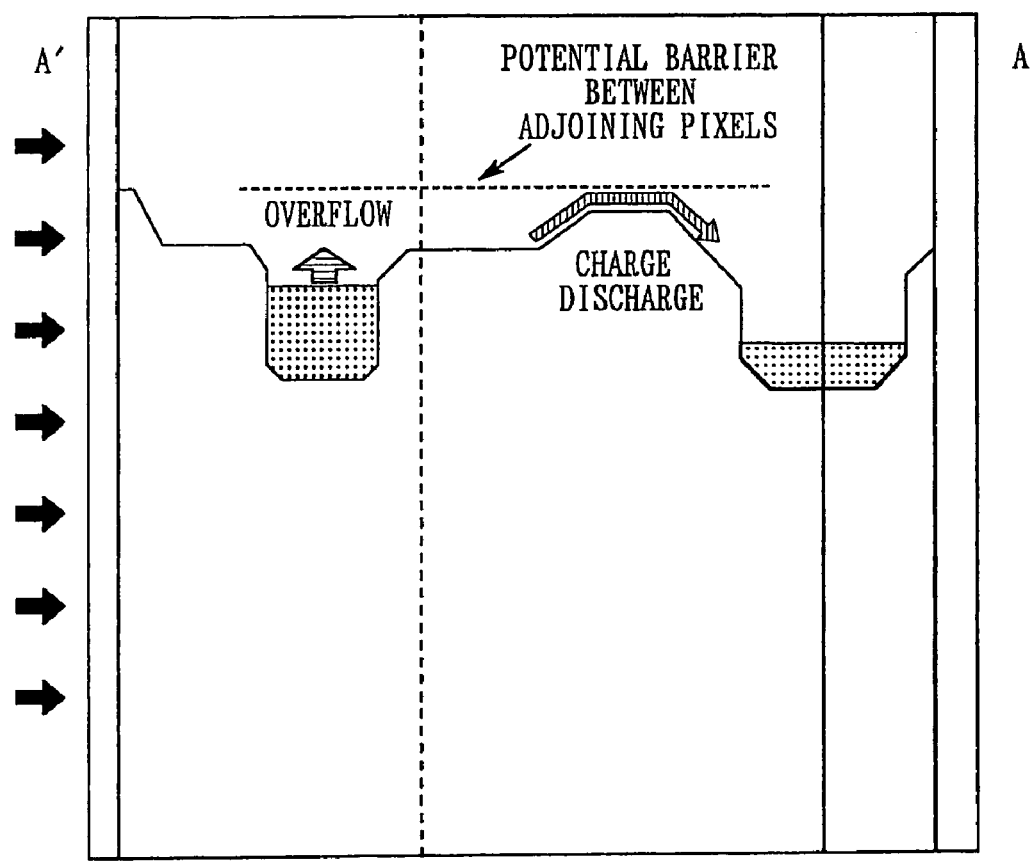
FIG. 21 is a potential chart explaining a discharge operation upon overflow.
Figure 22:
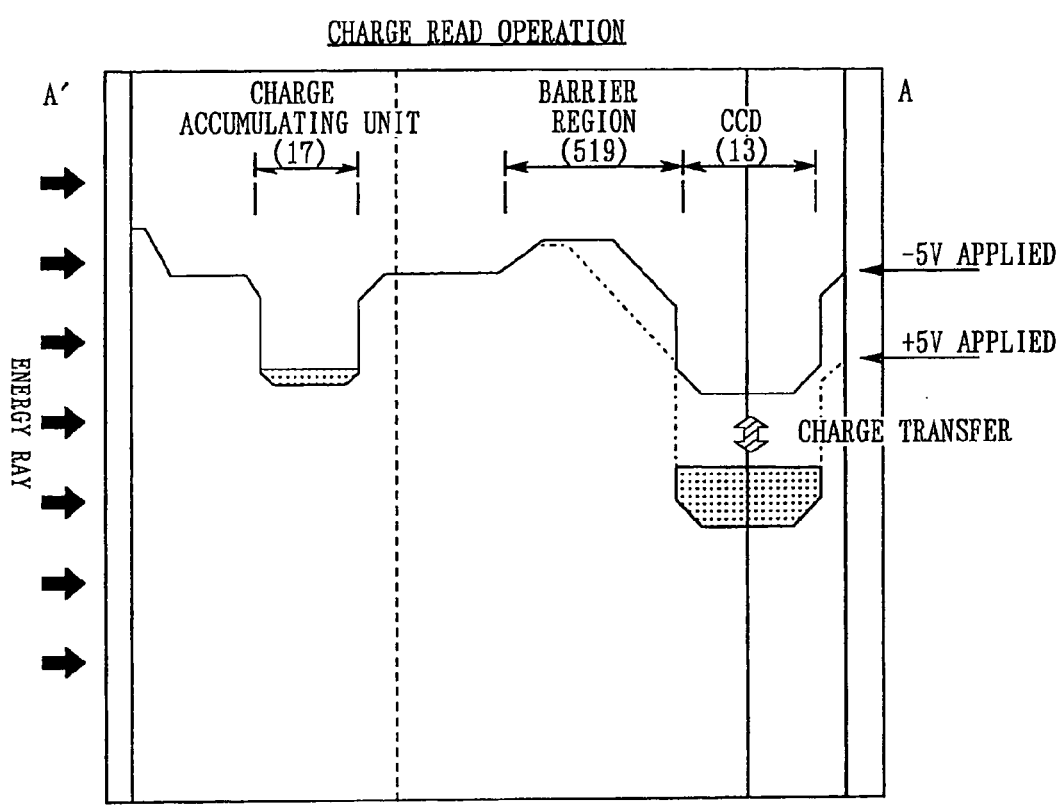
FIG. 22 is a potential chart explaining signal charge transfer and read operations.

FIGS. 20 through 22 are potential charts for explaining the operation of the image sensor 511. Hereinafter, the operation of the image sensor 511 will be described with reference to the potential charts.

Initially, as shown in FIG. 20, most of the energy rays reach the charge accumulating units 17 to generate electron-hole pairs. The electrons generated here are attracted and accumulated into the potential wells in the charge accumulating units 17, thereby making signal charges.

In this state, the charge accumulating units 17 and the CCD diffusion layers 13 are electrically isolated from each other by the peak of the potential barrier created by the barrier region 519.

When a charge accumulating time is extended in order to detect weak light, the dark current accumulated into the CCD diffusion layers 13 become not negligible. On that account, the vertical transfer unit 16, during the charge accumulating period, successively applies transfer voltages (−5 V/+5 V) to the transfer electrodes 15 to discharge invalid charges out of the CCD diffusion layers 13, so that the dark current are suppressed as much as possible.

With respect to the CCD diffusion layers 13 out of which the invalid charges are discharged, the vertical transfer unit 16 fixes the transfer electrodes 15 to a negative voltage in succession so that the surface potentials of the CCD diffusion layers 13 approach the substrate potential. Due to such operations, holes gather near the first-plane sides of the CCD diffusion layers 13, thereby preventing the CCD diffusion layers 13 from surface depletion. Consequently, during the period of negative voltage application, the dark current that goes into the CCD diffusion layers 13 from the first-plane side can be suppressed greatly.

A synergistic effect of the functions makes it possible to suppress dark current sufficiently even in the cases of accumulating weak light for a long time.

On the other hand, when illuminated with strong light, the potential wells in the charge accumulating units 17 are saturated, letting excessive charges flow out. Here, the potential barrier in the barrier region 519 is lower than the potential barriers between adjoining pixels. Therefore, the overflowing excessive charges preferentially flow into the CCD diffusion layers 13, as shown in FIG. 21. The excessive charges are discharged to exterior along with the dark current, by performing the above-described discharging operation by the CCD diffusion layers 13. As a result, the blooming phenomenon in the back-illuminated image sensor 511 is improved.

When the charge accumulating time is completed thus, the vertical transfer unit 16 applies a positive voltage of the order of 15 V to the transfer electrodes 15. It follows that the peak of the potential barrier created by the barrier region 519 is eliminated so that the signal charges in the charge accumulating units 17 are transported to the CCD diffusion layers 13.

Subsequently, the vertical transfer unit 16, as shown in FIG. 22, successively applies transfer voltages of approximately ±5 V to the transfer electrodes 15 so that the signal charges in the CCD diffusion layers 13 are transferred in succession.

[Effects of the Third Embodiment]

In the third embodiment described above, the barrier region 519 is arranged between the charge accumulating units 17 and the CCD diffusion layers 13 to create a potential barrier peak. Therefore, the threshold voltage during the charge transportation from the charge accumulating units 17 to the CCD diffusion layers 13 is not so susceptible to the impurity concentration and thickness of the semiconductor base 12, and is controlled chiefly by the peak of the potential barrier (i.e., fabrication conditions of the barrier region 519). As a result, the characteristics of the image sensor 511 are not susceptible to the epitaxial growth conditions of the semiconductor base 12. This allows a sure improvement in the production yield of the image sensor 511.

In the above-described third embodiment, the charge accumulating units 17 are arranged on the second-plane side, opposite to the CCD diffusion layers 13. This substantially reduces the traveling distances of the signal charges on the second-plane side, allowing improvements to the efficiency of energy ray detection and the smear production. As a result, variations in the detection efficiency and in the smear production which result from the production variations of the semiconductor base 12 decrease. Therefore, the production yield of the image sensor 511 is also improved in that respect.

In particular, the above-mentioned improvements become more significant when the traveling distances of the signal charges on the second-plane side are longer (when the signal charges are generated at very shallow depth in the second plane as under ultraviolet rays or other short-wavelength energy rays).

Moreover, the peak of the potential barrier peak arising in the barrier region 519 provides an electrical partition between the charge accumulating units 17 and the CCD diffusion layers 13. This further reduces the possibility that the signal charges from the charge accumulating units 17 go into the CCD diffusion layers 13 during charge transfer, reliably negating the need for a mechanical shutter for shielding the second-plane side from light.

In particular, in the first fabrication method described above, the barrier region 519 is formed in contact with the CCD diffusion layers 13 (see FIG. 16B). In this case, the CCD diffusion layers 13 can be covered with a barrier region 519 of well shape so that they are isolated from the semiconductor base 12 with reliability. As a result, it becomes possible to substantially reduce the dark current and the like which go into the CCD diffusion layers 13 from the semiconductor-base-12 side.

In addition to such anti-dark-current measures, the third embodiment also provides anti-noise measures including the depletion prevention layer 18, the discharging of dark current, and the prevented surface depletion of the CCD diffusion layers 13. Since a synergistic effect of the measures greatly reduces noises that go into the sensed images, favorable imaging quality can be obtained even under severe conditions such as weak light detection.

Besides, in the third embodiment, the potential barrier in the barrier region 519 is set to be lower than the potential barriers between adjoining ones of the charge accumulating units 17. Accordingly, excessive charges overflowing the charge accumulating units 17 are preferentially discharged to the CCD diffusion layers 13. This reduces the possibility that excessive charges go into adjacent pixels, and thereby achieves the suppression of the blooming phenomenon.

Furthermore, in the first fabrication method described above, the barrier region 519 is formed in contact with the CCD diffusion layers 13. Therefore, it becomes possible to exercise sure potential control of the potential barrier peak of the barrier region 519, through the transfer electrodes 15 on the CCD diffusion layers 13.

Figure 23:
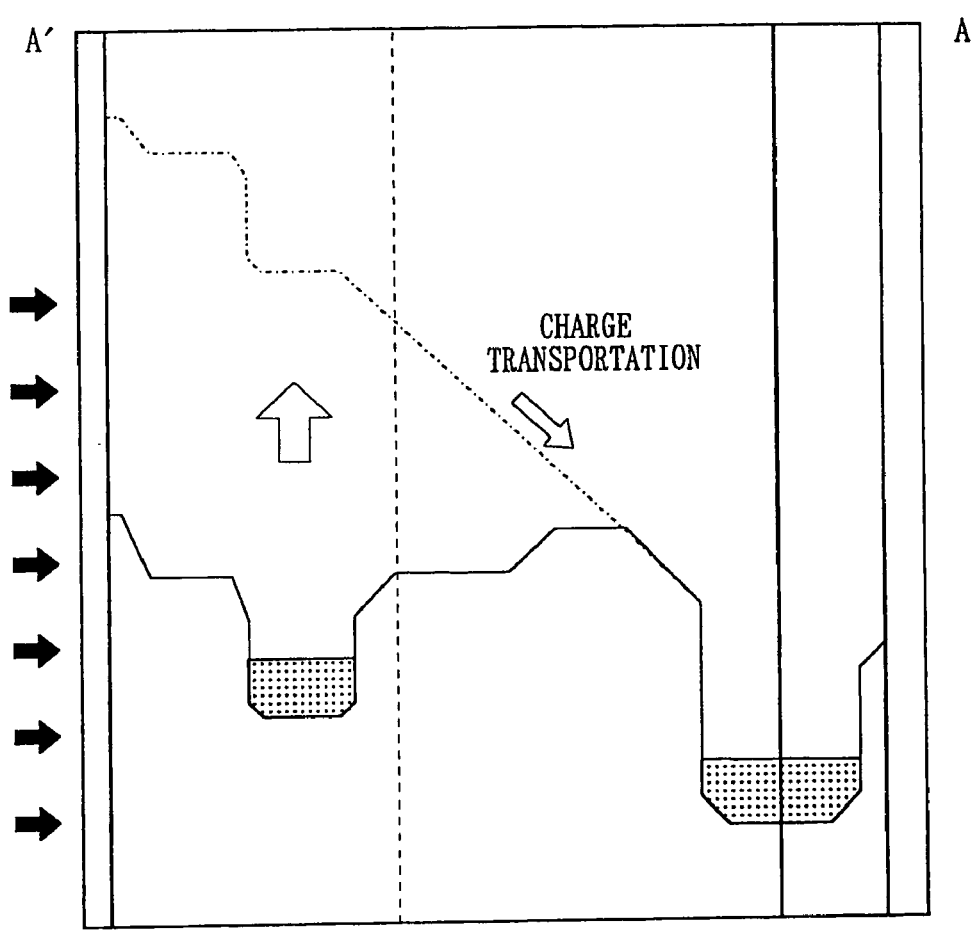
FIG. 23 is a potential chart explaining signal charge transfer and read operations.

Note that in the third embodiment described above, the charge transportation from the charge accumulating units 17 to the CCD diffusion layers 13 is effected by applying voltages to the transfer electrodes 15. However, this is not restrictive. For example, as shown in FIG. 23, the charge transportation may be achieved by controlling the substrate potential.

Now, description will be given of another embodiment.

Fourth Embodiment

The fourth embodiment corresponds to the inventions set forth in claims 1–4, 12–15 and 21.

Figure 24:
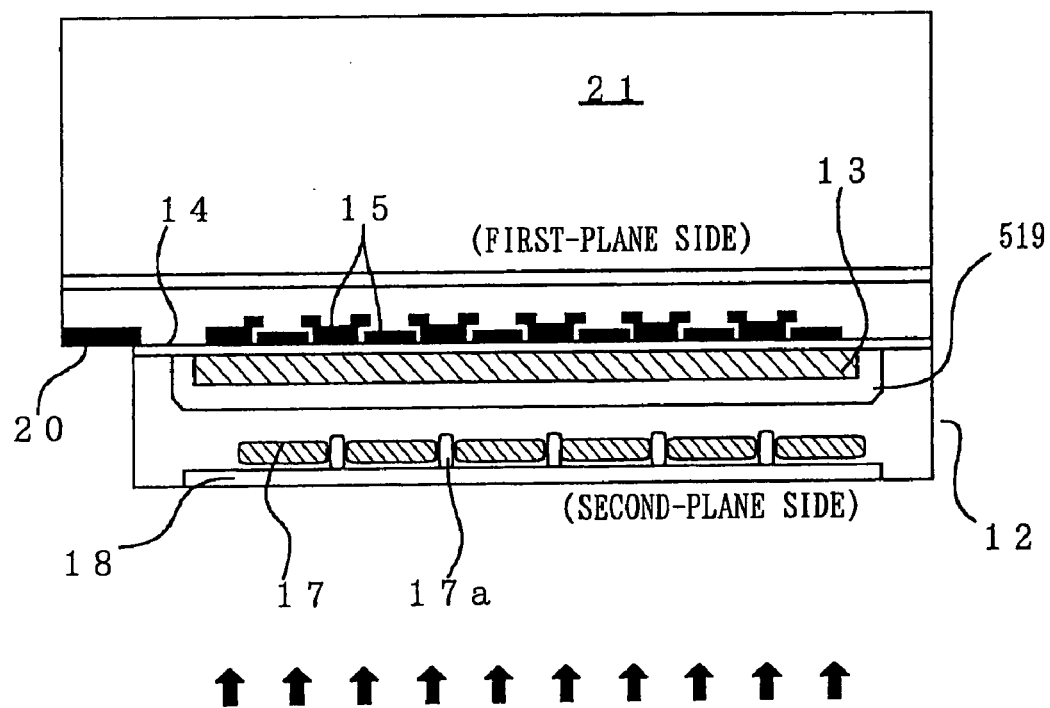
FIG. 24 is a diagram showing an image sensor 551 according to a fourth embodiment.

FIG. 24 is a diagram showing an image sensor 551 according to the fourth embodiment.

A constitutional feature of the fourth embodiment lies in that each pair of transfer electrodes 15 are provided in the charge transfer direction of the CCD diffusion layers 13 facing a single charge accumulating unit 17. Note that components common to those of the third embodiment (FIGS. 13 and 14) are shown in FIG. 24 with identical numerals attached thereto. Here, repetitive description thereof will be omitted.

The fabrication methods according to the fourth embodiment are identical to those of the third embodiment (FIGS. 16–19, FIG. 35) except that the charge accumulating units 17 have a different pixel pitch. Thus, description of the fabrication methods will be omitted here.

[Correspondences between the Present Invention and the Fourth Embodiment]

Hereinafter, description will be given of the correspondences between the present invention and the fourth embodiment. Incidentally, the correspondences are intended to provide an interpretation for reference purposes, not to limit the present invention in vain.

The following are the correspondences between the inventions set forth in claims 1–4 and the fourth embodiment. The semiconductor base corresponds to the semiconductor base 12. The charge transfer unit corresponds to the CCD diffusion layers 13, the gate oxide film 14, and the transfer electrodes 15. The charge accumulating units correspond to the charge accumulating units 17. The depletion prevention layer corresponds to the depletion prevention layer 18. The charge transport unit corresponds to "the configuration of transporting the signal charges in the charge accumulating units 17 to the CCD diffusion layers 13 under the voltage control of the transfer electrodes 15" in the vertical transfer unit 16.

The following are the correspondences between the inventions set forth in claims 12–15 and the fourth embodiment. The semiconductor base corresponds to the semiconductor base 12. The charge transfer unit corresponds to the CCD diffusion layers 13, the gate oxide film 14, the transfer electrodes 15, and the vertical transfer unit 16. The charge accumulating units correspond to the charge accumulating units 17. The charge transport unit corresponds to "the configuration of transporting the signal charges in the charge accumulating units 17 to the CCD diffusion layers 13 under the voltage control of the transfer electrodes 15" in the vertical transfer unit 16. The barrier region corresponds to the barrier region 519.

Then, the following are the correspondences between the inventions set forth in claims 21 and the fourth embodiment. In addition to the correspondences mentioned above, the charge transfer channel corresponds to the CCD diffusion layers 13. The transfer electrodes correspond to the transfer electrodes 15. The split transport unit corresponds to "the configuration of exercising voltage control of the transfer electrodes 15 to transport the signal charges in the charge accumulating units 17 to the CCD diffusion layers 13 at phase intervals" in the vertical transfer unit 16. The split transfer unit corresponds to "the configuration of supplying the transfer electrodes 15 with four-phase driving pulses for interlaced transfer of the signal charges" in the vertical transfer unit 16.

[Description of the Operation of the Fourth Embodiment]

Figure 25:
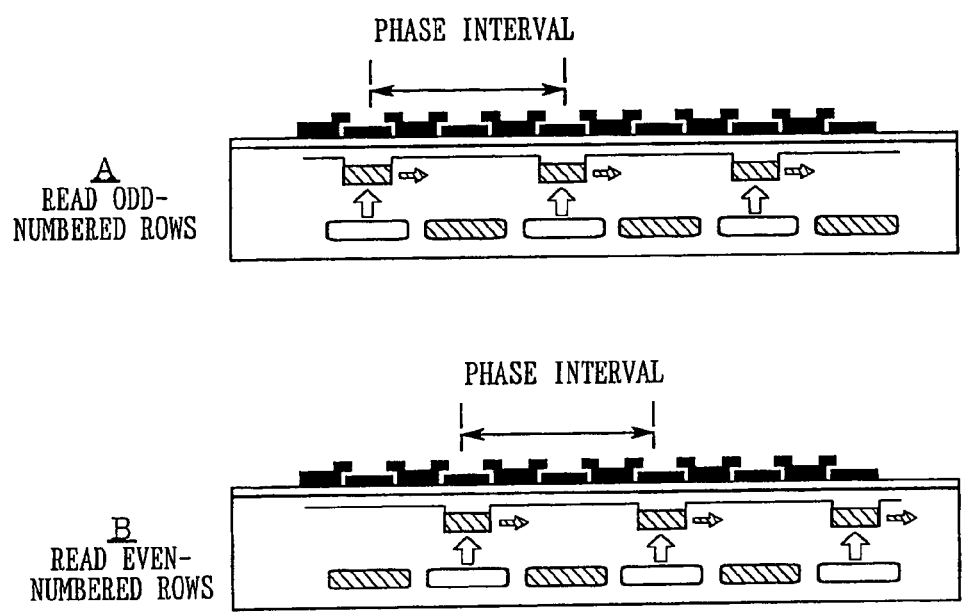
FIG. 25 is a diagram explaining a charge read operation in the image sensor 551 according to the fourth embodiment.

FIG. 25 is a diagram explaining a charge read operation of the image sensor 551 in the fourth embodiment.

Initially, as shown in FIG. 25A, the vertical transfer unit 16 applies a voltage of the order of +15 V to the transfer electrodes 15 facing charge accumulating units 17 in odd-numbered rows. It follows that the signal charges accumulated in the charge accumulating units 17 are transported to the CCD diffusion layers 13 at phase intervals (equivalent to intervals of four electrodes, because of the four-phase drive employed here). In this state, the vertical transfer unit 16 applies a four-phase driving pulse to the transfer electrodes 15 in succession, to transfer the signal charges in the CCD diffusion layers 13. The signal charges of the odd-numbered rows transferred thus are successively read out to exterior through the horizontal CCD unit 24. This completes the image read on the odd-numbered fields.

Next, as shown in FIG. 25B, the vertical transfer unit 16 applies the voltage of the order of +15 V to the transfer electrodes 15 facing charge accumulating units 17 in even-numbered rows. It follows that the signal charges accumulated in the charge accumulating units 17 are transported to the CCD diffusion layers 13 at regular phase intervals (equivalent to intervals of four electrodes, because of the four-phase drive employed here). In this state, the vertical transfer unit 16 applies a four-phase driving pulse to the transfer electrodes 15 in succession, to transfer the signal charges in the CCD diffusion layers 13. The signal charges of the even-numbered rows transferred thus are successively read out to exterior through the horizontal CCD unit 24. This completes the image read on the even-numbered fields.

[Effects of the Fourth Embodiment]

Due to the configuration described above, the fourth embodiment can offer the same effects as those obtained from the third embodiment.

Besides, the fourth embodiment allows the charge accumulating units 17 to be narrowed to a half in pixel row pitch as compared with the third embodiment. Therefore, the back-illuminated image sensor 551 can easily achieve higher resolutions.

Moreover, in the fourth embodiment, signal charges are transported from the charge accumulating units 17 to the CCD diffusion layers 13 at two-pixel intervals. This reduces the possibility that signal charges get mixed with each other during charge transportation, and thus allows the suppression of the smear production even at finer pixel pitches.

Note that in the fourth embodiment described above, two transfer electrodes 15 facing each single charge accumulating unit 17, are provided. However, the present invention is not limited thereto. For example, a single transfer electrode 15 may be arranged in each charge accumulating unit 17. Here, if the transfer electrodes 15 are intended for four-phase drive, one screen can be read out at four times. Moreover, if the transfer electrodes 15 are intended for three-phase drive, one screen can be read out at three times. Furthermore, if the transfer electrodes 15 are intended for two-phase drive, one screen can be read out at twice.

Now, description will be given of another embodiment.

Fifth Embodiment

The fifth embodiment corresponds to the inventions set forth in claims 1–4 and 12–15.

Figure 26:
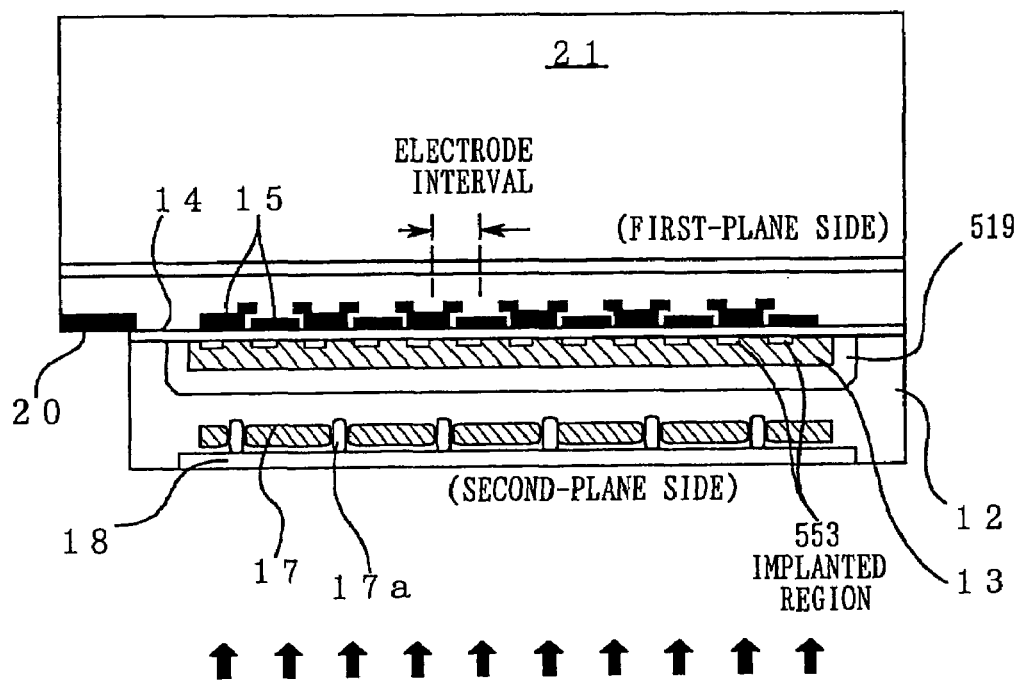
FIG. 26 is a diagram showing an image sensor 552 according to a fifth embodiment.

FIG. 26 is a diagram showing an image sensor 552 according to the fifth embodiment.

A constitutional feature of the fifth embodiment lies in that implanted regions 553 of the same conductive type as that of the semiconductor base 12 are arranged in the CCD diffusion layers 13, at electrode intervals of the transfer electrodes 15. The other constitution is identical to that of the fourth embodiment. Thus, description as to the constitution will be omitted here, while employing the same reference numbers as those in the fourth embodiment.

The fabrication methods according to the fifth embodiment are also identical to those of the third embodiment (FIGS. 16–19, 35) except that the charge accumulating units 17 have a different pixel pitch, and that the implanted regions 553 are formed by introducing impurities. Thus, description as to the fabrication methods will be also omitted here.

[Correspondences between the Present Invention and the Fifth Embodiment]

Hereinafter, description will be given of the correspondences between the present invention and the fifth embodiment.

The following are the correspondences between the inventions set forth in claims 1–4 and the fifth embodiment. The semiconductor base corresponds to the semiconductor base 12. The charge transfer unit corresponds to the CCD diffusion layers 13, the gate oxide film 14, and the transfer electrodes 15. The charge accumulating units correspond to the charge accumulating units 17. The depletion prevention layer corresponds to the depletion prevention layer 18. The charge transport unit corresponds to "the configuration of transporting the signal charges in the charge accumulating units 17 to the CCD diffusion layers 13 under the voltage control of the transfer electrodes 15" in the vertical transfer unit 16.

The following are the correspondences between the inventions set forth in claims 12–15 and the fifth embodiment. The semiconductor base corresponds to the semiconductor base 12. The charge transfer unit corresponds to the CCD diffusion layers 13, the gate oxide film 14, the transfer electrodes 15, and the vertical transfer unit 16. The charge accumulating units correspond to the charge accumulating units 17. The charge transport unit corresponds to "the configuration of transporting the signal charges in the charge accumulating units 17 to the CCD diffusion layers 13 under the voltage control of the transfer electrodes 15" in the vertical transfer unit 16. The barrier region corresponds to the barrier region 519.

The following are the correspondences between the inventions and the fifth embodiment. In addition to the correspondences mentioned above, the charge transfer channel corresponds to the CCD diffusion layers 13. The transfer electrodes correspond to the transfer electrodes 15. The variations in impurity concentration correspond to the variations in concentration caused by the implanted regions 553.

[Description of the Operation of the Fifth Embodiment]

Figure 27:
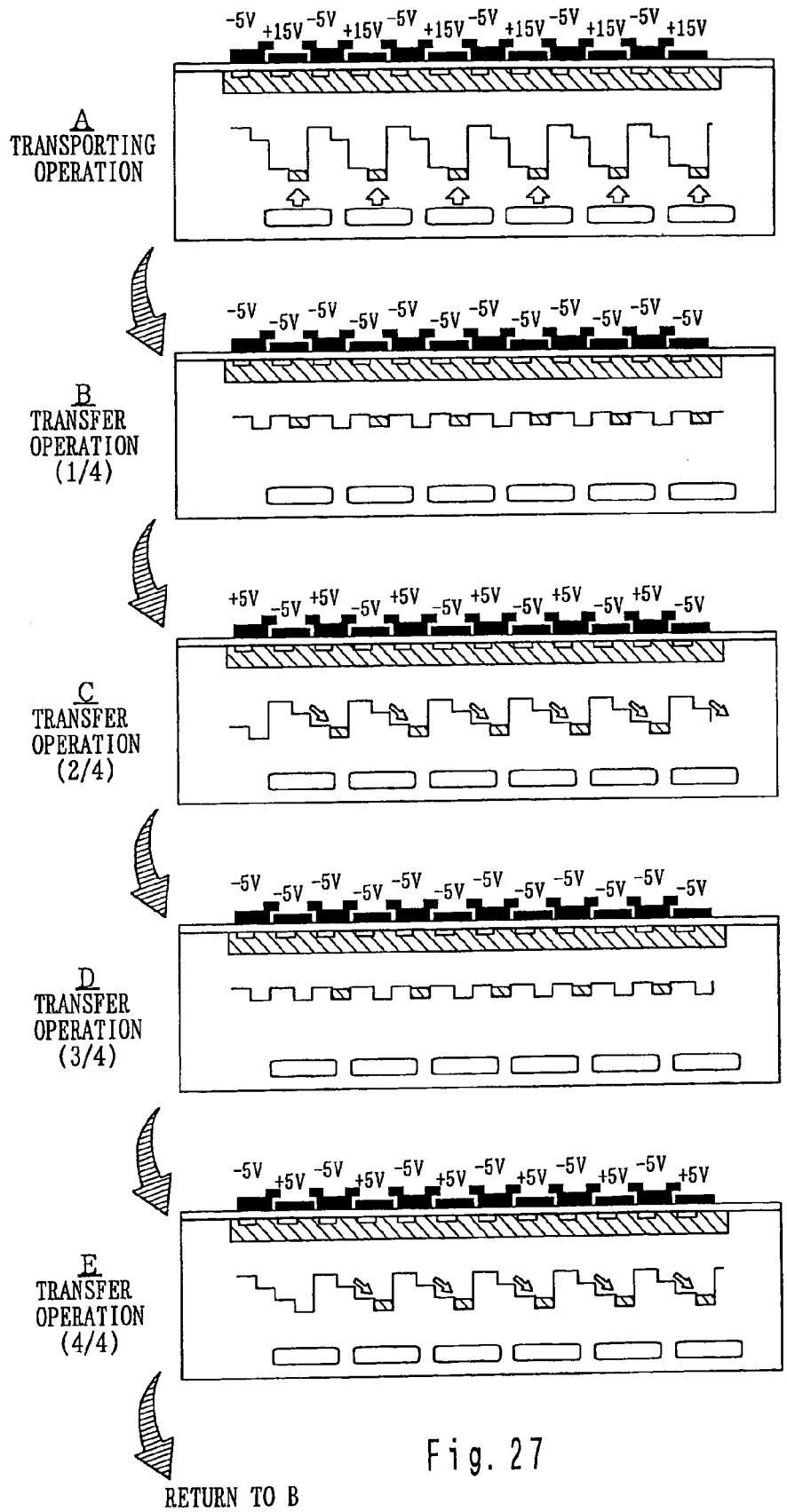
FIG. 27 is a diagram explaining transfer and read operations in the image sensor 552 according to the fifth embodiment.

FIG. 27 is a diagram explaining a charge read operation of the image sensor 552 in the fifth embodiment.

Initially, as shown in FIG. 27A, the vertical transfer unit 16 applies a voltage of the order of +15 V to even-numbered transfer electrodes 15. The result is that one screenful of signal charges accumulated in the charge accumulating units 17 are collectively transported to the CCD diffusion layers 13.

Next, as shown in FIGS. 27B–E, the vertical transfer unit 16 applies a two-phase driving pulse to the transfer electrodes 15 in succession. Here, the implanted regions 553 produce periodic potential gradients in the CCD diffusion layers 13 (FIG. 27C, FIG. 27E). The signal charges move under the influence of the potential gradients; therefore, the signal charges travel in one direction. This results in two-phase progressive transfer.

The transferred signal charges in the even-numbered rows are successively read out to exterior through a horizontal CCD (not shown). This completes the image read for one screen.

[Effects of the Fifth Embodiment]

Due to the configuration described above, the fifth embodiment can offer the same effects as those obtained from the third embodiment.

Besides, the fifth embodiment allows the charge accumulating units 17 to be narrowed to a half in pixel row pitch as compared with the third embodiment. Therefore, the back-illuminated image sensor 552 can easily achieve higher resolutions.

Moreover, in the fifth embodiment, the provision of the variations in impurity concentration (here, the implanted regions 553) within the CCD diffusion layers 13 makes feasible the progressive transfer in two-phase drive.

In particular, the implanted regions 553 separate the signal charges from each other within the CCD diffusion layers 13. This reduces the possibility that signal charges get mixed with each other during charge transfer, and thereby allows a further reduction of the smear production.

Now, description will be given of another embodiment.

Sixth Embodiment

The sixth embodiment is of the exposure apparatuses corresponding to the inventions set forth in claims 1–9, 12–15, and 21 (including alignment devices and measuring devices).

Figure 28:
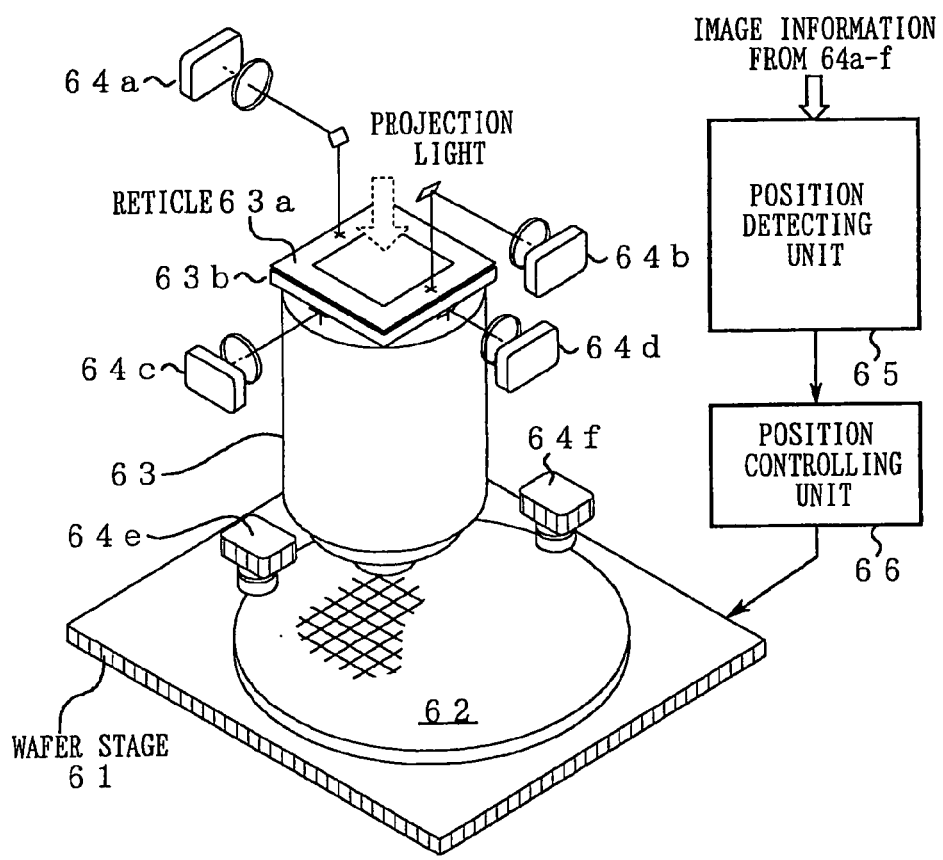
FIG. 28 is a diagram showing an exposure apparatus 60 according to a sixth embodiment.

FIG. 28 is a diagram showing an exposure apparatus 60.

In FIG. 28, a semiconductor wafer 62, or a substrate to be exposed, is placed on a wafer stage 61. A reticle 63a and a reticle stage 63b are arranged above the semiconductor wafer 62 via an exposure unit 63, or a projection optical system.

Image sensors 64a and 64b of so-called TTR (through-the-reticle) type are arranged at positions where they sense marks on the reticle 63a and marks on the wafer-stage-61 side through the projection optical system and the reticle 63a.

In addition, image sensors 64c and 64d of so-called TTL (through-the-lens) type are arranged at positions where they sense the alignment marks on the wafer-stage-61 side through the projection optical system.

Besides, image sensors 64e and 64f of off-axis type are arranged at positions where they directly sense the alignment marks on the wafer-stage-61 side without the intervention of the projection optical system.

The image information sensed by the image sensors 64a–64f is supplied to a position detecting unit 65. The position detecting unit 65 detects the positions of the semiconductor wafer 62 and reference mark plates (not shown) according to the image information. A position controlling unit 66 controls the position of the wafer stage 61 according to the result of the position detection, thereby positioning the semiconductor wafer 62. Onto the semiconductor wafer 62 positioned thus, the exposure unit 63 projects a predetermined pattern of semiconductor circuit through the reticle 63a.

Such an exposure apparatus 60 incorporates image sensors according to any one of claims 1–9, 12–15, and 21 (for example, the above-described image sensors 11, 51, 511, 551, 552) as the image sensors 64a–f.

Therefore, a reduction in the wavelength of the illuminating light for sensing is facilitated, which makes it possible to sense finer alignment marks with higher imaging quality. Moreover, it becomes possible to obtain favorable sensed images with smaller variations from the image sensors 64a–f.

This consequently improves the measuring accuracy of the position detection, allowing the exposure apparatus 60 to be further improved in positioning accuracy.

Now, description will be given of another embodiment.

Seventh Embodiment

The seventh embodiment is of the exposure apparatuses corresponding to the inventions set forth in claims 1–9, 12–15, and 21 (including aberration measuring devices and measuring devices).

The seventh embodiment shows an example where an image sensor according to any one of claims 1–9, 12–15, and 21 (for example, the image sensor 11, 51, 511, 551, or 552) is used to measure a target optical system (a projection optical system PL, in this example) for optical characteristics (wave aberration information such as a coma aberration, an astigmatic aberration, and a spherical aberration).

Figure 29:
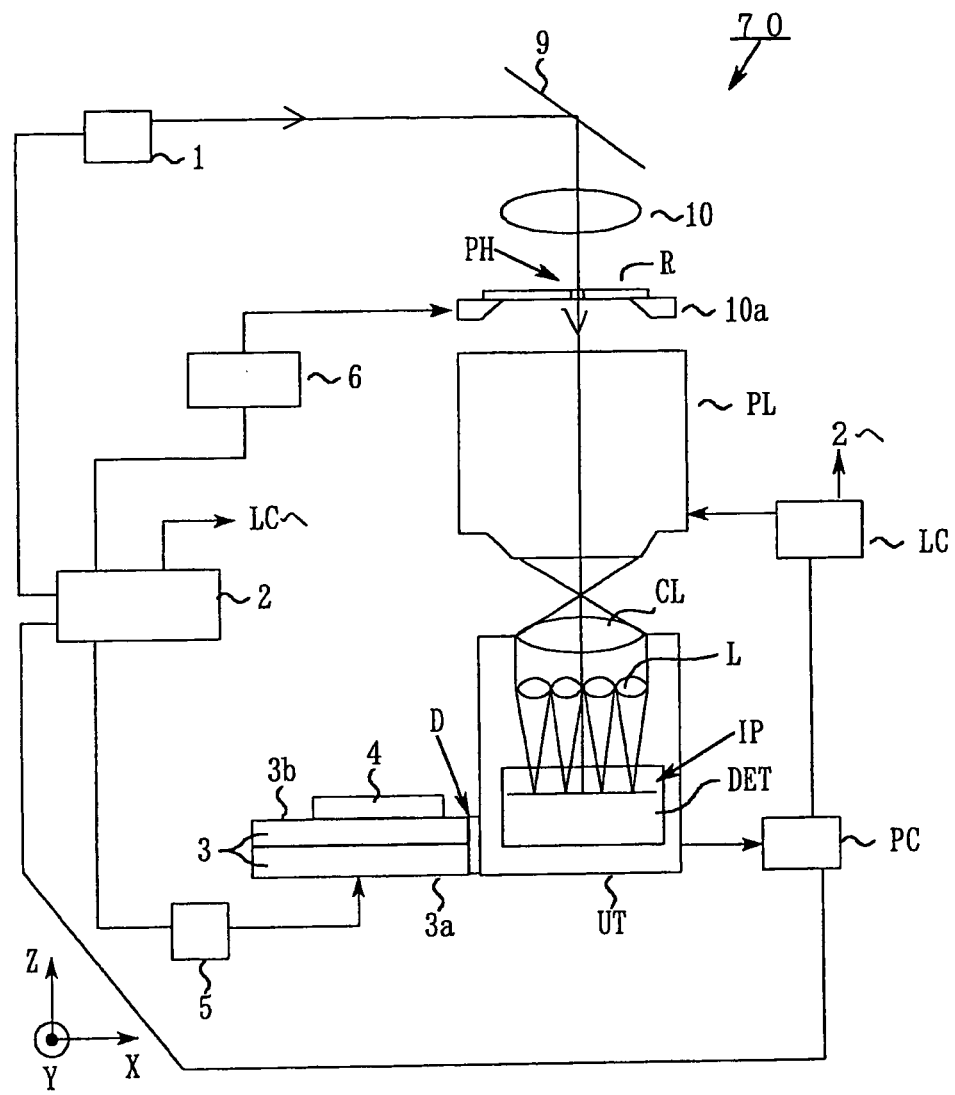
FIG. 29 is a diagram showing an exposure apparatus 70 according to a seventh embodiment.

FIG. 29 is a diagram showing an overview of an exposure apparatus 70 according to the seventh embodiment. Exposure light produced by a light source 1 passes a mirror 9 and a condenser lens 10 to illuminate a reticle (mask) R. The reticle R is placed on a reticle stage 10a. The reticle stage 10a is controlled by a reticle stage controlling unit 6.

A wafer holder 4 is arranged on a wafer stage 3 (an XY stage 3a and a Z/leveling stage 3b) so that a wafer W (not shown) is chucked on the wafer holder 4. The wafer stage 3 is drive-controlled and position-controlled by a wafer stage controlling unit 5.

A main control unit 2 is electrically connected to the light source 1, the reticle stage controlling unit 6, and the wafer stage controlling unit 5, and is configured to exercise centralized control thereof. The main control unit 2 is also electrically connected to a lens controlling unit LC (to be described later) for controlling a projection optical system PL, and to a processing unit PC (to be described later) for calculating the aberrations of the optical system according to the measurements from an aberration measuring unit UT to be described later. The main control unit 2 also exercises centralized control of the units.

The aberration measuring unit UT is detachably attached to a side of the wafer stage 3 via a detachable mechanism D. The aberration measuring unit UT comprises a collimator lens CL, a 2D lens array having a plurality of lens elements L put in a two-dimensional arrangement, and a condensing position detecting unit DET. The condensing position detecting unit DET contains one of the above-described image sensors 11, 51, 511, 551, and 552. Pencils of light past the plurality of lens elements are condensed onto the imaging plane IP of the image sensor.

Note that when the aberration measuring unit UT is mechanically connected to the exposure apparatus 70 (the side of the stage 3) via the detachable mechanism D, the aberration measuring unit UT is also electrically connected to the processing unit PC so as to be capable of communicating with each other.

Incidentally, in the present embodiment, the processing unit PC is arranged on the side of exposure apparatus 70. Nevertheless, the processing unit PC is not limited thereto, and may be arranged inside the aberration measuring unit UT so that the processing unit PC becomes capable of communicating with the exposure apparatus 70 when the unit UT is connected to the exposure apparatus 70.

[Description of the Operation of the Seventh Embodiment]

Next, description will be given of the procedures for performing the wave aberration measurement and the aberration correction of the projection optical system PL.

In measuring the wavefront in the projection optical system PL, light having a spherical wavefront, as a pencil of light for wave aberration measurement, is launched into the projection optical system PL. The spherical-wave light can be produced by mounting a reticle R (FIG. 29) with a pinhole pattern PH onto the reticle position and illuminating the same with light from the light source 1. This (the pinhole-patterned reticle) is, however, not restrictive. The pinhole may be formed in the reticle stage 10a and illuminated. Otherwise, a point light source may be used. Alternatively, a region for transmitting the light from the light source 1 with diffusion (so-called lemon-skinned) may be arranged on the reticle R or the reticle stage 10a so that the light past the lemon-skinned region is used as the light source for wave aberration measurement. In this connection, the reticle stage 10a and the reticle R desirably have the above-described pinhole or lemon-skinned region. It is even preferable that a plurality of pinholes in different sizes is provided so that the pinholes can be appropriately selected according to the purposes of the measurement.

Incidentally, when the light for wave aberration measurement is produced by using the reticle R, the reticle R constitutes an aberration measuring optical system. When the light is produced by using the reticle stage 10a, the reticle stage 10a constitutes the aberration measuring optical system.

The spherical-wave light formed thus is incident on the projection optical system PL. The wafer stage controlling unit 5 drives and controls the wafer stage 3 so that the transmitted wavefront from the projection optical system PL is incident on the aberration measuring unit UT which is detachably attached to the side of the stage 3 via the detachable mechanism D.

The light past the projection optical system PL is converted into parallel light by the collimator lens CL. The light is then incident on the 2D lens array having small lenses L in a two-dimensional arrangement. If the target wavefront of the incident light has a deviation from an ideal wavefront, i.e., the wavefront for situations where the projection optical system has no aberration, the deviation appears as positional shifts of the condensing points. The processing unit PC calculates the wave aberration in the projection optical system PL according to the positional shifts of the condensing points of the individual lenses L in the 2D lens array.

Thus, at a point on the image-forming plane of the projection optical system PL, the target wavefront can be measured for positional shifts of the individual measurement points with respect to the condensing points of an ideal wavefront, to determine the spherical aberration and the astigmatic difference of the projection optical system PL.

Besides, the wafer stage controlling unit 5 drives the wafer stage 3 so that the aberration measuring unit UT moves to a plurality of points on the image-forming plane of the projection optical system PL. Then, at each of the plurality of points on the image-forming plane of the projection optical system PL, the target wavefront can be measured for positional shifts of the individual measurement points with resect to the condensing points of the ideal wavefront. The coma aberration, field curvature, distortion, and astigmatic aberration of the projection optical system PL can be determined from the measurements.

Then, the obtained aberration information on the projection optical system PL is fed back to the lens controlling unit LC. Based on the aberration information, the lens controlling unit LC adjusts the gaps between the lens elements constituting the projection optical system PL and the pressure of the air in the gaps, so that the aberrations of the wavefront past the projection optical system PL are confined to predetermined ranges.

[Effects of the Seventh Embodiment]

In the seventh embodiment, the aberration measuring unit UT contains one of the image sensors 11, 51, 511, 551, and 552. Accordingly, the image sensor can provide favorable sensed images for aberration measurement, allowing a further improvement in the aberration correction accuracy of the exposure apparatus 70.

Incidentally, the aberration measuring unit UT may be detachably attached to the wafer holder 4 or the wafer stage 3. Otherwise, it may be incorporated into the wafer stage 3, or arranged in the vicinity of the wafer stage 3.

The condensing point detecting unit DET and the wafer stage 3 are preferably increased in measuring resolution and positioning accuracy, respectively, to improve the aberration measuring accuracy of the projection optical system PL. For example, when the condensing point detecting unit DET has a detecting resolution of 10–20 µm, an exposure apparatus for 5- by 5-mm exposure preferably controls the wafer stage 3 by 1-mm pitches.

In the present embodiment, the aberration measuring unit UT is detachably attached to the wafer stage 3. As for the detachable mechanism, notched portions may be provided in the wafer stage 3 while engaging portions for engaging with the notched portions are arranged on the measuring device for the sake of detachable attachment. Moreover, in the cases of detachably attaching the aberration measuring unit UT to the wafer stage 3, not the entirety but part of the aberration measuring unit UT, such as the collimator lens CL and the lenses L, may be rendered detachable so that the detecting unit DET is fixed to the wafer stage 3. On the contrary, the collimator lens CL and the lenses L, for example, may be fixed to the wafer stage 3 while the detecting unit DET is rendered detachable. Moreover, all of the collimator lenses CL, the lenses L, and the detecting unit DET may be fixed to the wafer stage 3.

In the present embodiment, the projection optical system PL is measured for wave aberration as incorporated in the exposure apparatus. However, it may be measured before incorporating into the exposure apparatus. The wave aberration can be measured at any timings such as at every wafer replacement, every reticle replacement, and predetermined timing. Any other timing may also be employed. Even in those cases, the measuring accuracy can be selected as described above.

The present embodiment has dealt with the case where the projection optical system PL mounted on the exposure apparatus 70 is measured for aberrations. However, the present invention is not limited thereto. It is understood that any of the image sensors 11, 51, 511, 551, and 552 may be used for aberration measurement of a variety of optical systems.

Eighth Embodiment

Figure 30:
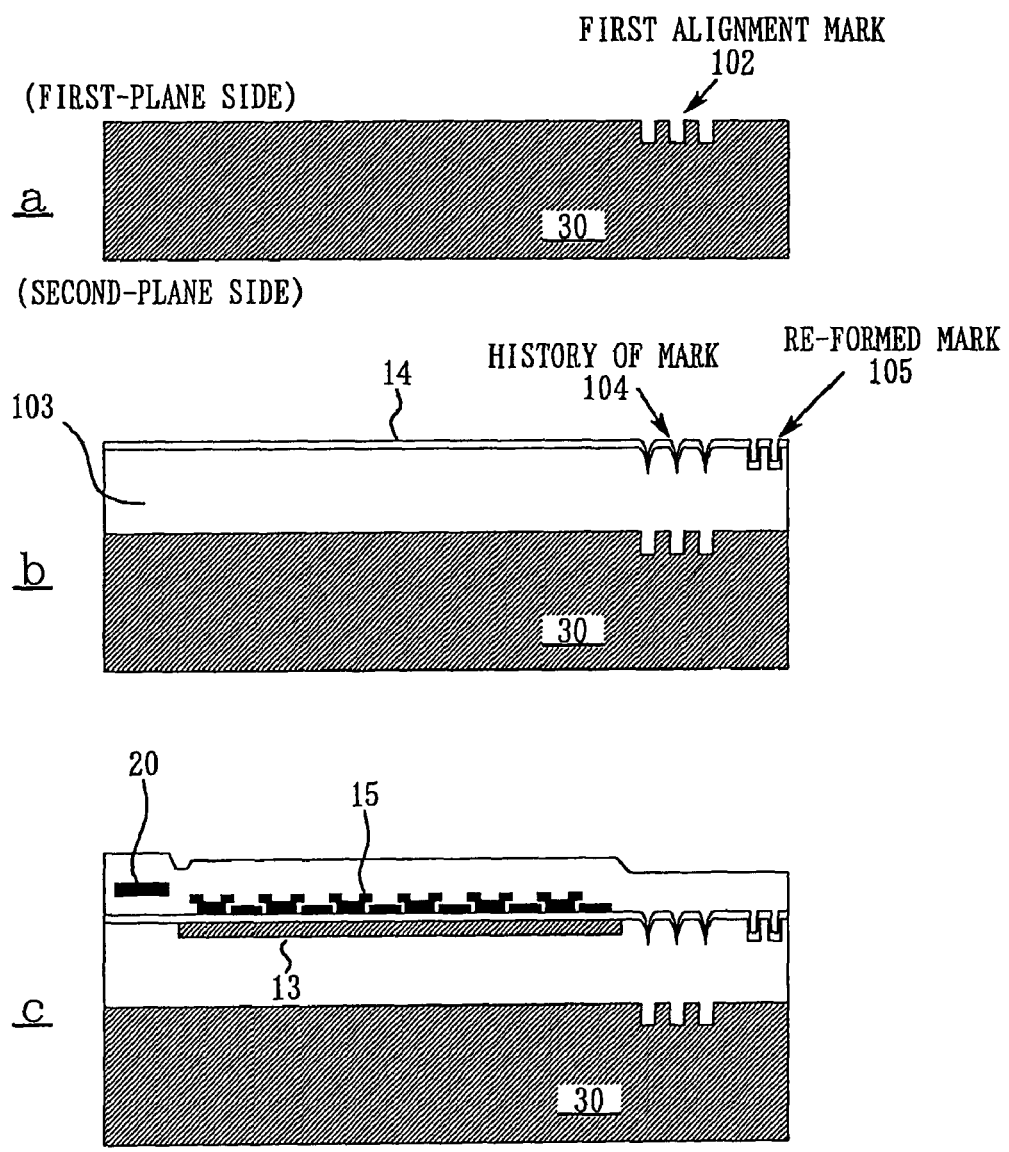
FIG. 30 is a diagram showing the fabrication steps according to an eighth embodiment.
Figure 31:
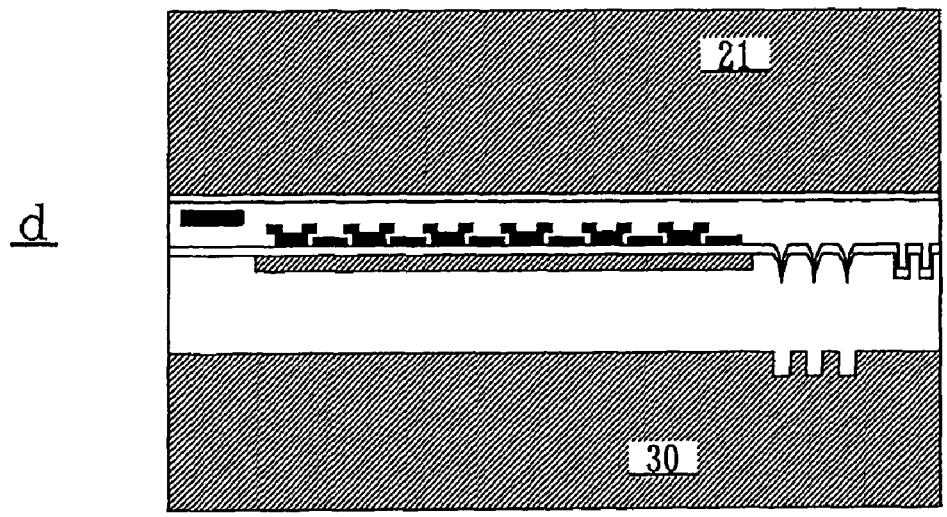
FIG. 31 is a diagram showing the fabrication steps according to the eighth embodiment.
Figure 31:
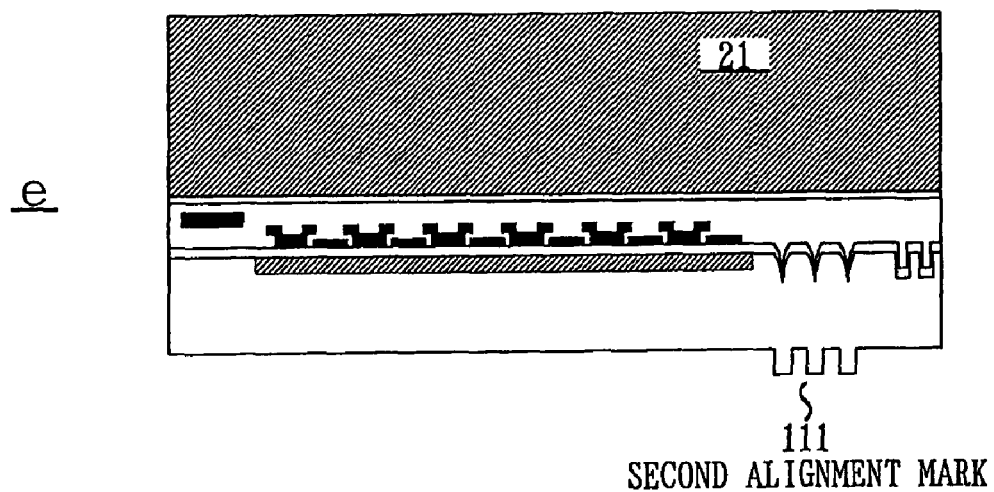

The eighth embodiment refers to a method of fabricating the image sensor 11 corresponding to the inventions set forth in claims 1–4. FIGS. 30 and 31 are diagrams showing the steps of the fabrication method. Hereinafter, the individual steps of the present fabrication method will be described with reference to FIGS. 30 and 31.

For a start, a first alignment mark 102 is formed in the first-plane side of a P⁺-type substrate 30 having a concen tration of the order of 1E18/cm$^3$. The first alignment mark 102 is concave steps formed in silicon by etching or the like. FIG. 30a shows the state described above. Incidentally, the first alignment mark may be of convex shape. For example, a rather thick oxide film can be formed on the P$^+$-type substrate 30 so that the oxide film is partly removed to leave convex steps.

Note that the substrate 30 (silicon substrate) may be any heavily doped impurity substrate including an N$^+$-type substrate. For example, Sb (antimony) is preferably used as the N-type impurities in this substrate 30. Moreover, Sb preferably has a concentration rate greater than or equal to 1E18/cm$^3$. The reason why Sb is preferred here is that it can suppress auto doping in the subsequent step (the vapor phase growth of a P-type epitaxial layer 103). The auto doping has an enormous effect on the shape of the first alignment mark 102 (history 104 to be described later). In some conditions, the first alignment mark 102 (history 104) might be distorted so greatly that it fails to function as a mark. The above-mentioned Sb, however, has a property against the auto doping. Thus, selecting Sb as impurities in the substrate 30 allows the first alignment mark 102 (history 104) to be maintained in a favorable shape.

Next, a P-type epitaxial layer 103 of 1E15/cm$^3$ in concentration is formed on the first-plane side of the P$^+$-type substrate 30, in a thickness of around 10 μm. The P-type epitaxial layer 103 is to be the base portion of the device.

Here, the steps of the first alignment mark 102 appear as a history 104 on the first-plane side of the P-type epitaxial layer 103. By using the history 104 as a positional reference, the re-formation of a mark is performed to make a re-formed mark 105 anew in the first-plane side of the P-type epitaxial layer 103. FIG. 30b shows the state described above.

Subsequently, with the re-formed mark 105 as the positional reference, a device structure including channel isolations, a diffusion region, CCD diffusion layers 13, a gate oxide film 14, transfer electrodes 15, pixel-reading gate electrodes, AL wiring, bonding pads 20, and a passivation film is formed on the first-plane side of the P-type epitaxial layer 103. FIG. 30c shows the state described above.

Next, the first-plane side is planarized based on SOG (Spin On Glass) or other methods. If necessary, CMP (Chemical Mechanical Polishing), mechanical polishing, and the like are performed for thinning. Thereafter, a lightly doped silicon substrate to be a support substrate 21 is pasted on the first-plane side with a silicon-type adhesive or the like. FIG. 31d shows the state described above.

Here, in a solution formulated to 1:3:8 in hydrofluoric acid (50%): nitric acid acetic acid, the P$^+$-type substrate 30 is etched for removal. This kind of solution is higher in P$^+$-type etching rate than in P$^-$-type etching rate. The difference in etching rate is utilized to stop the etching. Here, a second alignment mark 111, or the inverted mark of the first alignment mark, appears on the second-plane side of the P-type epitaxial layer 103. In order to reduce the etching time, the P$^+$-type substrate 30 may be previously thinned at the second-plane side based on polishing or other methods. FIG. 31e shows the state described above.

Next, by using the second alignment mark 111 as a positional reference, a device structure including charge accumulating units 17 and a depletion prevention layer 18 is formed on the second-plane side of the P-type epitaxial layer 103, thereby completing the image sensor 11 as shown in FIG. 2.

Figure 36:
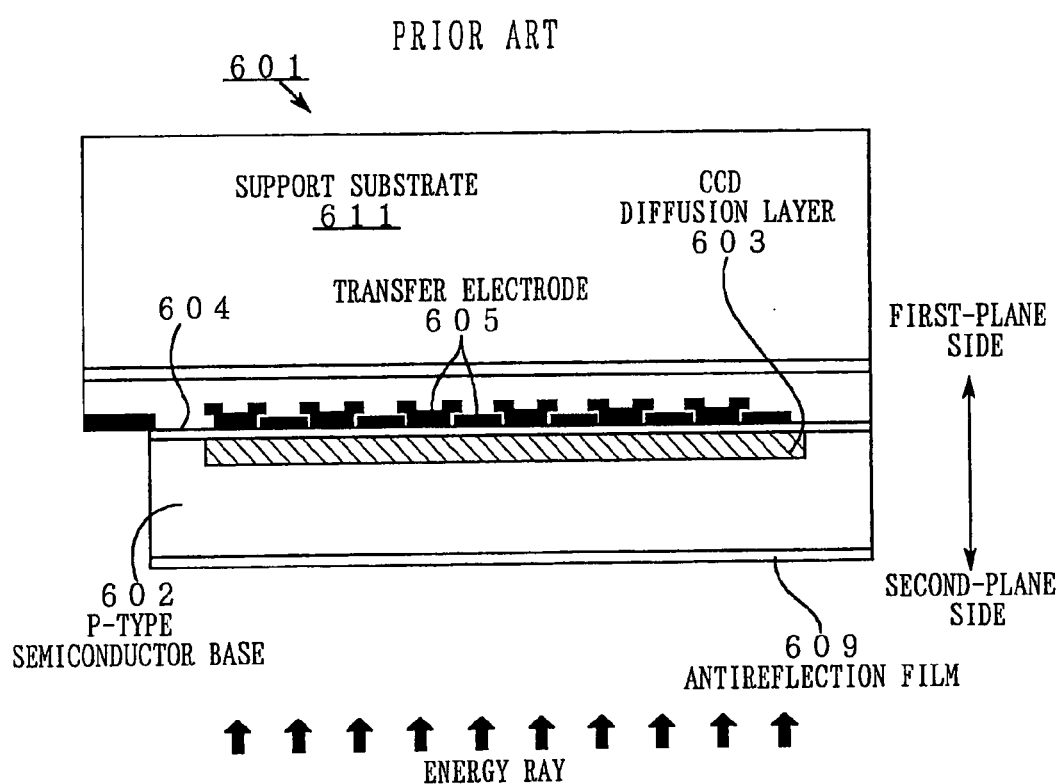
FIG. 36 is a diagram showing a conventional example of a back-illuminated image sensor.

Incidentally, in the state shown in FIG. 31e, a backside processing layer, pad openings, and the like can also be formed by using the second alignment mark 111 as a positional reference, to form the conventional back-illuminated image sensor as shown in FIG. 36.

As has been described above, in the fabrication method of the eighth embodiment, the positional reference on either surface (the re-formed mark 105, the second alignment mark 111) is formed in accordance with the first alignment mark 102. Therefore, precise position matching can be achieved between the two-sided structures, which allows precise alignment of the charge accumulating units 17, the CCD diffusion layers 13, the transfer electrodes 15, the opening holes for the bonding pads 20, and so on. As a result, it becomes possible to fabricate image sensors 11 of higher performance. Moreover, higher-resolution (or finer) image sensors 11 are significantly improved in production yield.

In particular, the fabrication method excludes any steps where the device structure on one side is formed while alignment is achieved with the alignment mark on the opposite side. This makes it possible to fabricate the image sensor 11 without using a conventional double side aligner or infrared aligner.

Now, description will be given of another embodiment.

Ninth Embodiment

Figure 32:
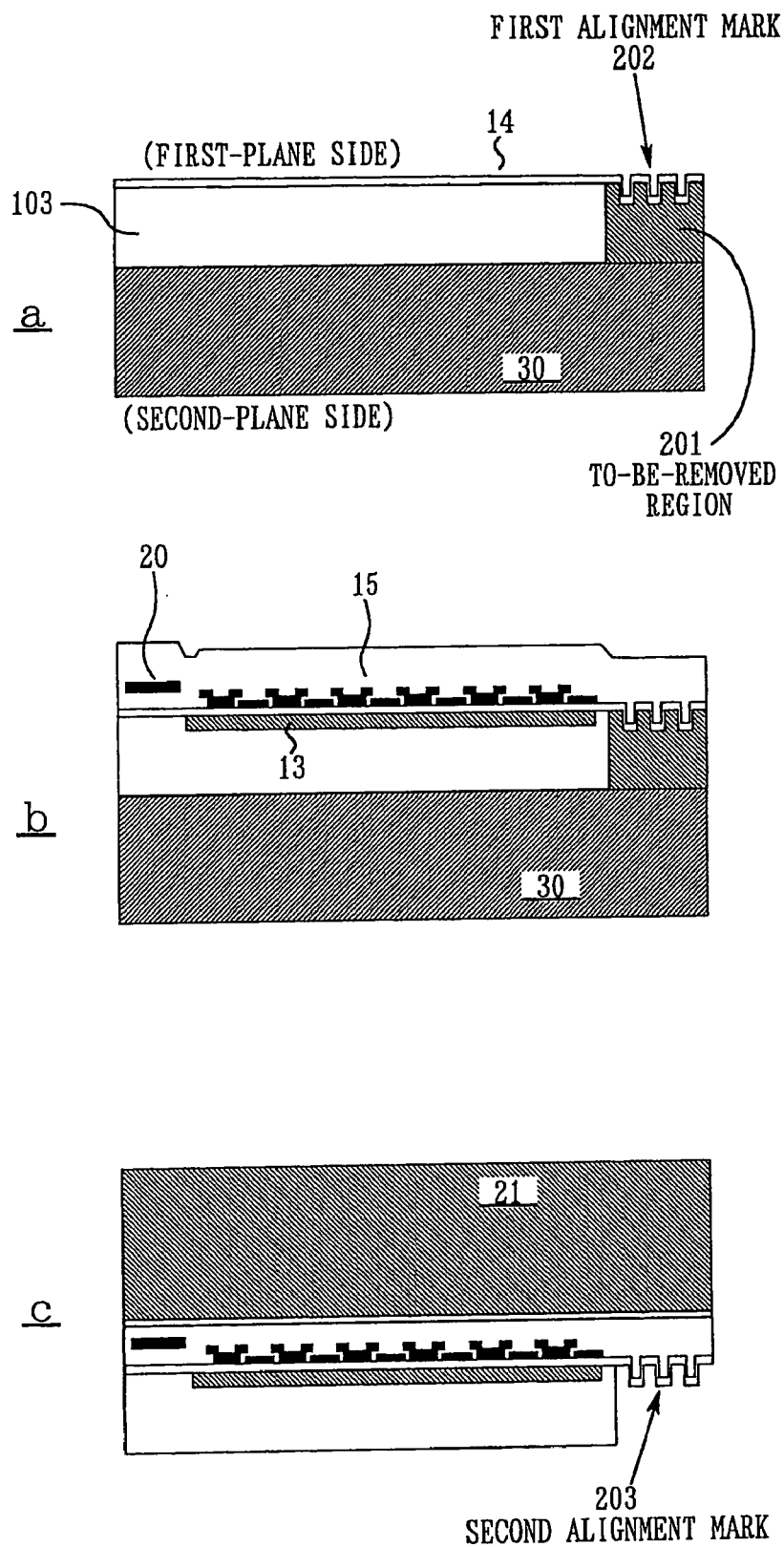
FIG. 32 is a diagram showing the fabrication steps according to a ninth embodiment.

The ninth embodiment refers to a method of fabricating the image sensor 11 corresponding to the inventions set forth in claims 1–4. FIG. 32 is a diagram showing the steps of the fabrication method. Hereinafter, the present fabrication method will be described with reference to FIG. 32.

Initially, a P-type epitaxial layer 103 of 1E15/cm$^3$ in concentration is formed on the first-plane side of a P$^+$-type substrate 30, in a thickness of approximately 10 μm.

During the step of forming the P-type epitaxial layer 103 or after the formation, a heavily doped P$^+$-type region that reaches the P$^+$-type substrate is formed in part of the P-type epitaxial layer 103 according to such methods as ion implantation and thermal diffusion. This forms a to-be-removed region 201.

A first alignment mark 202 is formed in the first-plane side of the to-be-removed region 201. FIG. 32a shows the state described above.

Note that the to-be-removed region 201 may be any heavily doped impurity region including an N$^+$-type impurity region. In particular, when the vapor phase growth of the P-type epitaxial layer 103 continues after the formation of the first alignment mark 202, it is preferable to select Sb (antimony) as the N-type impurities in the to-be-removed region 201. In such a case, Sb preferably has a concentration rate greater than or equal to 1E18/cm$^3$. The reason why Sb is preferred here is that it can suppress auto doping in the vapor phase growth of the P-type epitaxial layer 103. The auto doping has an enormous effect on the shapes of the first alignment mark 202. In some conditions, the first alignment mark 202 might be distorted so greatly that it fails to function as a mark. The above-mentioned Sb, however, has a property against the auto doping. Thus, selecting Sb as impurities in the to-be-removed region 201 allows the first alignment mark 202 to be maintained in a favorable shape. As a result, a second alignment mark 203 to be described later can also be formed in a favorable shape.

By using the first alignment mark 202 as a positional reference, the structure on the first-plane side of the image sensor 11 is formed.

During the process described above, a layer adequate for forming an inverted mark is formed over the first alignment mark. FIG. 32b shows the state described above.

Next, the first-plane side is planarized, and a support substrate 21 is pasted thereon. In this state, the P+-type substrate 30 and the to-be-removed region 201 are etched for removal. Here, a second alignment mark 203, or the inverted mark of the first alignment mark 202, appears on a trace of the removed to-be-removed region 201. FIG. 32c shows the state described above.

Next, with the second alignment mark 203 as the positional reference, a device structure (including charge accumulating units 17 and a depletion prevention layer 18) is formed on the second-plane side of the P-type epitaxial layer 103, thereby completing the image sensor 11 as shown in FIG. 2.

Incidentally, in the state shown in FIG. 32c, a backside processing layer, pad openings, and the like can also be formed by using the second alignment mark 203 as a positional reference, to form the conventional back-illuminated image sensor as shown in FIG. 36.

As has been described above, in the fabrication method of the ninth embodiment, the second alignment mark 203 on the second-plane side is formed to be molded from the first alignment mark 202 in the first-plane side. Therefore, both alignment marks come into precise position matching, thereby making it possible to achieve precise alignment of the charge accumulating units 17, the CCD diffusion layers 13, the transfer electrodes 15, the opening holes for the bonding pads 20, and others shown in FIG. 2. As a result, it becomes possible to fabricate image sensors 11 of higher performance. Moreover, higher-resolution (or finer) image sensors 11 are significantly improved in production yield.

In particular, the fabrication method excludes any steps where the device structure on one side is formed while alignment is achieved with the alignment mark on the opposite side. This makes it possible to fabricate the image sensor 11 without using a conventional double side aligner or infrared aligner.

Now, description will be given of another embodiment.

Tenth Embodiment

Figure 33:
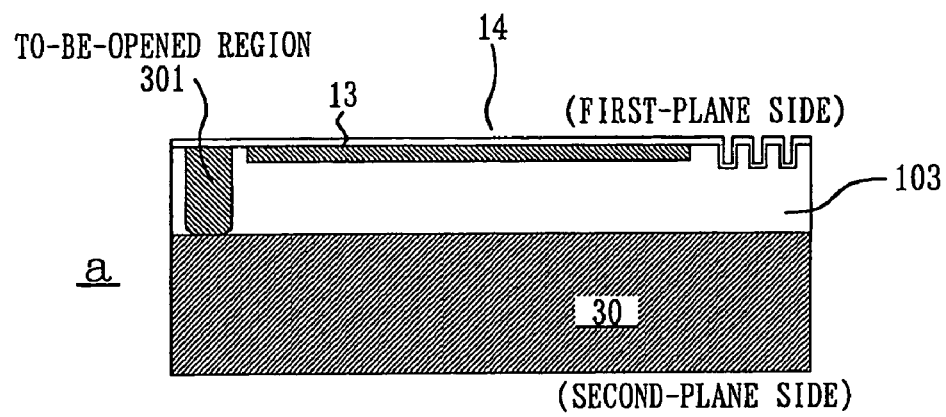
FIG. 33 is a diagram showing the fabrication steps according to a tenth embodiment.
Figure 33:
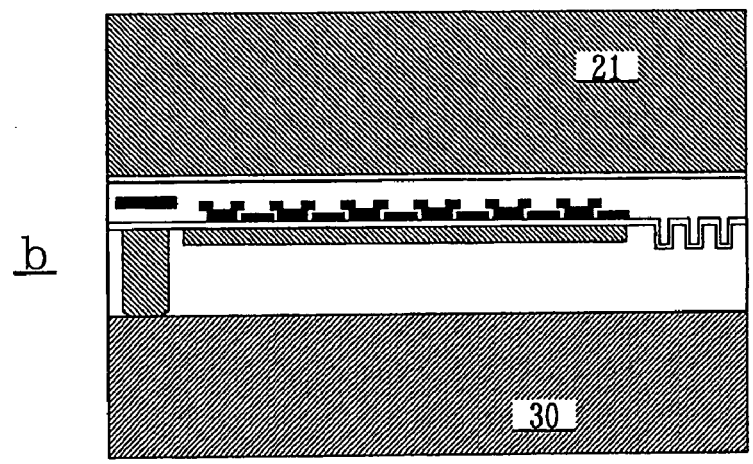
Figure 33:
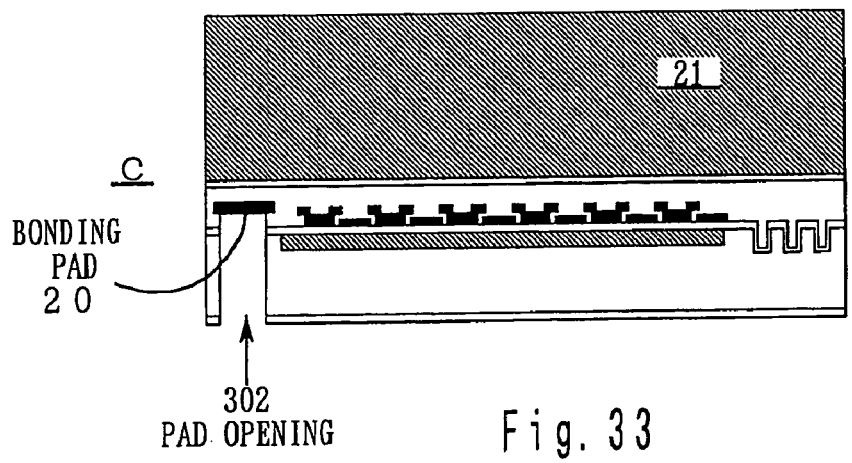

The tenth embodiment refers to a method of fabricating the image sensor 11 corresponding to the inventions set forth in claims 1–4. FIG. 33 is a diagram showing the steps of the fabrication method.

For a start, a P-type epitaxial layer 103 is formed on the first-plane side of a P+-type substrate 30.

Next, ion implantation, thermal diffusion, or other processing is applied to the P-type epitaxial layer 103 from the first-plane side, so that heavily doped P+-type regions that reach the P+-type substrate are formed in areas where openings for the bonding pads 20 and the like are to be made. The P+-type regions are to be the to-be-opened regions 301. FIG. 33a shows the state described above.

The structure on the first-plane side is formed as in the foregoing embodiment. Then, the first-plane side is planarized, and a support substrate 21 is pasted thereon. FIG. 33b shows the state described above.

Next, the P+-type substrate 30 and the to-be-opened regions 301 are etched for removal. Here, pad openings 302 and the like appear as traces of the removed to-be-opened regions 301. FIG. 33c shows the state described above.

Next, a device structure (including charge accumulating units 17 and a depletion prevention layer 18) is formed on the second-plane side to complete the image sensor 11 as shown in FIG. 2.

As has been described above, in the fabrication method of the tenth embodiment, the to-be-opened areas in the second-plane side are positioned from the first-plane side. Accordingly, opening holes in proper alignment with the structure on the first-plane side (for example, the bonding pads 20) can be formed in the second-plane side.

Eleventh Embodiment

The eleventh embodiment of the invention will be described below with reference to the accompanying drawings.

Figure 37:
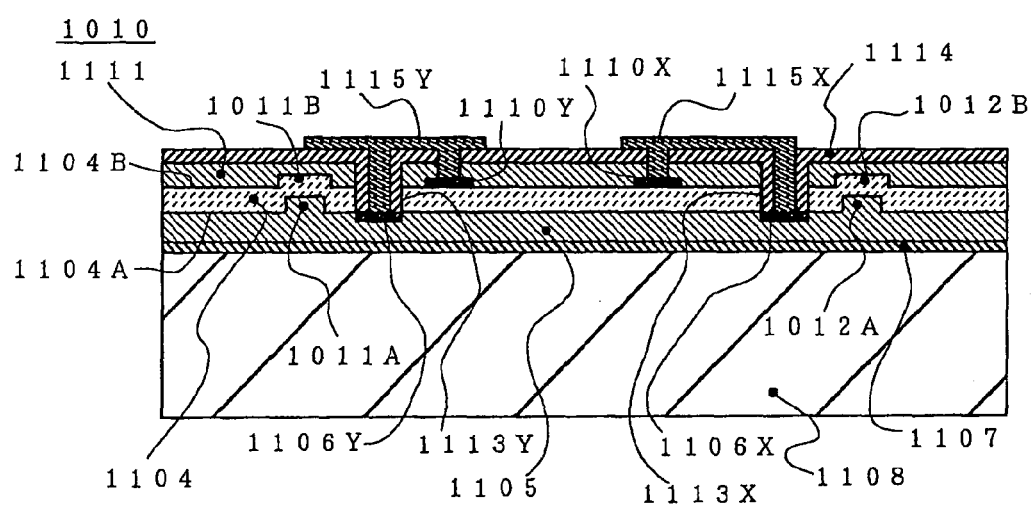
FIG. 37 is a sectional view showing the structure of a semiconductor device 1010 according to an eleventh embodiment.

First, a semiconductor device 1010 according to this embodiment will be outlined with reference to FIG. 37.

In the semiconductor device 1010 according to the eleventh embodiment, an epitaxial layer (base portion) 1104 is provided as a base on which devices are to be formed. That is, a device formation layer 1105 is formed on the first plane 1104A side of the epitaxial layer 1104 and a device formation layer 1111 is formed on the second plane 1104B side.

In this embodiment, devices (a first structure) formed in the device formation layer 1105 and devices (a second structure) formed in the device formation layer 1111 are ones manufactured based on known semiconductor manufacturing technologies according to the 0.5-µm process design criteria (design rules), and the first and second structures are electrically connected to each other by metal films (wiring portions) 1115X and 1115Y via through-holes 1113X and 1113Y, respectively. FIG. 37 shows a state that metal interconnections 1106X and 1106Y in the device formation layer 1105 are electrically connected to metal interconnections 1110X and 1110Y in the device formation layer 1111 by the metal films 1115X and 1115Y, respectively. The metal interconnections 1106X and 1106Y are insulated from the epitaxial layer 1104 to prevent short-circuiting between them.

The first structure (not shown) in the device formation layer 1105 formed on the first plane 1104A of the epitaxial layer 1104 and the second structure (not shown) in the device formation layer 1111 formed on the second plane 1104B has such a predetermined positional relationship as to be connected to each other via the through-holes 1113X and 1113Y. The reason why the first structure formed on the first plane 1104A and the second structure formed on the second plane 1104B is given the predetermined positional relationship is that alignment marks 1011A and 1012A on the first plane 1104A side that are used in forming the first structure and alignment marks 1011B and 1012B on the second plane 1104B side that are used in forming the second structure are the front sides and the back sides (or vice versa) of the same alignment marks 1011 and 1012, respectively. In FIG. 37, reference numeral 1108 denotes a support substrate (reinforcement substrate).

A fabrication method of the epitaxial layer 1104 in which the alignment marks 1011A, 1012A, 1011B, and 1012B are formed and a fabrication method of the semiconductor device 1010 in which the devices are formed on both surfaces of the epitaxial layer 1104 by using the alignment marks 1011A and 1012A and the alignment marks 1011B and 1012B, respectively, will be described in detail with reference to FIGS. 38(a)–38(c) to 40(g)–40(j).

Figure 38:
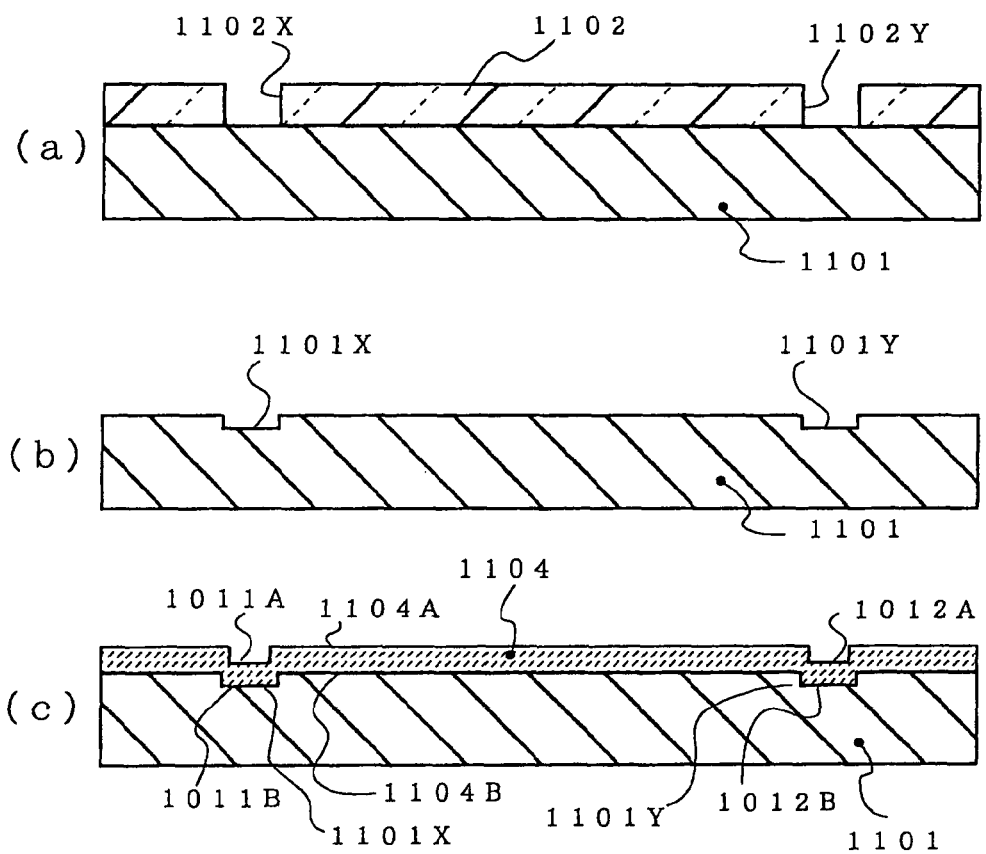
FIGS. 38(a)–38(c), 39(d)–39(f), and 40(g)–40(j) are sectional views showing a fabrication process of the semiconductor device 1010 according to the eleventh embodiment.

(1) First, a resist film 1102 is applied to a silicon substrate (substrate) 1101 that is doped with a p-type impurity at a high concentration (e.g., $1\times10^{20}/cm^3$), and patterns 1102X and 1102Y for the intended alignment marks (1011A, 1011B, 1012A, and 1012B) are formed by performing exposure using a predetermined mask pattern and development on the resist film 1102. The reason for introducing in advance the p-type impurity into the silicon substrate 1101 at a high concentration is to provide selectivity in wet-etching the silicon substrate 1101 (described later). FIG. 38(*a*) shows a device structure obtained by the step so far executed.

(2) Dry etching is performed on the silicon substrate 1101 by using the resist film 1102 as an etching mask, whereby depressions 1101X and 1101Y corresponding to the respective patterns 1102X and 1102Y are formed in the silicon substrate 1101. Then, the resist film 1102 is removed and wet etching is performed, whereby the surface of the silicon substrate 1101 is made clean. FIG. 38(*b*) shows a device structure obtained by the steps so far executed.

(3) An epitaxial layer 1104 is formed on the top surface of the silicon substrate 1101 by using an epitaxial growth system or the like. At this time, a p-type impurity is introduced into the epitaxial layer 1104 at a low concentration (e.g., $1 \times 10^{14}/cm^3$) in accordance with the impurity concentration of the silicon substrate 1101. As a result, the first plane (front surface) 1104A of the epitaxial layer 1104 is formed with depressions (alignment marks 1011A and 1012A) corresponding to the depressions 1101X and 1101Y of the silicon substrate 1101, and the second plane (back surface) 1104B is formed with projections (alignment marks 1011B and 1012B) corresponding to the depressions corresponding to the depressions 1101X and 1101Y of the silicon substrate 1101. FIG. 38(*c*) shows a device structure obtained by the steps so far executed.

Figure 39:
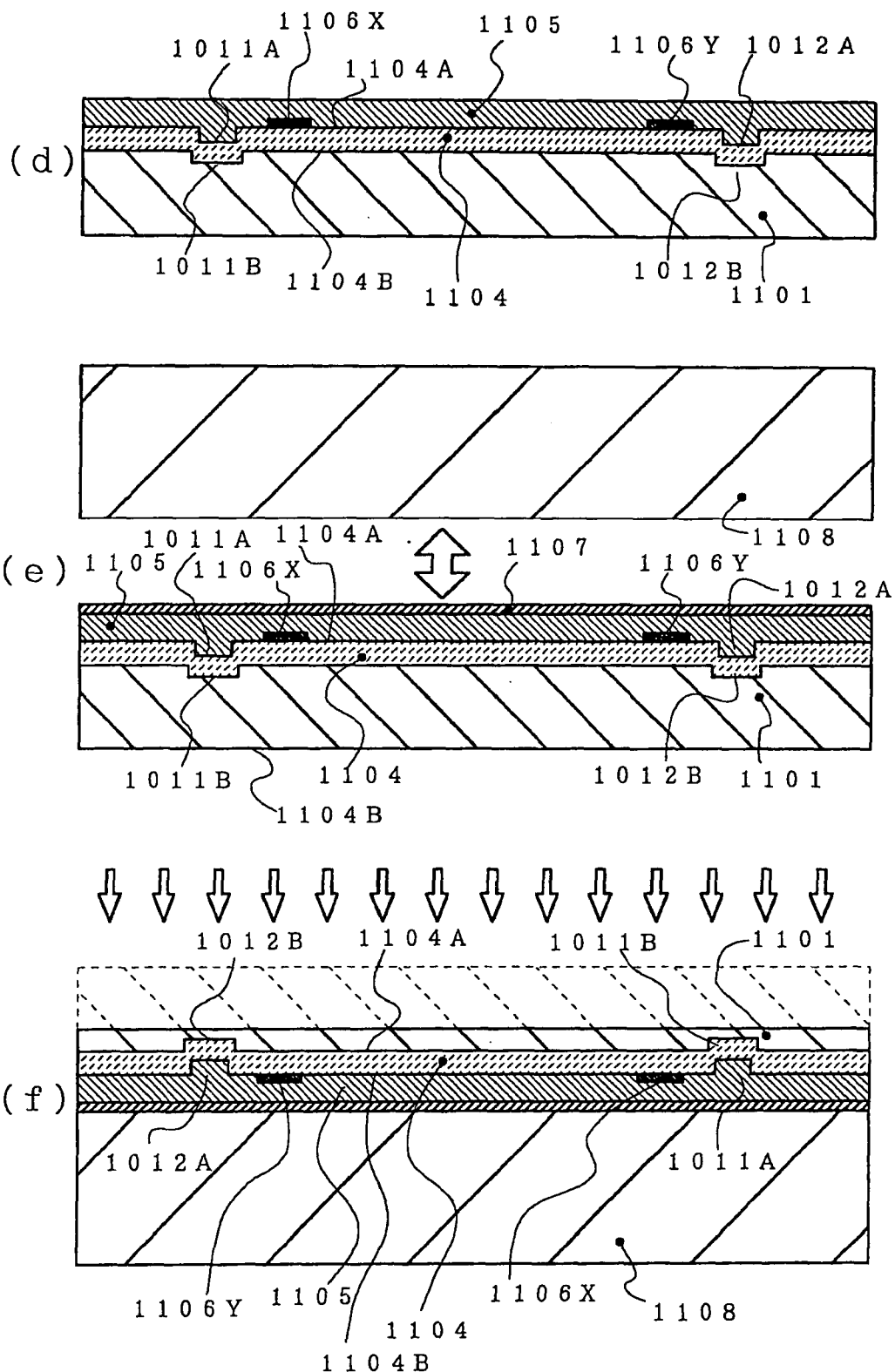

(4) Desired devices such as MOS transistors, bipolar transistors, or a CCD are formed on the first plane 1104A of the epitaxial layer 1104 that is formed on the silicon substrate 1101 by forming, as needed, insulating films, polysilicon interconnections, metal interconnections, etc. and performing patterning and impurity diffusion according to known semiconductor manufacturing technologies using the alignment marks 1011A and 1012A. Reference numeral 1105 denotes a device formation layer 1105 on the first plane 1104A side where various devices are formed. FIG. 39(*d*) shows a device structure obtained by the steps so far executed.

(5) An adhesive 1107 is applied to the top surface of the device formation layer 105 on the epitaxial layer 1104, and a support substrate 1108 is bonded to the structure (see FIG. 39(*e*)). The support substrate 1108 is a substrate having approximately the same thermal expansion coefficient as the epitaxial layer 1104, such as a silicon substrate, a glass substrate, or a ceramic substrate. The adhesive 1107 is an inorganic adhesive or a resin-type adhesive. Exemplary inorganic adhesives are ceramic adhesives (e.g., "Ceramabond #516" (tradename) manufactured by the NILACO Corporation), high-temperature inorganic adhesives (e.g., "Ceramabind 644" (tradename) manufactured by the NILACO Corporation), and silicon oxide type adhesives such as low melting point glass (e.g., BPSG). The support substrate 1108 may be bonded by anodic bonding instead of the bonding with an adhesive. In particular, some types of ceramic adhesives are resistant to high temperatures up to about 1,800° C. and enable a high-temperature treatment when semiconductor devices are formed on the second plane 1104B of the epitaxial layer 1104.

(6) The silicon substrate 1101 that is located on the second plane 1104B side of the epitaxial layer 1104 is eliminated, whereby the second plane 1104B is exposed. At this time, the silicon substrate 1101 is thinned to have a thickness that is smaller than a predetermined value by lapping or polishing it with a lapping or polishing machine (see FIG. 39(*f*)) and then wet etching is performed, whereby the silicon substrate 1101 is eliminated completely (see FIG. 40(*g*)). The wet etching time can be shorter when the distance between the alignment marks 1011A and 1012A and a surface obtained by the lapping or polishing for thickness reduction is shorter. The wet etching is performed by using, for example, a mixed liquid (silicon etching liquid) of hydrofluoric acid, nitric acid, and acetic acid. Since the mixed liquid of hydrofluoric acid, nitric acid, and acetic acid as the silicon etching liquid has selectivity that depends on the impurity concentration, the etching rate decreases at the interface with the epitaxial layer 1104 that is doped with the p-type impurity at a low concentration, which prevents the alignment marks 1011B and 1012B that are transferred to the second plane 1104B of the epitaxial layer 1104 from being etched excessively.

Figure 40:
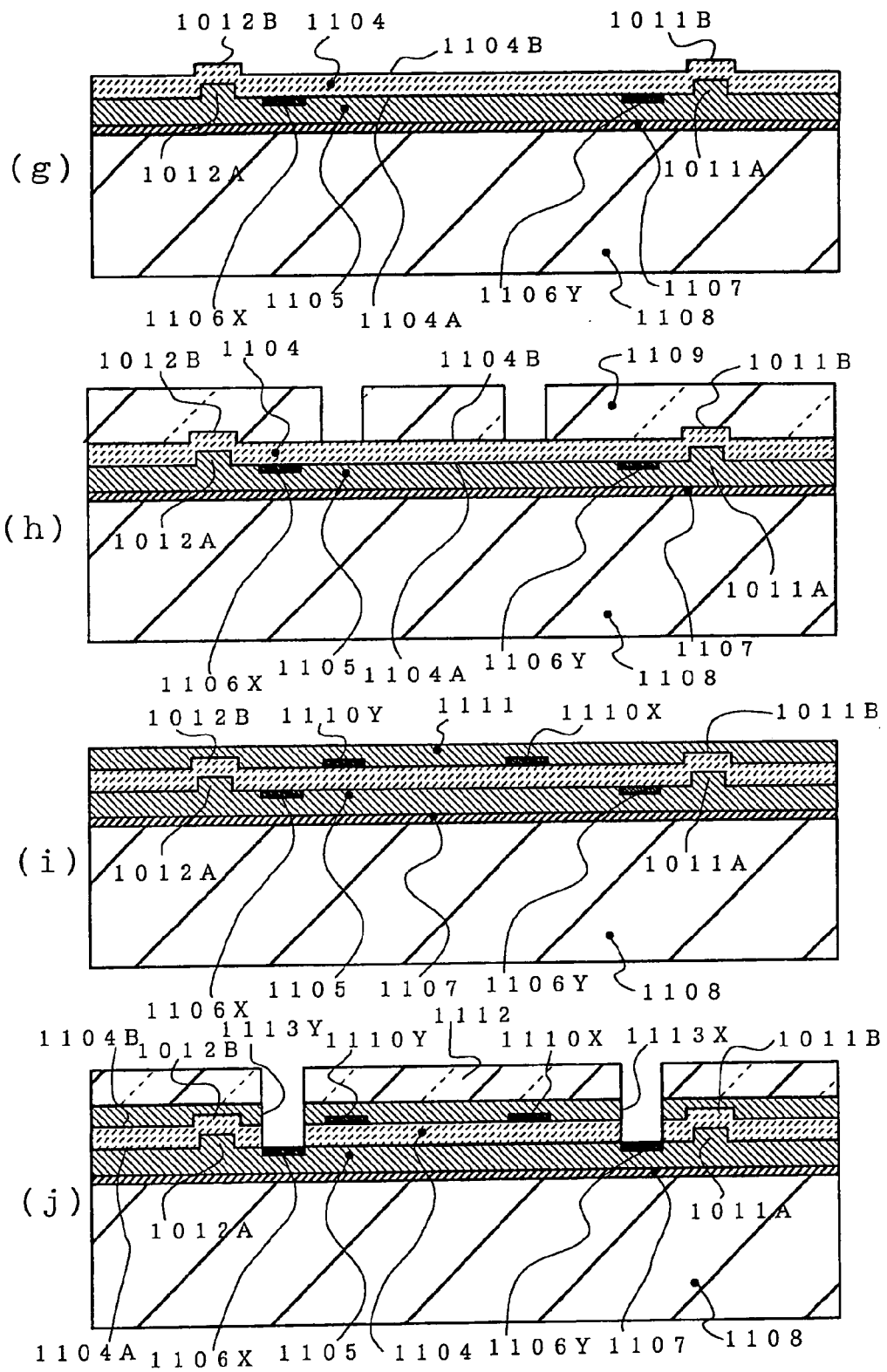

(7) A resist film 1109 is formed on the exposed second plane 1104B of the epitaxial layer 1104 and then patterned with the alignment marks 1011B and 1012B used as references. FIG. 40(*h*) shows a device structure obtained by the steps so far executed.

(8) Metal interconnections 1110X and 1110Y are formed on the second plane 1104B of the epitaxial layer 1104 using the resist film 1109. Further, desired devices such as MOS transistors, bipolar transistors, or a CCD are formed on the second plane 1104B by forming, as needed, insulating films, polysilicon interconnections, metal interconnections, etc. and performing patterning and impurity diffusion according to known semiconductor manufacturing technologies using the alignment marks 1011B and 1012B. Reference numeral 1111 denotes a device formation layer on the first plane 1104B where various devices are formed. FIG. 40(*i*) shows a device structure obtained by the steps so far executed.

(9) A resist film 1112 is applied to the top surface of the device formation layer 1111 that is formed on the epitaxial layer 1104, and the resist layer 1112 is patterned by using the alignment marks 1011B and 1012B. Dry etching is performed with the patterned resist film 1112 used as an etching mask, whereby through-holes 1113X and 1113Y that reach metal interconnections 1106X and 1106Y on the first plane 1104A side are formed in the device formation layer 1111 (an oxide film, a polysilicon film, or the like). Although the metal interconnections 1106X and 1106Y are formed by using the alignment marks 1011A and 1012A as references and the through-holes 1113X and 1113Y are formed by using the alignment marks 1011B and 1012B as references, the metal interconnections 1106X and 1106Y and the through-holes 1113X and 1113Y can be formed so as to have a predetermined positional relationship with high accuracy because, as mentioned above, the alignment marks 1011A and 1012A and the alignment marks 1011B and 1012B are the front sides and the back sides (or vice versa) of the alignment marks 1011 and 1012 that were formed based on the depressions 1101X and 1101Y of the silicon substrate 1101.

(10) An insulating film 1114 is formed on the inside surfaces of the through-holes 1113X and 1113Y and the surface of the device formation layer 1111 by CVD (chemical vapor deposition), for example, and parts of the insulating film 1114 are etched away by photolithography/etching so that the metal interconnections 1106X and 1106Y on the first plane 1104A side are exposed. Then, a metal film is formed in the through-holes 1113X and 1113Y and on the entire surface of the second plane 1104B by using a sputtering system or the like. The metal film is patterned, whereby wiring portions (metal films 1115X and 1115Y) that electrically connect metal interconnections 1106X and 1106Y on the first plane 1104A side of the epitaxial layer 1104 to metal interconnections 1110X and 1110Y on the second plane 1104B side. Where devices are formed on the second plane 1104B, high-temperature heating may be necessary in a certain process. Therefore, it is desirable that the metal interconnections 1106X and 1106Y be made of a refractory metal (e.g., tungsten or titanium). The semiconductor device 1010 having the structure shown in FIG. 37 is produced according to the above series of fabrication steps.

In the eleventh embodiment described above, the first structure on the first plane 1104A side and the second structure on the second plane 1104B side are formed by using both of the alignment marks 1011A and 1012A on the first plane 1104A side and the alignment marks 1011B and 1012B on the second plane 1104B side. For example, another process is possible in which the alignment marks 1011 (1011A and 1011B) are used only for the formation of the first structure on the first plane 1104A and the alignment marks 1012 (1012A and 1012B) are used only for the formation of the second structure on the second plane 1104B. In this case, since the alignment marks 1011 and the alignment marks 1012 are formed based on the depressions 1101X and 1101Y of the same silicon substrate 1101, the alignment marks 1011 and the alignment marks 1012 always have the predetermined positional relationship and hence no alignment error occurs between those marks.

Figure 41:
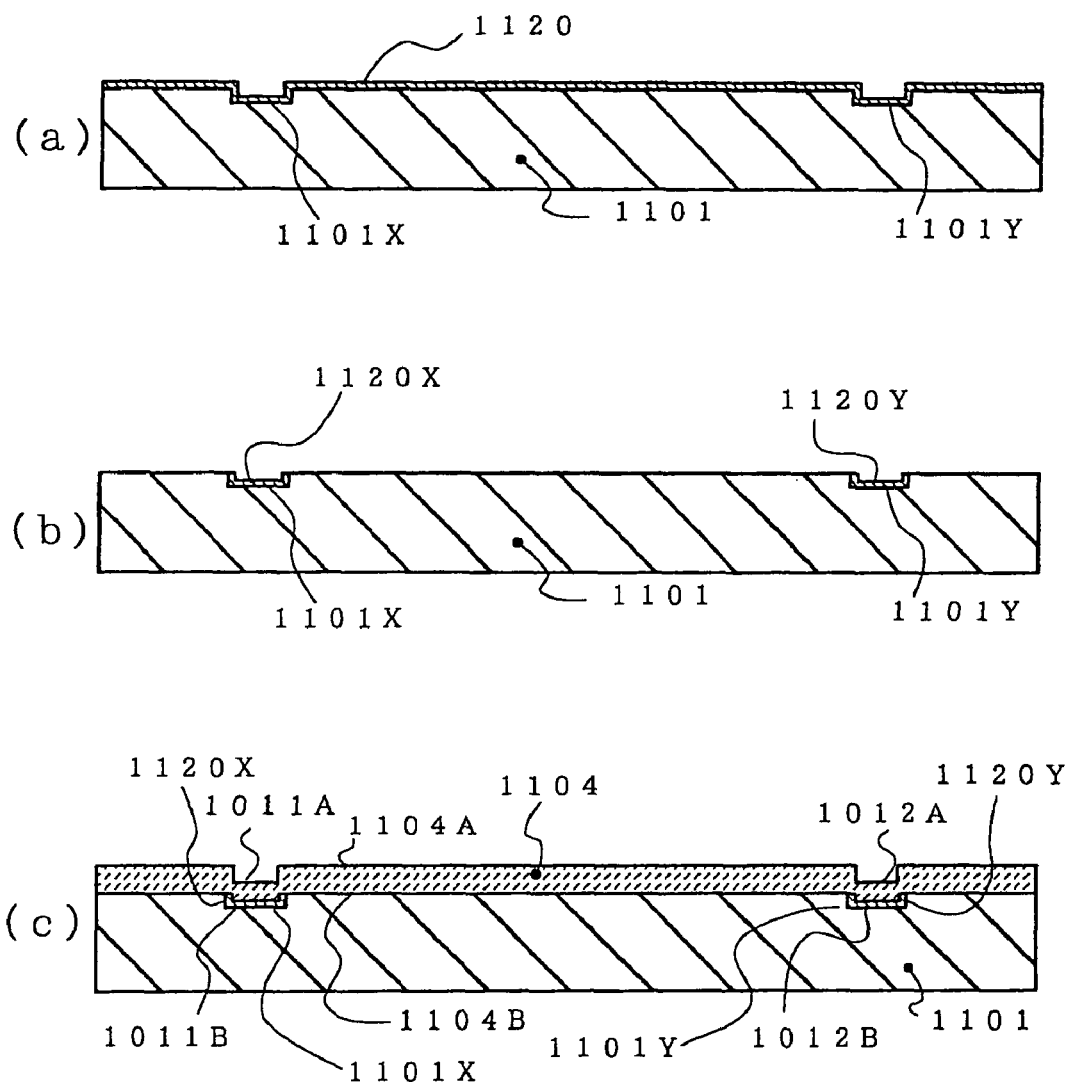
FIGS. 41(a)–41(c) are sectional views showing part of another fabrication process of the semiconductor device 1010 according to the eleventh embodiment.

In the eleventh embodiment, the epitaxial layer 1104 is formed on the top surface of the silicon substrate (substrate) 1101 after depressions 1101X and 1101Y are formed in the silicon substrate 1101 by dry etching (see FIGS. 38(b) and 38(c)). However, as shown in FIGS. 41(a)–41(c), another process is possible in which a silicon oxide film 1120 is formed, by thermal oxidation or CVD, on the top surface of the silicon substrate 1101 that is formed with the depressions 1101X and 1101Y (see FIG. 41(a)), the silicon oxide film 1120 is patterned to form silicon oxide films 1120X and 1120Y in the respective depressions 1101X and 1101Y (see FIG. 41(b)), and an epitaxial layer 1104 is formed from the top surfaces of the silicon substrate 1101 and the silicon oxide films 1120X and 1120Y (see FIG. 41(c)).

Forming the silicon oxide films 1120X and 1120Y in the respective depressions 1101X and 1101Y of the silicon substrate 1101 as described above provides the following advantage. In eliminating the silicon substrate 1101 except the epitaxial layer 1104 by etching, the etching rates of the silicon substrate 1101 and the silicon oxide films 1120X and 1120Y can be differentiated from each other by performing the etching with a TMAH solution and hence the timing of stopping etching can be easily controlled. As a result, excessively etching the epitaxial layer 1104 is prevented, which allows the alignment marks 1011A, 1011B, 1012A, and 1012B to have the same shapes as the depressions 1101X and 1101Y.

Instead of the silicon oxide films 1120, silicon nitride films may be formed as etching stopper films on the surfaces of the depressions 1101X and 1101Y. Where the silicon substrate 1101 is formed with projections for formation of alignment marks, silicon oxide films as etching stoppers may similarly be formed on the surfaces of the projections.

Twelfth Embodiment

Next, the twelfth embodiment of the invention will be described with reference to FIGS. 42, 43(a)–43(d), and 44(e)–44(h).

A semiconductor device 1020 according to the twelfth embodiment is different from according to the eleventh embodiment in that alignment marks 1021A, 1021B, 1022A, and 1022B that are formed in an epitaxial layer 1204 (base portion) have different shapes than the alignment marks 101A, 101B, 1012A, and 1012B in the eleventh embodiment.

Specifically, in the semiconductor device 1020, the alignment marks 1021A and 1022A are formed in the form of projections on the first plane 1204A side of an epitaxial layer 1204 where devices are to be formed and the alignment marks 1021B and 1022B are formed in the form of depressions on the second plane 1204B side.

Also in this embodiment, a first structure formed in a device formation layer 1205 of the semiconductor device 1020 and a second structure formed in a device formation layer 1211 are ones manufactured based on known semiconductor manufacturing technologies according to the 0.5-μm process design criteria (design rules), and the first and second structures are electrically connected to each other by metal films (wiring portions) 1215X and 1215Y via throughholes 1213X and 1213Y, respectively.

The front-side alignment marks 1021A and 1022A of the alignment marks 1021 and 1022 are used in forming the first structure on the device formation layer 1205 side and the back-side alignment marks 1021B and 1022B of the alignment marks 1021 and 1022 are used in forming the second structure on the device formation layer 1211 side, whereby the first structure and the second structure that are formed on the first plane 1204A and the second plane 1204B, respectively, of the epitaxial layer 1204 are given a predetermined positional relationship. Also in this case, the alignment marks 1021A and 1022A and the alignment marks 1021B and 1022B are the front sides and the back sides (or vice versa) of the alignment marks 1021 and 1022, respectively.

The semiconductor device 1020 is the same as the semiconductor device 1010 according to the eleventh embodiment in the structures other than the alignment marks 1021A, 1021B, 1022A, and 1022B.

A fabrication method of the epitaxial layer 1204 in which the alignment marks 1021A and 1022A and the alignment marks 1021B and 1022B are formed and a fabrication method of the semiconductor device 1020 using the alignment marks 1021A and 1021B and alignment marks 1022A and 1022B will be described with reference to FIGS. 43(a)–43(d) and 44(e)–44(h).

Figure 43:
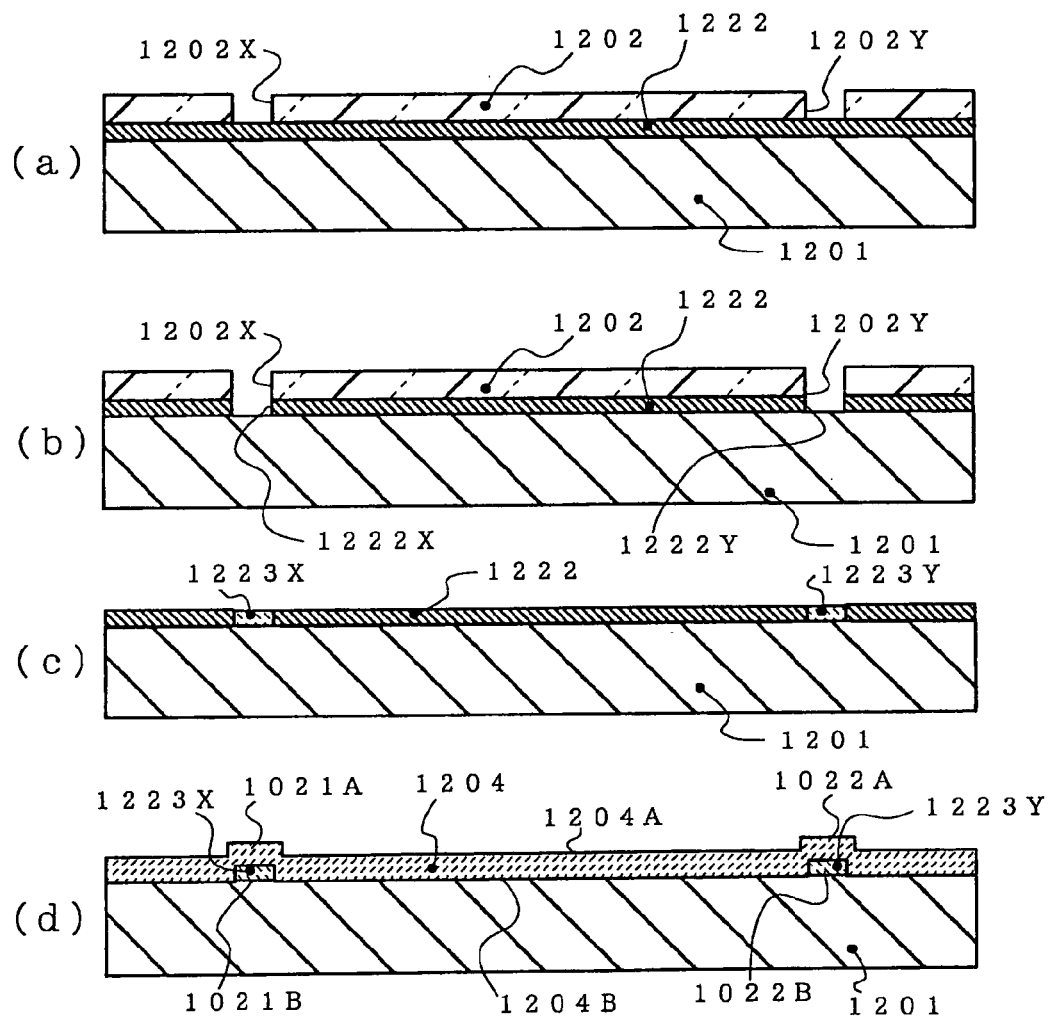
FIGS. 43(a)–43(d) and 44(e)–44(h) are sectional views showing a fabrication process of the semiconductor device 1020 according to the twelfth embodiment.

(1) First, a thermal oxidation film (silicon oxide film) 1222 is formed on a silicon substrate (substrate) 1201 that is doped with a p-type impurity at a high concentration (e.g., $1 \times 10^{20}/cm^3$) and a resist film 1202 is applied to the thermal oxidation film 1222. Patterns 1202X and 1202Y for the intended alignment marks (1021A, 1021B, 1022A, and 1022B) are formed by performing exposure using a mask pattern and development on the resist film 1202. FIG. 43(a) shows a device structure obtained by the step so far executed.

(2) Etching is performed on the thermal oxidation film 1222 that is formed on the silicon substrate 1201 by using the resist film 1202 as a mask, whereby patterns 1222X and 1222Y corresponding to the respective patterns 1202X and 1202Y are formed in the thermal oxidation film 1222 (see FIG. 43(b)). Then, the resist film 1202 is removed and the surface of the thermal oxidation film 1222 is made clean. Epitaxial layers 1223X and 1223Y are formed selectively on the silicon substrate 1201 so as to be doped with an impurity of the same conductivity type at the same concentration as the silicon substrate 1201 was. FIG. 43(c) shows a device structure obtained by the steps so far executed.

(3) After the thermal oxidation film 1222 is removed by etching with a hydrofluoric acid type etching liquid and the surface of the silicon substrate 1201 is made clean, an epitaxial layer 1204 is formed on the top surfaces of the silicon substrate 1201 and the epitaxial layers 1223X and 1223Y. At this time, a p-type impurity is introduced into the epitaxial layer 1204 at a low concentration (e.g., $1\times10^{14}/cm^3$) as in the case of the epitaxial layer 1104 in the eleventh embodiment. As a result, the first plane (front surface) 1204A of the epitaxial layer 1204 is formed with projections (alignment marks 1021A and 1022A) based on the epitaxial layers 1223X and 1223Y, and the second plane (bottom surface) 1204B is formed with depressions (alignment marks 1021B and 1022B) based on the epitaxial layers 1223X and 1223Y. FIG. 43(d) shows a device structure obtained by the steps so far executed.

Figure 44:
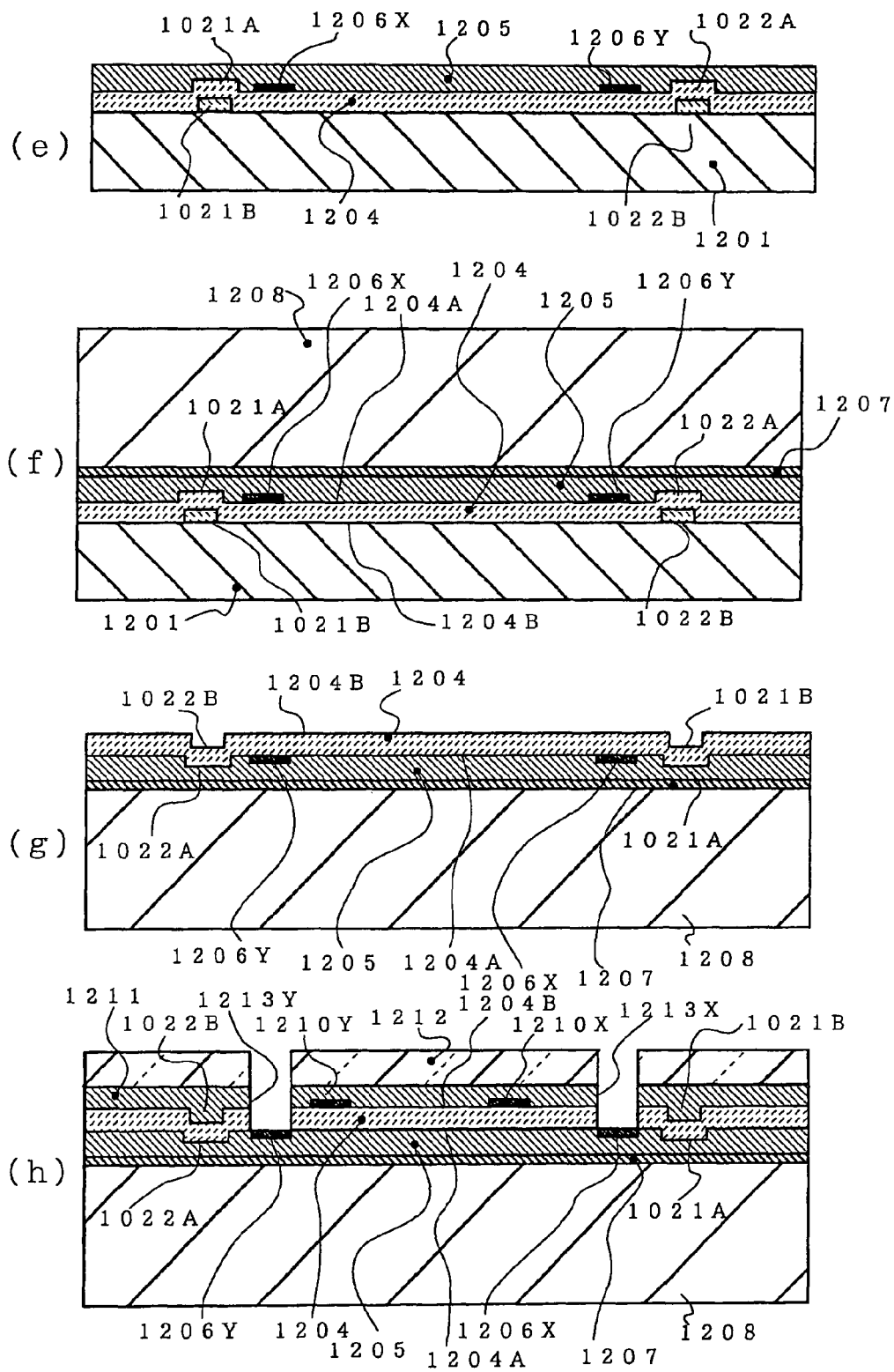

(4) Desired devices such as MOS transistors, bipolar transistors, or a CCD are formed on the first plane 1204A of the epitaxial layer 1204 that is formed on the silicon substrate 1201 by forming, as needed, insulating films, polysilicon interconnections, metal interconnections, etc. and performing patterning and impurity diffusion according to known semiconductor manufacturing technologies using the alignment marks 1021A and 1022A (formation of a device formation layer 1205). FIG. 44(e) shows a device structure obtained by the steps so far executed.

(5) An adhesive 1207 is applied to the top surface of the device formation layer 1205 on the epitaxial layer 1204, and a support substrate 1208 is bonded to the structure. The adhesive 1207 and the support substrate 1208 used above are the same as the adhesive 1107 and the support substrate 1108 used in the eleventh embodiment. FIG. 44(f) shows a device structure obtained by the steps so far executed.

(6) The silicon substrate 1201 that is located on the second plane 1204B side of the epitaxial layer 1204 is eliminated in the same manner as in the eleventh embodiment, whereby the second plane 1204B of the epitaxial layer 1204 is exposed. FIG. 44(g) shows a device structure obtained by the steps so far executed.

(7) Desired devices such as MOS transistors, bipolar transistors, or a CCD are formed on the exposed second plane 1204B of the epitaxial layer 1204 by forming, as needed, insulating films, polysilicon interconnections, metal interconnections, etc. and performing patterning and impurity diffusion according to known semiconductor manufacturing technologies using the alignment marks 1021B and 1022B as references (formation of a device formation layer 1211).

Further, a resist film 1212 is applied to the top surface of the device formation layer 1211 that is formed on the epitaxial layer 1204, and the resist layer 1212 is patterned by using the alignment marks 1021B and 1022B. Dry etching is performed with the patterned resist film 1212 used as an etching mask, whereby through-holes 1213X and 1213Y that reach metal interconnections 1206X and 1206Y on the first plane 1204A side are formed in the device formation layer 1211 (an oxide film, a polysilicon film, or the like). The metal interconnections 1206X and 1206Y are not short-circuited with the epitaxial layer 1204. Also in this twelfth embodiment, the metal interconnections 1206X and 1206Y are formed by using the alignment marks 1021A and 1022A as references and the through-holes 1213X and 1213Y are formed by using the alignment marks 1021B and 1022B as references. FIG. 44(h) shows a device structure obtained by the steps so far executed.

Figure 42:
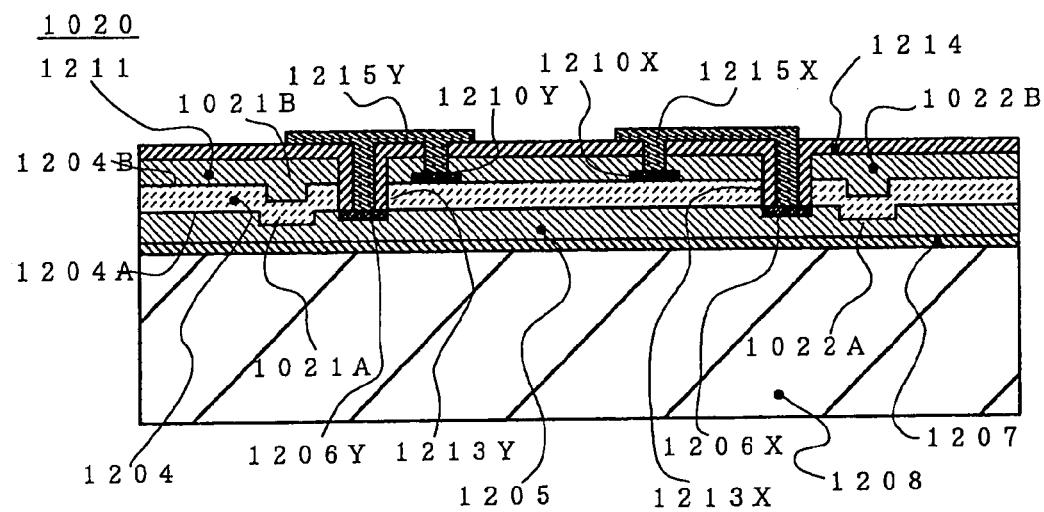
FIG. 42 is a sectional view showing the structure of a semiconductor device 1020 according to a twelfth embodiment.

(8) An insulating film 1214 is formed on the inside surfaces of the through-holes 1213X and 1213Y and the surface of the device formation layer 1211, and parts of the insulating film 1214 are etched away by photolithography/etching so that the metal interconnections 1206X and 1206Y on the first plane 1204A side are exposed. Then, a metal film is formed in the through-holes 1213X and 1213Y and on the entire surface of the second plane 1204B by using a sputtering system or the like. The metal film is patterned, whereby wiring portions (metal films 1215X and 1215Y) that electrically connect to each other the metal interconnections 1206X and 1206Y on the first plane 1204A side of the epitaxial layer 1204 and metal interconnections 1210X and 1210Y on the second plane 1204B side. The semiconductor device 1020 having the structure shown in FIG. 42 is produced by performing the above series of fabrication steps.

Thirteenth Embodiment

Next, the thirteenth embodiment of the invention will be described with reference to FIGS. 45 and 46(a)–46(d).

A semiconductor device 1030 according to the thirteenth embodiment is different from the twelfth embodiment in that oxide films 1323X and 1323Y are formed in advance on a silicon substrate 1301 in forming alignment marks 1031A, 1031B, 1032A, and 1032B in an epitaxial layer (base portion) 1304.

Also in this embodiment, a first structure formed in a device formation layer 1305 of the semiconductor device 1030 and a second structure formed in a device formation layer 1311 are manufactured based on known semiconductor manufacturing technologies according to the 0.5-μm process design criteria (design rules) and the first and second structures are electrically connected to each other by metal films (wiring portions) 1315X and 1315Y via through-holes 1313X and 1313Y, respectively.

The front-side alignment marks 1031A and 1031B of the alignment marks 1031 and 1032 are used in forming the first structure of the device formation layer 1305 and the back-side alignment marks 1032A and 1032B of the alignment marks 1031 and 1032 are used in forming the second structure in the device formation layer 1311, whereby the first structure and the second structure that are formed on the first plane 1304A and the second plane 1304B, respectively, of the epitaxial layer 1304 are given a predetermined positional relationship. The semiconductor device 1030 is the same as the semiconductor device 1020 according to the twelfth embodiment in the other structures.

A fabrication method of the epitaxial layer 1304 in which the alignment marks 1031A and 1032A and the alignment marks 1031B and 1032B are formed and a fabrication method of the semiconductor device 1030 using the alignment marks 1031A, 1031B, 1032A, and 1032B will be described with reference to FIGS. 46(a)–46(d).

Figure 46:
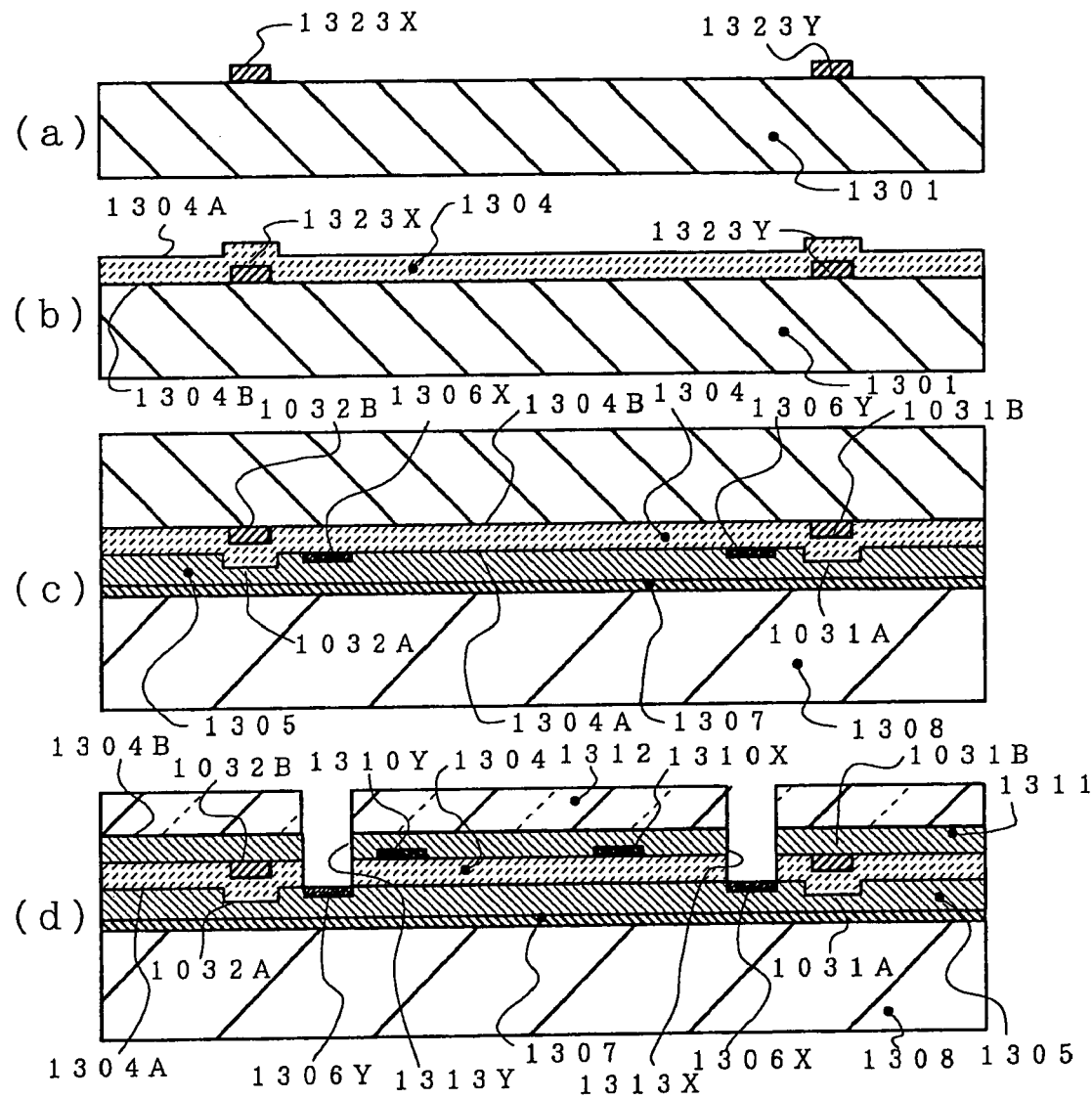
FIGS. 46(a)–46(d) are sectional views showing a fabrication process of the semiconductor device 1030 according to the thirteenth embodiment.

(1) First, a thermal oxidation film (silicon oxide film) is formed on a silicon substrate (substrate) 1301 that is doped with a p-type impurity at a high concentration (e.g., $1\times10^{20}/cm^3$), and the thermal oxidation film is etched by using a resist film (not shown) having a predetermined mask pattern, whereby thermal oxidation films 1323X and 1323Y are formed as shown in FIG. 46(a).

(2) An epitaxial layer 1304 is formed on the silicon substrate 1301 on which the thermal oxidation films 1323X and 1323Y are formed. Those portions of the epitaxial layer 1304 which are located on the thermal oxidation films 1323X and 1323Y are not necessarily a complete single crystal. However, this is not problematic because no devices are formed in the regions where the alignment marks are formed. Like the epitaxial layer 1204 in the twelfth embodiment, the epitaxial layer 1304 is doped with a p-type impurity at a low concentration (e.g., $1\times10^{14}/cm^3$). As a result, the first plane (front surface) 1304A of the epitaxial layer 1304 is formed with projections (alignment marks 1031A and 1032A) based on the thermal oxidation films 1323X and 1323Y formed on the silicon substrate 1301, and the second plane (bottom surface) 1304B is formed with depressions (alignment marks 1031B and 1032B) based on the thermal oxidation films 1323X and 1323Y. FIG. 46(b) shows a device structure obtained by the steps so far executed.

(3) Desired devices such as MOS transistors, bipolar transistors, or a CCD are formed on the first plane 1304A of the epitaxial layer 1304 that is formed on the silicon substrate 1301 by forming, as needed, insulating films, polysilicon interconnections, metal interconnections, etc. and performing patterning and impurity diffusion according to known semiconductor manufacturing technologies using the alignment marks 1031A and 1032A (formation of a device formation layer 1305). An adhesive 1307 is applied to the top surface of the device formation layer 1305 on the epitaxial layer 1304, and a support substrate 1308 is bonded to the structure thus obtained. The adhesive 1307 and the support substrate 1308 used above are the same as the adhesive 1107 and the support substrate 1108 used in the 11th embodiment. FIG. 46(c) shows a device structure obtained by the steps so far executed.

(4) The silicon substrate 1301 that is located on the second plane 1304B side of the epitaxial layer 1304 is eliminated in the same manner as in the 11th embodiment, whereby the second plane 1304B of the epitaxial layer 1304 is exposed. Desired devices such as MOS transistors, bipolar transistors, or a CCD are formed on the exposed second plane 1304B of the epitaxial layer 1304 by forming, as needed, insulating films, polysilicon interconnections, metal interconnections, etc. and performing patterning and impurity diffusion according to known semiconductor manufacturing technologies using the alignment marks 1031B and 1032B as references (formation of a device formation layer 1311).

Further, a resist film 1312 is applied to the top surface of the device formation layer 1311 and is patterned by using the alignment marks 1031B and 1032B. Dry etching is performed with the patterned resist film 1312 used as an etching mask, whereby through-holes 1313X and 1313Y that reach metal interconnections 1306X and 1306Y on the first plane 1304A side are formed in the device formation layer 1311. The metal interconnections 1306X and 1306Y are not short-circuited with the epitaxial layer 1304. Also in the thirteenth embodiment, the metal interconnections 1306X and 1306Y are formed by using the alignment marks 1031A and 1032A as references and the through-holes 1313X and 1313Y are formed by using the alignment marks 1031B and 1032B as references. However, since as described above the alignment marks 1031A and 1032A and the alignment marks 1031B and 1032B are formed based on the thermal oxidation films 1323X and 1323Y formed on the silicon substrate 1301, they are formed at the same positions on the front surface and the back surface of the epitaxial layer 1304. FIG. 46(d) shows a device structure obtained by the steps so far executed.

Figure 45:
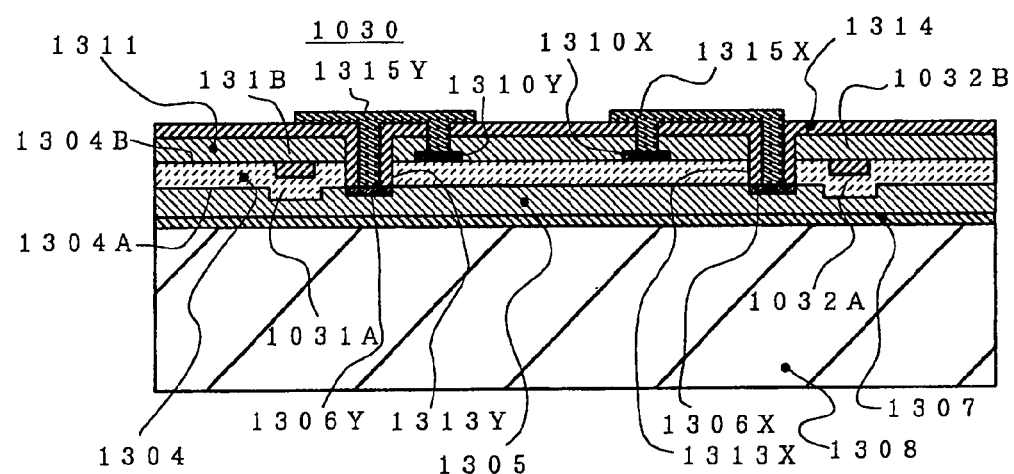
FIG. 45 is a sectional view showing the structure of a semiconductor device 1030 according to a thirteenth embodiment.

(5) An insulating film 1314 is formed on the inside surfaces of the through-holes 1313X and 1313Y and the surface of the device formation layer 1311, and parts of the insulating film 1314 are etched away by photolithography/etching so that the metal interconnections 1306X and 1306Y on the first plane 1304A side are exposed. Then, a metal film is formed in the through-holes 1313X and 1313Y and on the entire surface of the second plane 1304B by using a sputtering system or the like. The metal film is patterned, whereby wiring portions (metal films 1315X and 1315Y) that electrically connect to each other the metal interconnections 1306X and 1306Y on the first plane 1304A side of the epitaxial layer 1304 and metal interconnections 1310X and 1310Y on the second plane 1304B side. The semiconductor device 1030 having the structure shown in FIG. 45 is produced by the above series of fabrication steps.

The fact that the thermal oxidation films 1323X and 1323Y remain in the depressions as the alignment marks 1031B and 1032B of the epitaxial layer 1304 does not affect a positioning operation because the alignment marks 1031B and 1032B can be detected optically from the second plane 1304B side in the positioning operation.

Insulating films of another kind (e.g., silicon nitride films or silicon oxide films deposited by CVD or the like) may be used in place of the thermal oxidation films 1323X and 1323Y used in the thirteenth embodiment.

Fourteenth Embodiment

Next, the fourteenth embodiment of the invention will be described with reference to FIGS. 47, 48(a)–48(c), and 49(d)–49(f).

A semiconductor device 1040 according to the fourteenth embodiment is different from according to the twelfth embodiment in that an epitaxial layer (base portion) 1404 is formed by depositing a polysilicon layer on a silicon substrate 1401 and heating it with a laser annealer or the like.

Also in this embodiment, a first structure formed in a device formation layer 1405 of the semiconductor device 1040 and a second structure formed in a device formation layer 1411 are manufactured based on known semiconductor manufacturing technologies according to the 0.5-μm process design criteria (design rules) and the first and second structures are electrically connected to each other by metal films (wiring portions) 1415X and 1415Y via through-holes 1413X and 1413Y, respectively.

Front-side alignment marks 1041A and 1042A of alignment marks 1041 and 1042 are used in forming the first structure in the device formation layer 1405 and back-side alignment marks 1041B and 1042B of the alignment marks 1041 and 1042 are used in forming the second structure in the device formation layer 1411, whereby the first structure and the second structure that are formed on the first plane 1404A and the second plane 1404B, respectively, of the epitaxial layer 1404 are given a predetermined positional relationship.

A fabrication method of the epitaxial layer 1404 in which the alignment marks 1041A and 1042A and the alignment marks 1041B and 1042B are formed and a fabrication method of the semiconductor device 1040 using the alignment marks 1041A and 1041B and alignment marks 1042A and 1042B will be described with reference to FIGS. 48(a)–48(c) and 49(d)–49(f).

(1) First, a thermal oxidation film (silicon oxide film) 1422 is formed on a silicon substrate (substrate) 1401 that is doped with a p-type impurity at a high concentration (e.g., $1 \times 10^{20}/cm^3$) and a resist film 1202 is applied to the thermal oxidation film 1422. Resist films 1402X and 1402Y for the intended alignment marks 1041A, 1041B, 1042A, and 1042B are formed by a known photolithography technique. FIG. 48(a) shows a device structure obtained by the step so far executed.

Figure 48:
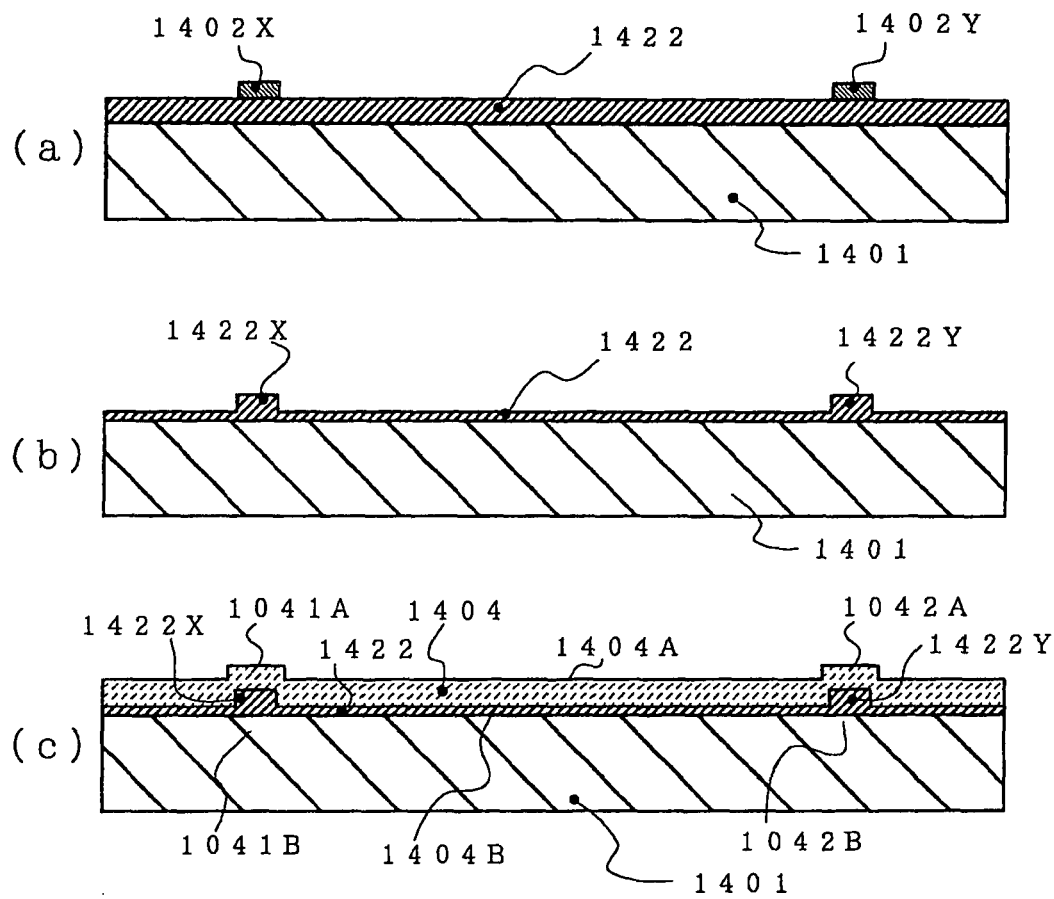
FIGS. 48(a)–48(c) and 49(d)–49(f) are sectional views showing a fabrication process of the semiconductor device 1040 according to the fourteenth embodiment.

(2) Etching is performed on the thermal oxidation film 1422 by using the resist films 1402X and 1402Y as a mask, whereby projections 1422X and 1422Y corresponding to the respective resist films 1402X and 1402Y are formed. Then, the resist films 1402X and 1402Y are removed and the surface of the thermal oxidation film 1422 is made clean. FIG. 48(*b*) shows a device structure obtained by the steps so far executed.

(3) A polysilicon layer is formed on the top surface of the thermal oxidation film 1422 that is formed with the projections 1422X and 1422Y. At this time, a p-type impurity is introduced into the polysilicon layer at the same concentration (e.g., $1 \times 10^{14}/\text{cm}^3$) as in the case of the epitaxial layer 1104 in the 11th embodiment. The polysilicon layer is heated with a laser annealer, as a result of which the polysilicon layer is converted into a single crystal, that is, an epitaxial layer 1404. The first plane 1404A of the epitaxial layer 1404 is formed with projections (alignment marks 1041A and 1042A) based on the projections 1422X and 1422Y, and the second plane 1404B is formed with depressions (alignment marks 1041B and 1042B) based on the projections 1422X and 1422Y. FIG. 48(*c*) shows a device structure obtained by the steps so far executed.

Figure 49:
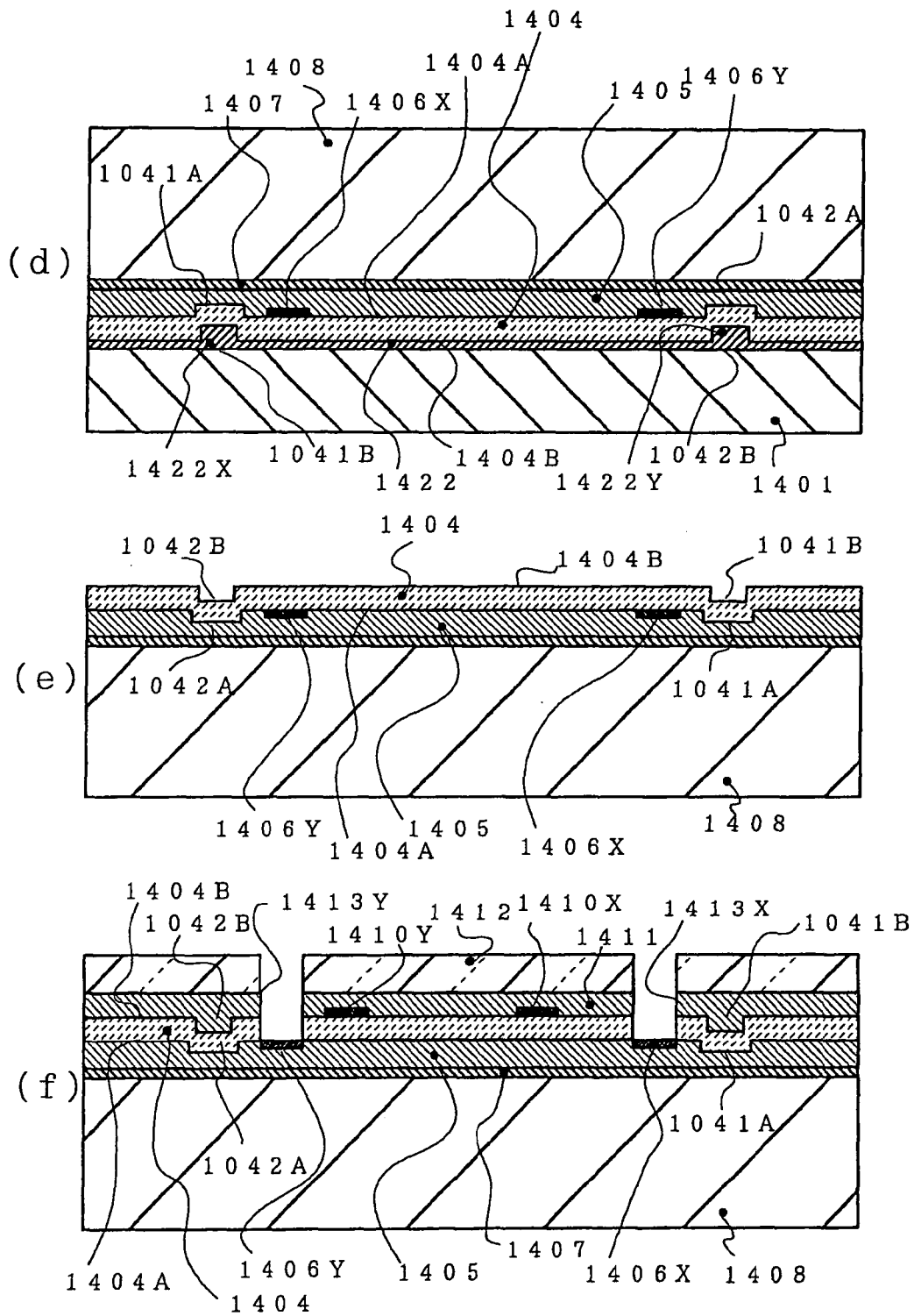

(4) Desired devices such as MOS transistors, bipolar transistors, or a CCD are formed on the first plane 1404A of the epitaxial layer 1404 that is formed on the silicon substrate 1401 by forming, as needed, insulating films, polysilicon interconnections, metal interconnections, etc. and performing patterning and impurity diffusion according to known semiconductor manufacturing technologies using the alignment marks 1041A and 1042A (formation of a device formation layer 1405). Then, an adhesive 1407 is applied to the top surface of the device formation layer 1405 on the epitaxial layer 1404, and a support substrate 1408 is bonded to the structure thus obtained. The adhesive 1407 and the support substrate 1408 used above are the same as the adhesive 1107 and the support substrate 1108 used in the 11th embodiment. FIG. 49(*d*) shows a device structure obtained by the steps so far executed.

(5) The silicon substrate 1401 that is located on the second plane 1404B side of the epitaxial layer 1404 is eliminated in the same manner as in the 11th embodiment, and moreover, the thermal oxidation film 1422 is eliminated, whereby the second plane 1404B of the epitaxial layer 1404 is exposed. FIG. 49(*e*) shows a device structure obtained by the steps so far executed. At this time, by controlling the etching according to the difference in etching rate between the thermal oxide film (silicon oxide layer) 1422 and the silicon substrate (substrate) 1401, the alignment marks 1041 and 1042 (depressions and projections) formed in the epitaxial layer 1404 are prevented from being etched and their shapes are left as they are.

(6) Desired devices such as MOS transistors, bipolar transistors, or a CCD are formed on the exposed second plane 1404B of the epitaxial layer 1404 by forming, as needed, insulating films, polysilicon interconnections, metal interconnections, etc. and performing patterning and impurity diffusion according to known semiconductor manufacturing technologies using the alignment marks 1041B and 1042B (formation of a device formation layer 1411).

Further, a resist film 1412 is applied to the top surface of the device formation layer 1411 that is formed on the epitaxial layer 1404, and the resist layer 1412 is patterned by using the alignment marks 1041B and 1042B.

Dry etching is performed with the patterned resist film 1412 used as an etching mask, whereby through-holes 1413X and 1413Y that reach metal interconnections 1406X and 1406Y on the first plane 1404A side are formed in the device formation layer 1411 (an oxide film, a polysilicon film, or the like). The metal interconnections 1406X and 1406Y are not short-circuited with the epitaxial layer 1404.

Also in the fourteenth embodiment, the metal interconnections 1406X and 1406Y are formed by using the alignment marks 1041A and 1042A as references and the through-holes 1413X and 1413Y are formed by using the alignment marks 1041B and 1042B as references. FIG. 49(*f*) shows a device structure obtained by the steps so far executed.

Figure 47:
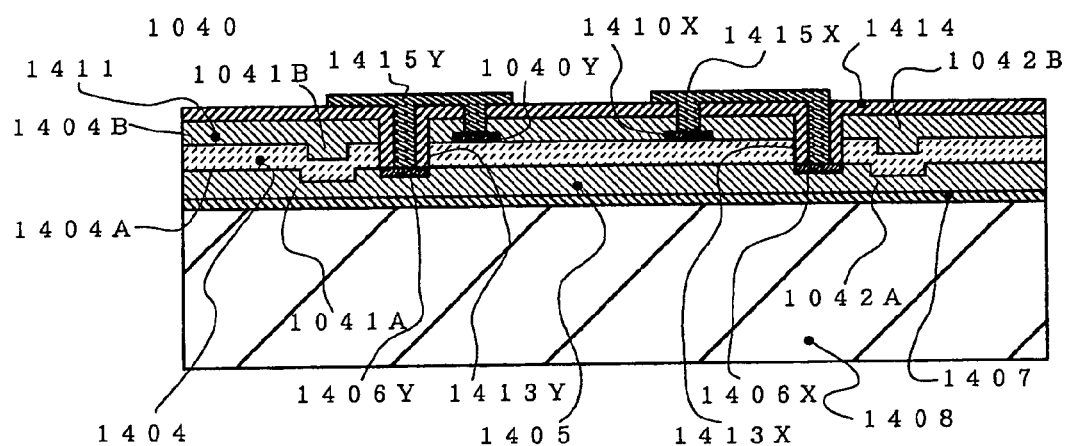
FIG. 47 is a sectional view showing the structure of a semiconductor device 1040 according to a fourteenth embodiment.

(7) An insulating film 1414 is formed on the inside surfaces of the through-holes 1413X and 1413Y and the surface of the device formation layer 1411, and parts of the insulating film 1414 are etched away by photolithography/etching so that the metal interconnections 1406X and 1406Y on the first plane 1404A side are exposed. Then, a metal film is formed in the through-holes 1413X and 1413Y and on the entire surface of the second plane 1404B by using a sputtering system or the like. The metal film is patterned, whereby wiring portions (metal films 1415X and 1415Y) that electrically connect to each other the metal interconnections 1406X and 1406Y on the first plane 1404A side of the epitaxial layer 1404 and metal interconnections 1410 on the second plane 1404B side. The semiconductor device 1040 having the structure shown in FIG. 47 is produced by performing the above series of fabrication steps.

Another kind of insulating film (e.g., a silicon oxide film deposited by CVD or the like or a silicon nitride film) may be used in place of the oxide film 1422 used in the fourteenth embodiment.

SUPPLEMENTAL REMARKS ON THE EMBODIMENTS

In the embodiments described above, the vertical transfer unit 16 (the invalid charge discharging unit) may clear up the unnecessary charges in the charge accumulating units 17 (image lags and dark current having been accumulated before the exposure time) through the CCD diffusion layers 13 at the start of the charge accumulating. Such an operation allows a further improvement in image quality. Besides, adjusting the length of the accumulating time in this manner can also provide an electronic shutter function.

Moreover, in the above-described embodiments, both the transfer electrodes 15 and the substrate potential may be controlled in order to transport the charges in the charge accumulating units 17 to the CCD diffusion layers 13. Such an operation makes it possible to perform sure charge transportation even with charge accumulating units 17 having a greater saturation charge amount.

Figure 34:
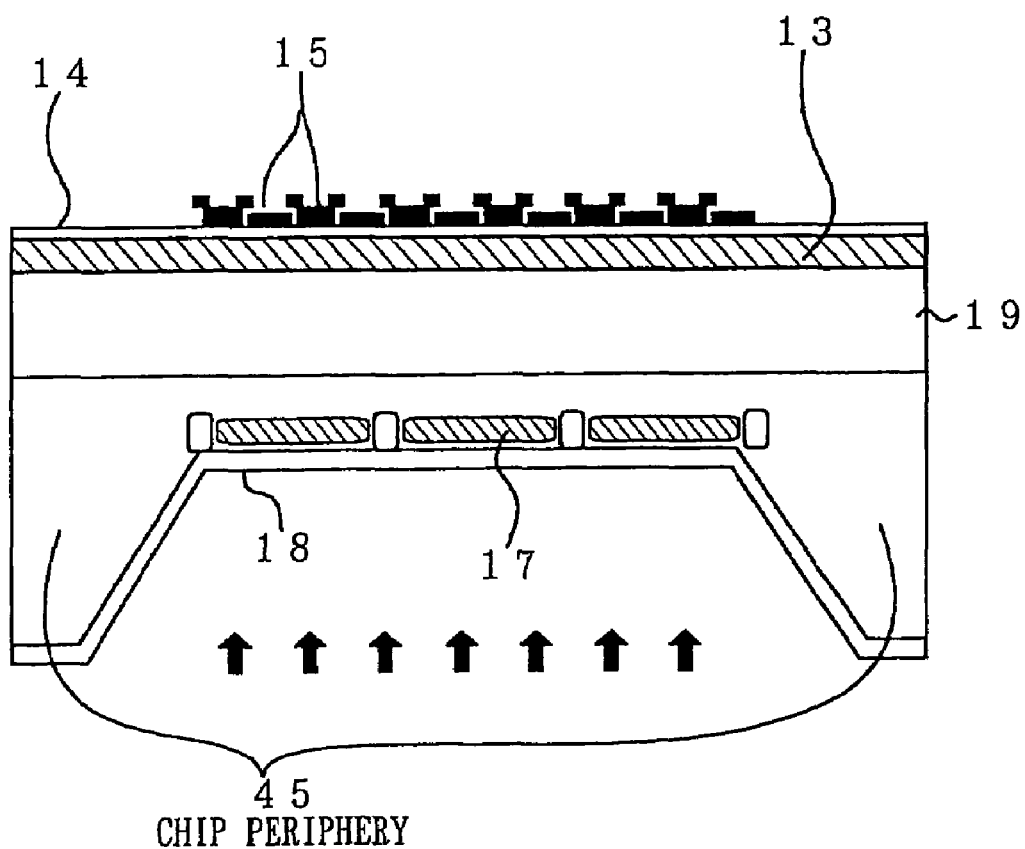
FIG. 34 is a diagram showing another reinforcing structure of an image sensor.

Furthermore, in the above-described embodiments, the support substrate 21 is pasted on to reinforce the chip. However, this is not restrictive. For example, as in an image sensor 81 shown in FIG. 34, at the time of etching, a chip periphery 45 may be left unetched, thereby increasing the mechanical strength of the chip.

Moreover, in the above-described embodiments, the semiconductor base 12 is thinned by chemical etching. However, this is not restrictive. For example, the thinning may be performed based on such methods as mechanical polishing and anisotropic etching.

Furthermore, in the above-described embodiments, P-type is the first conductive type and N-type is the second conductive type. However, this is not restrictive. N-type can be the first conductive type and P-type can be the second.

Note that the above-described exposure apparatuses may also be realized as a scanning exposure apparatus in which the reticle and the substrate are synchronously moved for reticle pattern exposure (for example, U.S. Pat. No. 5,473,410).

Besides, the above-described exposure apparatuses may be realized as an exposure apparatus of step-and-repeat type in which the reticle and the substrate are kept stationary for reticle pattern exposure, and the substrate is successively moved stepwise.

The above-described exposure apparatuses may also be realized as a proximity exposure apparatus in which no projection optical system is used, and the reticle and the substrate are put into close contact for reticle pattern exposure.

Moreover, the applications of the above-described exposure apparatuses are not limited to semiconductor fabrications. For example, it is also possible to realize an exposure apparatus for use in liquid crystal for exposing a liquid crystal display element pattern on a glass plate, and an exposure apparatus for fabricating thin film magnetic heads.

For their light sources, the above-described exposure apparatuses may use g-rays (436 nm), i-rays (365 nm), KrF excimer lasers (248 nm), ArF excimer lasers (193 nm), $F_2$ lasers (157 nm), metal vapor lasers, and harmonic components of YAG lasers. Additionally, charged particle beams such as X-rays and electron beams may be used. For example, in the cases of electron beams, the electron gun may use thermionic lanthanum hexaboride ($LaB_6$) and tantalum (Ta).

The exposure apparatuses may have any projection magnifications, not only reducing but also unmagnifying and enlarging.

As for the projection optical system, such materials as quartz and fluorite which transmit far-ultraviolet rays are used for the glass material in the cases of using excimer lasers and other far-ultraviolet rays. In the cases of $F_2$ lasers or X-rays, a catadioptric or dioptric system is employed (the reticle is also of dioptric type). In the cases of electron beams, an electron optical system comprising electron lenses and deflectors can be used as the optical system. Incidentally, it is understood that the optical paths for electron beams to pass through should be kept in a vacuum.

Note that the image sensors according to the present invention are not limited to the exposure apparatuses in application, and are also applicable to general systems that comprise image sensors.

Moreover, the device fabrication methods according to the present invention are applicable to any method of forming device structures on both sides.

The invention is not limited to the above embodiments and various modifications may be made without departing fromt the spirit and the scope of the invention. Any improvement may be made in part or all of the components.

What is claimed is:

1. A back-illuminated image sensor comprising:
a semiconductor base of a first conductive type;
a plurality of charge accumulating units of a second conductive type different from said first conductive type, formed on a second-plane side which is the backside of a first plane of said semiconductor base, said charge accumulating units which accumulate, on a pixel-by-pixel basis, signal charges generated by an energy ray incident from the second-plane side;
a charge transfer unit formed on the first-plane side of said semiconductor base facing said charge accumulating units, the charge transfer unit which transfers said signal charges to be read;
a charge transport unit which transports said signal charges accumulated in said charge accumulating units to said charge transfer unit; and
a depletion prevention layer formed closer to said second-plane side than said charge accumulating units, the depletion prevention layer which prevents a depletion region around said charge accumulating units from reaching said second plane.

2. An image sensor according to claim 1, wherein said depletion prevention layer is of said first conductive type.

3. An image sensor according to claim 2, wherein said depletion prevention layer has impurity distribution that allows said energy ray to pass through and impurity concentration rate that prevents said depletion region from reaching said second plane.

4. An image sensor according to claim 2, wherein said charge accumulating units are fully depleted at completion of charge transportation.

5. A back-illuminated image sensor comprising:
a semiconductor base of a first conductive type;
a plurality of charge accumulating units of a second conductive type different from said first conductive type, formed on a second-plane side which is the backside of a first plane of said semiconductor base, said charge accumulating units which accumulate, on a pixel-by-pixel basis, signal charges generated by an energy ray incident from the second-plane side during a charge accumulating period;
a charge transfer unit formed on the first-plane side of said semiconductor base facing said charge accumulating units, the charge transfer unit which transfers said signal charges to be read;
a charge transport unit which transports said signal charges accumulated in said charge accumulating units to said charge transfer unit; and
an invalid charge discharging unit which drives said charge transfer unit to discharge an invalid charge while said charge accumulating units accumulate said signal charges;
said invalid charge discharging unit comprising a vertical transfer unit which, during the charge accumulating period, successively applies a transfer voltage to the transfer electrodes to discharge invalid charges out of the chare transfer unit.

6. A back-illuminated image sensor according to claim 5, wherein:
said charge transfer unit includes a charge transfer channel formed on the first-plane side of said semiconductor base facing said charge accumulating units, the charge transfer channel which transfers said signal charges and transfer electrodes, which apply a transfer voltage to said charge transfer channel, that are periodically distributed at a ratio of substantially less than three per one of said charge accumulating units and are distributed along a direction the charge transfer channel performs charge transfer, and
said charge transport unit transports signal charges from said charge accumulating units to said charge transfer channel, said transporting being performed at phase intervals of said transfer electrodes, transport being done for one screenful of signal charges at a plurality of times while shifting the phases of positions where signal charges are to be transported, wherein
said charge transfer unit drives said transfer electrodes in multi-phase, each time said charge transport unit transports signal charges to said charge transfer channel, and reads out one screenful of signal charges at a plurality of times.

7. A back-illuminated image sensor according to claim 5, wherein:
said charge transfer unit is a CCD formed by overlapping a CCD diffusion layer, an insulating film, and CCD electrodes on the first-plane side; and
said invalid charge is discharged through the CCD diffusion layer, by the voltage drive of the CCD electrode formed on said first-plane side.

8. A back-illuminated image sensor comprising:
a semiconductor base of a first conductive type;
a plurality of charge accumulating units of a second conductive type different from said first conductive type, formed on a second-plane side which is the backside of a first plane of said semiconductor base, said charge accumulating units which accumulate, on a pixel-by-pixel basis, signal charges generated by an energy ray incident from the second-plane side during a charge accumulating period;
a charge transfer unit formed on the first-plane side of said semiconductor base facing said charge accumulating units, the charge transfer unit which transfers said signal charges to be read;
a charge transport unit which transports said signal charges accumulated in said charge accumulating units to said charge transfer unit; and
a dark current suppressing unit which approximates a potential of the first-plane side of said charge transfer unit to a substrate potential to suppress dark current flowing in from said first-plane side, at least during a predetermined period while said charge accumulating units accumulate said signal charges;
said dark current suppressing unit comprising a vertical transfer unit which, during the charge accumulating period, successively applies a transfer voltage to transfer electrodes of the charge transfer unit by approximating the potential of the charge transfer unit to a substrate voltage, so that the dark current flowing into the charge transfer unit is suppressed as much as possible.

9. A back-illuminated image sensor comprising:
a semiconductor base of a first conductive type;
a plurality of charge accumulating units of a second conductive type different from said first conductive type, formed on a second-plane side which is the backside of a first plane of said semiconductor base, said charge accumulating units which accumulate, on a pixel-by-pixel basis, signal charges generated by an energy ray incident from the second-plane side during a charge accumulating period;
a charge transfer unit formed on the first-plane side of said semiconductor base facing said charge accumulating units, the charge transfer unit which transfers said signal charges to be read;
a charge transport unit which transports said signal charges accumulated in said charge accumulating units to said charge transfer unit; and
an excessive charge discharging unit which overflows an excessive charge into said charge transfer unit in a vertical direction, from the charge accumulating units on the second-plane side to the charge transfer unit on the first-plane side and drives said charge transfer unit to discharge said excessive charge, said excessive charge occurring due to exceeding a saturation charge amount of said charge accumulating units;
said excessive charge discharging unit comprising a vertical transfer unit which during the charge accumulating period, successively applies a transfer voltage to transfer electrodes of the charge transfer unit to discharge invalid excessive charges out of the charge accumulating units.

10. A back-illuminated image sensor comprising:
a semiconductor base of a first conductive type;
a plurality of charge accumulating units of a second conductive type different from said first conductive type, formed on a second-plane side which is the backside of a first plane of said semiconductor base, said charge accumulating units which accumulate, on a pixel-by-pixel basis, signal charges generated by an energy ray incident from the second-plane side;
a charge transfer unit formed on the first-plane side of said semiconductor base facing said charge accumulating units, the charge transfer unit which transfers said signal charges to be read;
a charge transport unit which transports said signal charges accumulated in said charge accumulating units to said charge transfer unit; and
a barrier region provided on at least a part of transport paths of said signal charges formed between said charge accumulating units and said charge transfer unit, the barrier region which creates a peak of a potential barrier to block progress of said signal charges when no charge is to be transported and ensures full transportation of said signal charges by eliminating the peak of said potential barrier by said charge transport unit when a charge is transported, and wherein
said barrier region is formed by introducing impurities of said first conductive type into said semiconductor base.

11. An image sensor according to claim 10, wherein a concentration rate of said impurities introduced into said barrier region is set higher than a concentration rate of said semiconductor base.

12. An image sensor according to claim 10, wherein said barrier region is provided in contact with said charge transfer unit.

13. An image sensor according to claim 10, wherein at the time of no charge transportation, said potential barrier in said barrier region is set lower than a potential barrier between adjoining charge accumulating units according to the view points of the polarity of said signal charges.

* * * * *

UNITED STATES PATENT AND TRADEMARK OFFICE
CERTIFICATE OF CORRECTION

PATENT NO.       : 7,132,702 B2                                                                 Page 1 of 1
APPLICATION NO.  : 10/618374
DATED            : November 7, 2006
INVENTOR(S)      : Tadashi Narui It is certified that error appears in the above-identified patent and that said Letters Patent is hereby corrected as shown below:

On the Title Page
Item "(75) Inventors," please remove --Keiichi Akagawa, Kamakura (JP); Takeshi Yagi, Koganei (JP)-- from the list of inventors. Only "Tadashi Narui, Kawasaki (JP)" should be listed as an inventor.

Signed and Sealed this

Fifth Day of January, 2010

David J. Kappos
*Director of the United States Patent and Trademark Office*